United States Patent
Takeshima

(10) Patent No.: US 11,982,724 B2
(45) Date of Patent: May 14, 2024

(54) MR SIGNAL PROCESSING APPARATUS

(71) Applicant: Canon Medical Systems Corporation, Otawara (JP)

(72) Inventor: Hidenori Takeshima, Kawasaki (JP)

(73) Assignee: Canon Medical Systems Corporation, Otawara (JP)

( * ) Notice: Subject to any disclaimer, the term of this patent is extended or adjusted under 35 U.S.C. 154(b) by 0 days.

(21) Appl. No.: 17/449,966

(22) Filed: Oct. 5, 2021

(65) Prior Publication Data

US 2022/0107379 A1   Apr. 7, 2022

(30) Foreign Application Priority Data

Oct. 6, 2020 (JP) .................................. 2020-168961
Sep. 27, 2021 (JP) .................................. 2021-156702

(51) Int. Cl.
| | |
|---|---|
| G01V 3/00 | (2006.01) |
| G01R 33/36 | (2006.01) |
| G01R 33/48 | (2006.01) |
| G01R 33/56 | (2006.01) |
| G01R 33/561 | (2006.01) |
| G06T 7/00 | (2017.01) |

(52) U.S. Cl.
CPC ..... *G01R 33/5608* (2013.01); *G01R 33/3621* (2013.01); *G01R 33/4822* (2013.01); *G01R 33/5611* (2013.01); *G06T 7/0012* (2013.01); *G06T 2207/10088* (2013.01); *G06T 2207/20081* (2013.01)

(58) Field of Classification Search
CPC ............ G01R 33/5608; G01R 33/3621; G01R 33/4822; G01R 33/5611; G01R 33/4824; G01R 33/485; G01R 33/4625; G06T 7/0012; G06T 2207/10088; G06T 2207/20081; G06T 2207/20048; G06T 2207/20084
USPC .......................................................... 324/318
See application file for complete search history.

(56) References Cited

U.S. PATENT DOCUMENTS

| | | | | |
|---|---|---|---|---|
| 4,694,254 A | * | 9/1987 | Vatis .................. | G01R 33/3607 324/309 |
| 11,041,927 B1 | * | 6/2021 | Wheaton .............. | G06V 10/764 |
| 2018/0064950 A1 | * | 3/2018 | Segal .................... | A61B 5/377 |
| 2021/0383581 A1 | * | 12/2021 | Hölscher .............. | G06T 11/003 |

FOREIGN PATENT DOCUMENTS

| | | | | |
|---|---|---|---|---|
| CN | 105786762 A | * | 7/2016 | |
| WO | WO-2011026167 A1 | * | 3/2011 | ......... G06K 9/00362 |
| WO | WO2020106896 A1 | * | 5/2020 | |

OTHER PUBLICATIONS

Hatami et al., "Magnetic Resonance Spectroscopy Quantification using Deep Learning", arXiv:1806.07237v1 [cs.CV] Jun. 19, 2018, 8 pages.

* cited by examiner

*Primary Examiner* — Walter L Lindsay, Jr.
(74) *Attorney, Agent, or Firm* — Oblon, McClelland, Maier & Neustadt, L.L.P.

(57) ABSTRACT

An MR signal processing apparatus according to one embodiment includes processing circuitry. The processing circuitry inputs a plurality of MRS signals acquired by MR spectroscopy on the same target to a trained model, and outputs a parameter for MRS reconstruction.

28 Claims, 31 Drawing Sheets

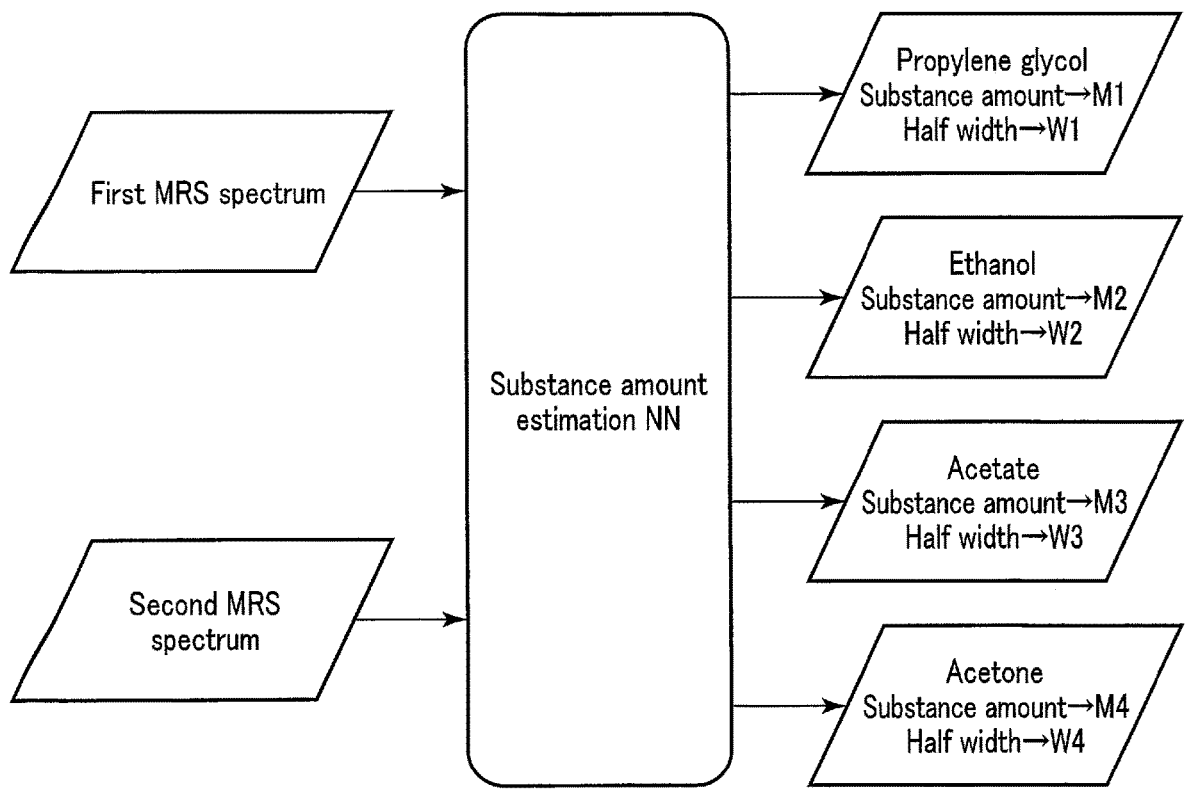
F I G. 5

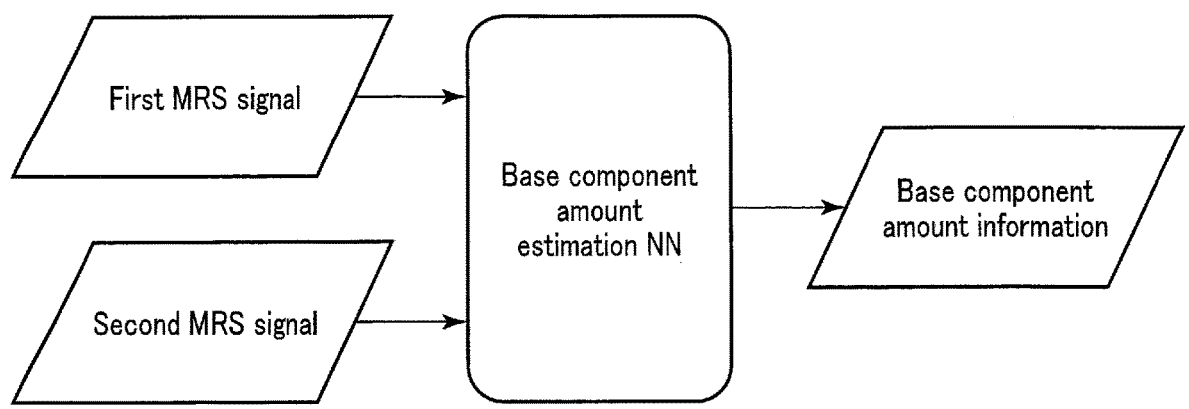
F I G. 14

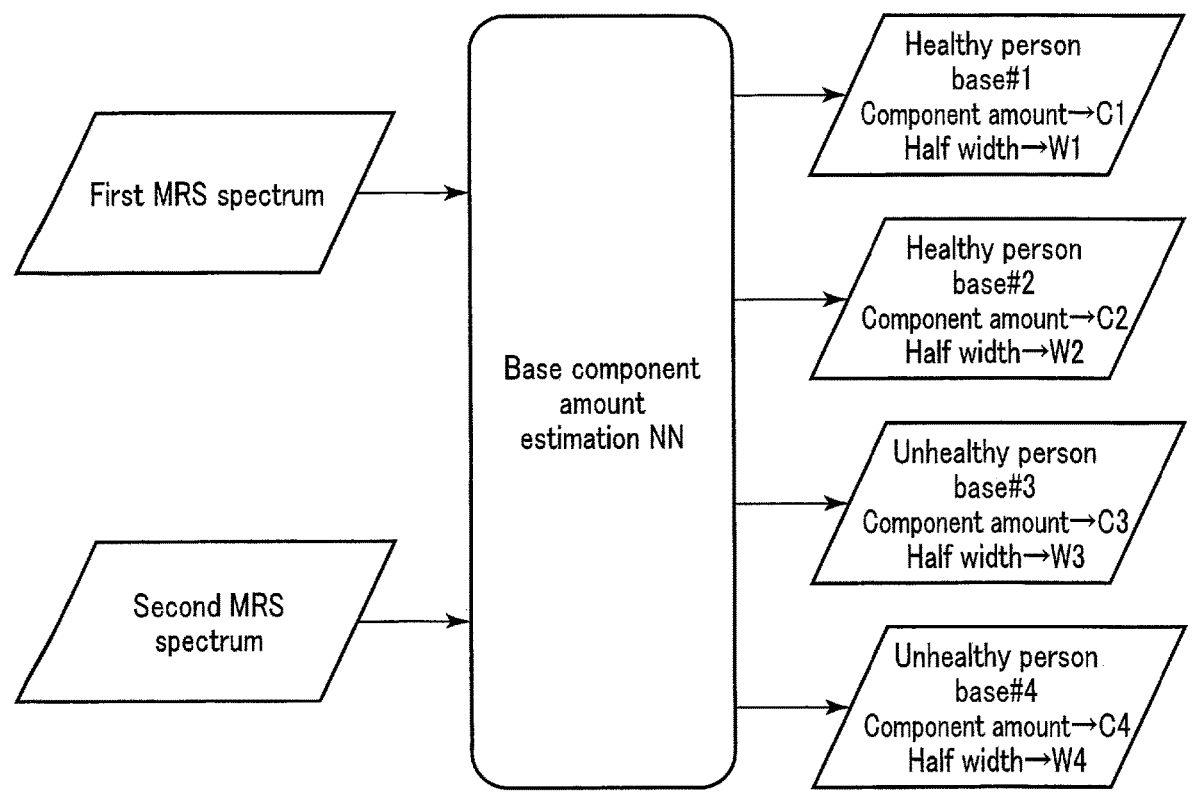
F I G. 16

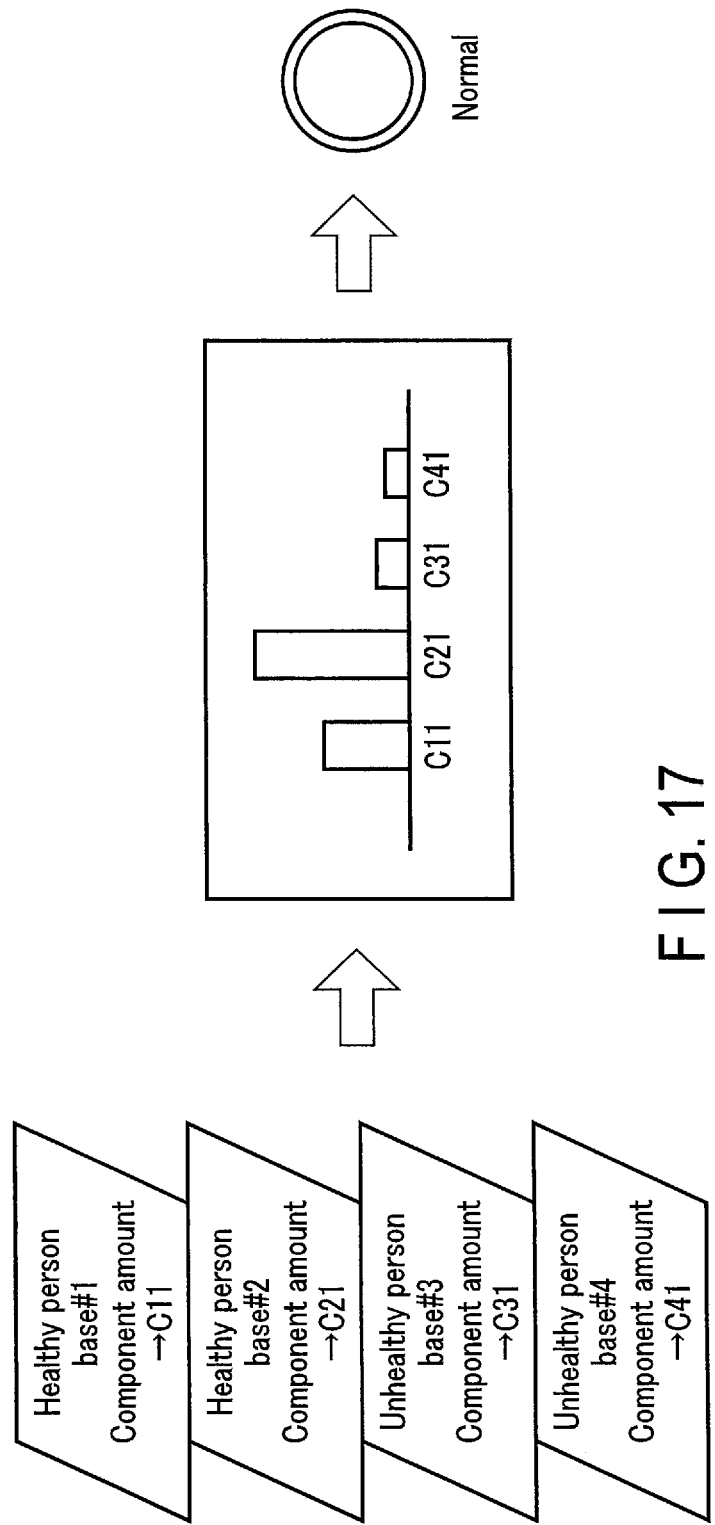
F I G. 17

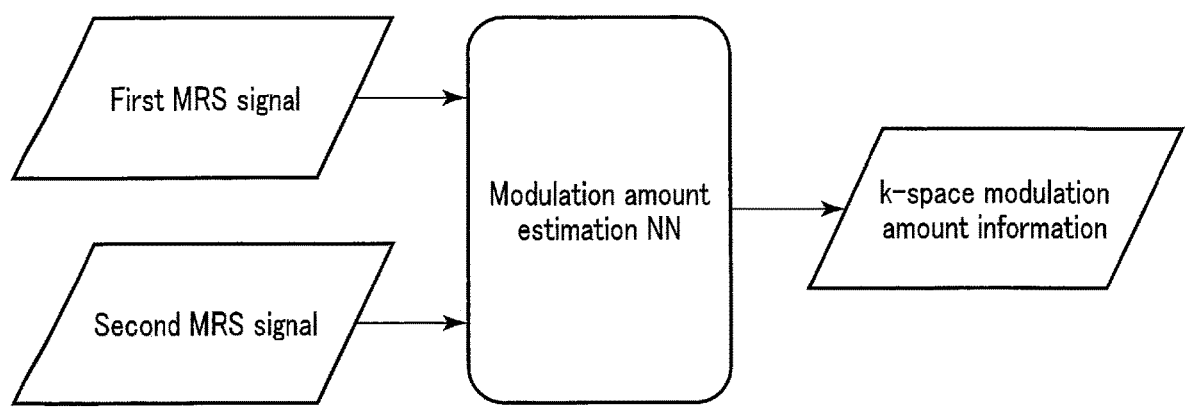
F I G. 21

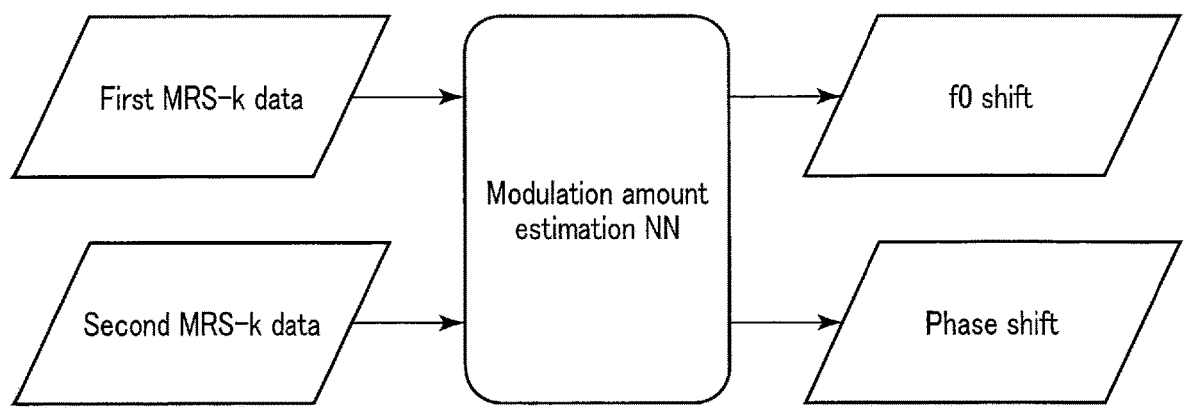
F I G. 23

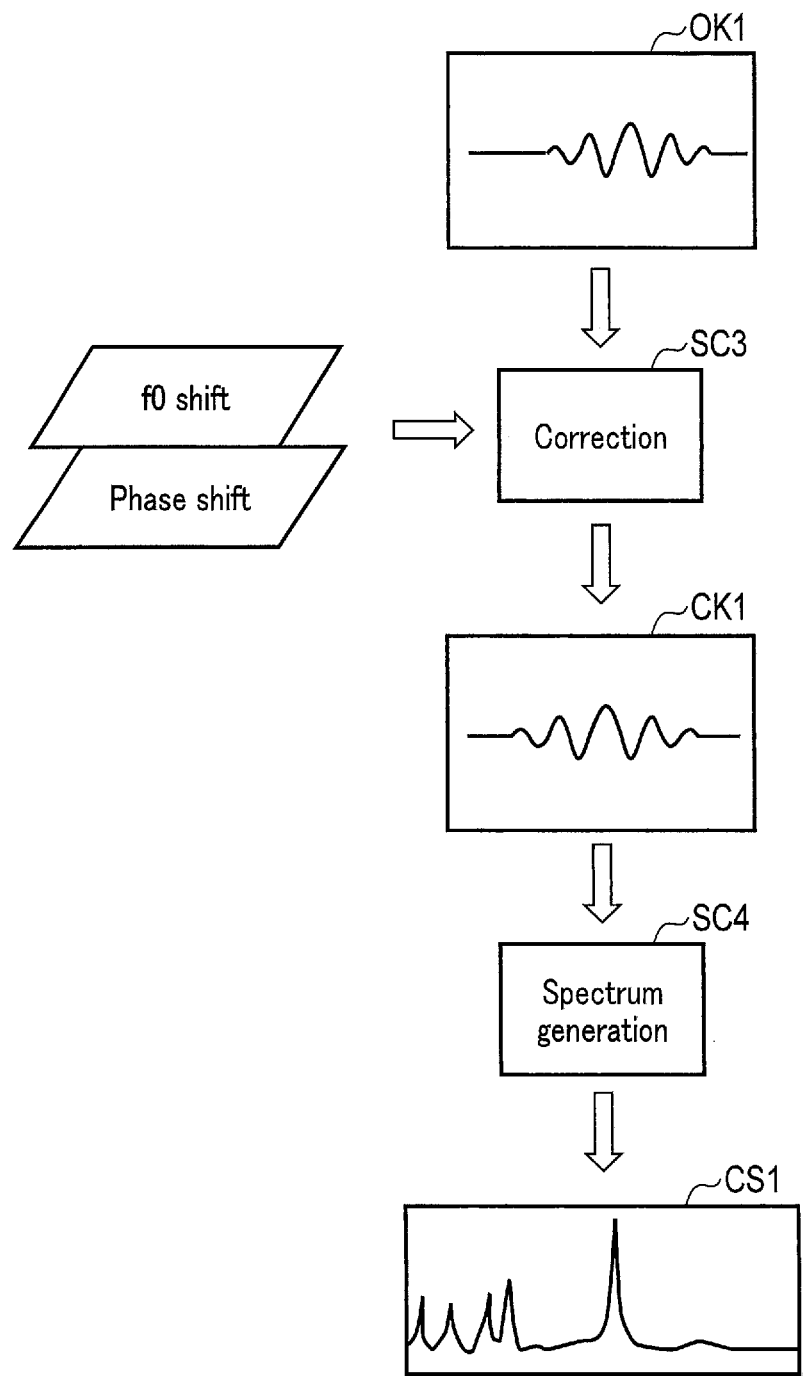
F I G. 24

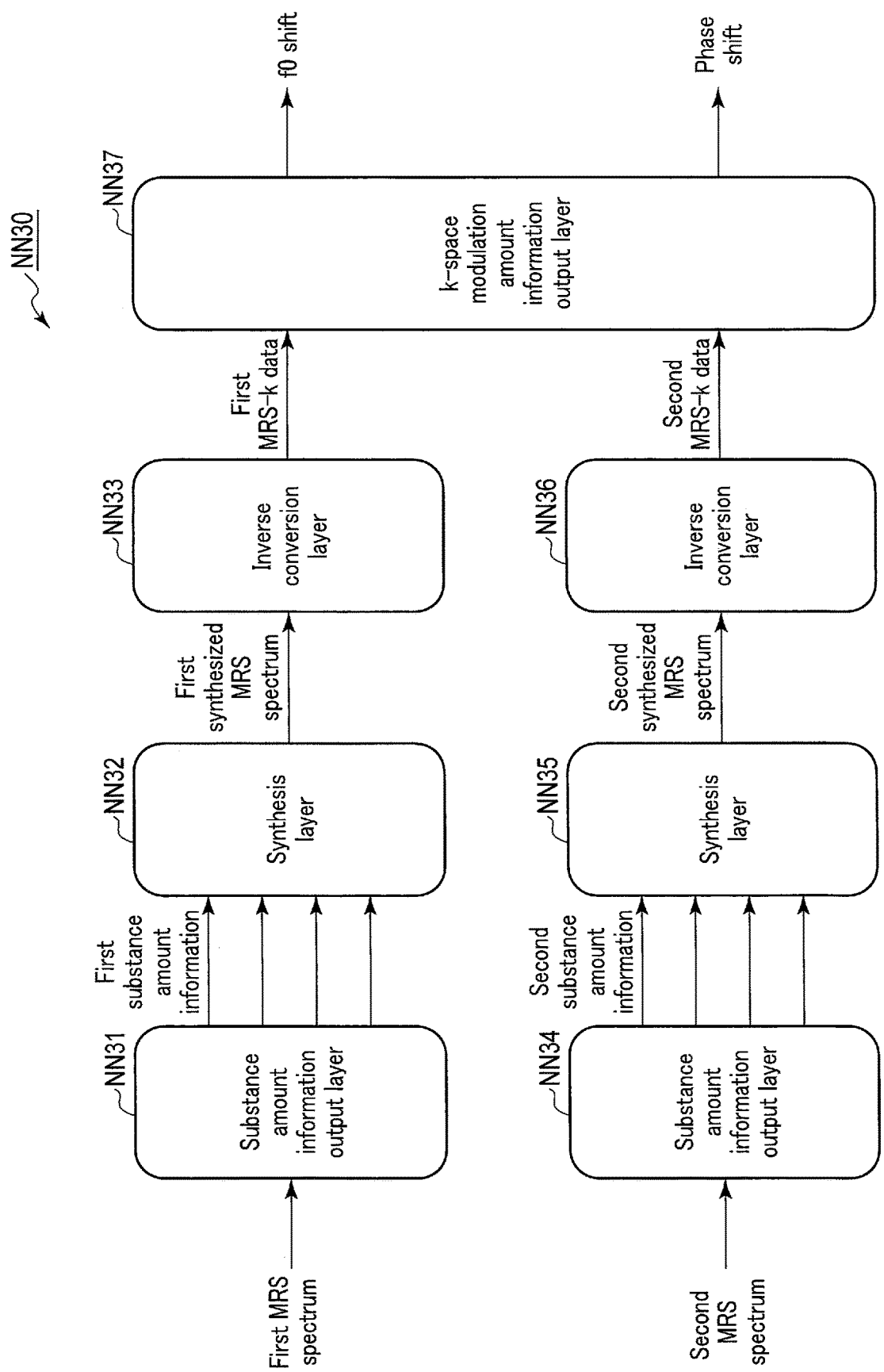
F I G. 26

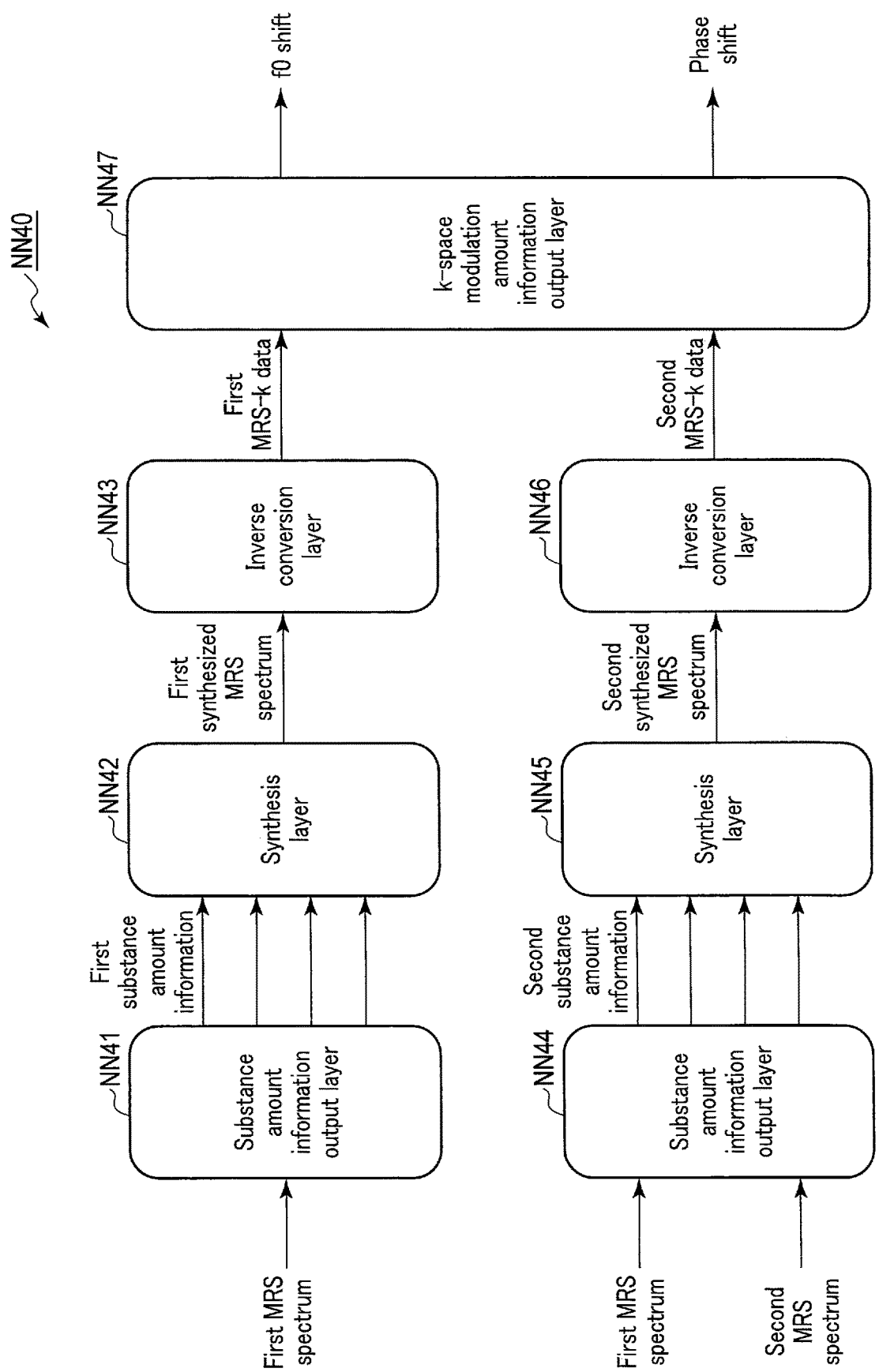
F I G. 27

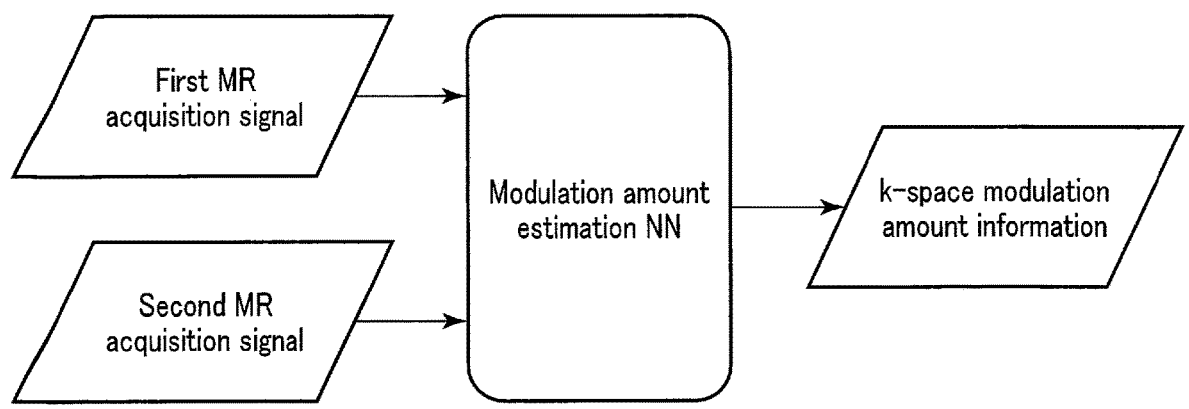
F I G. 28
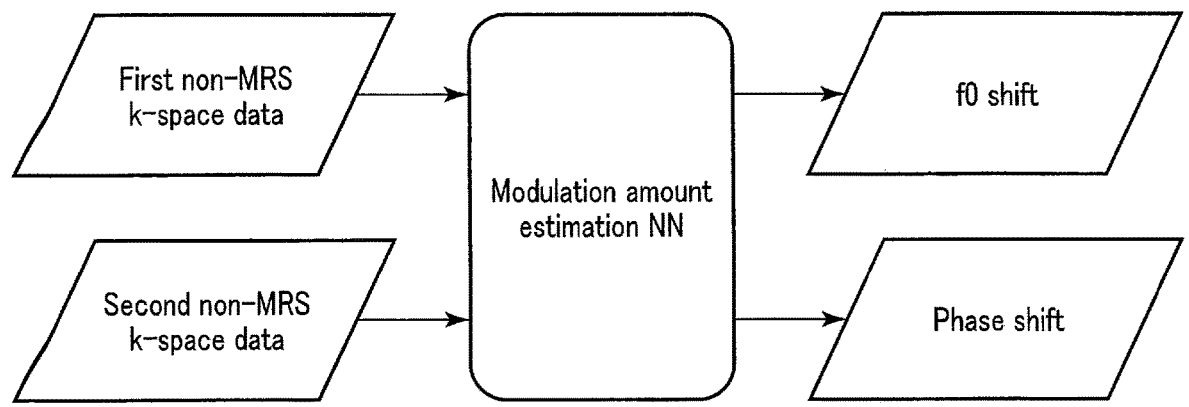
F I G. 29

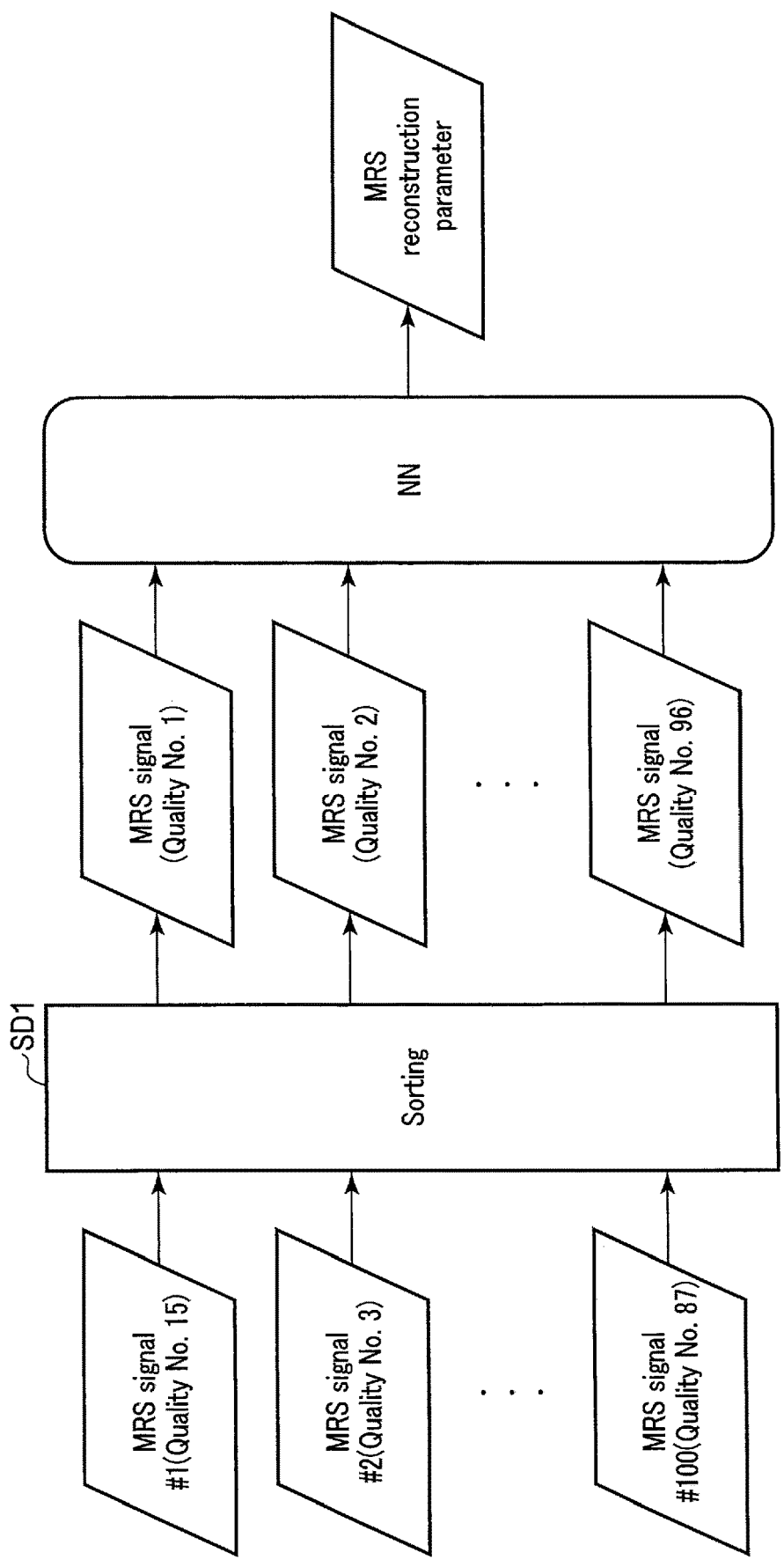
F I G. 32

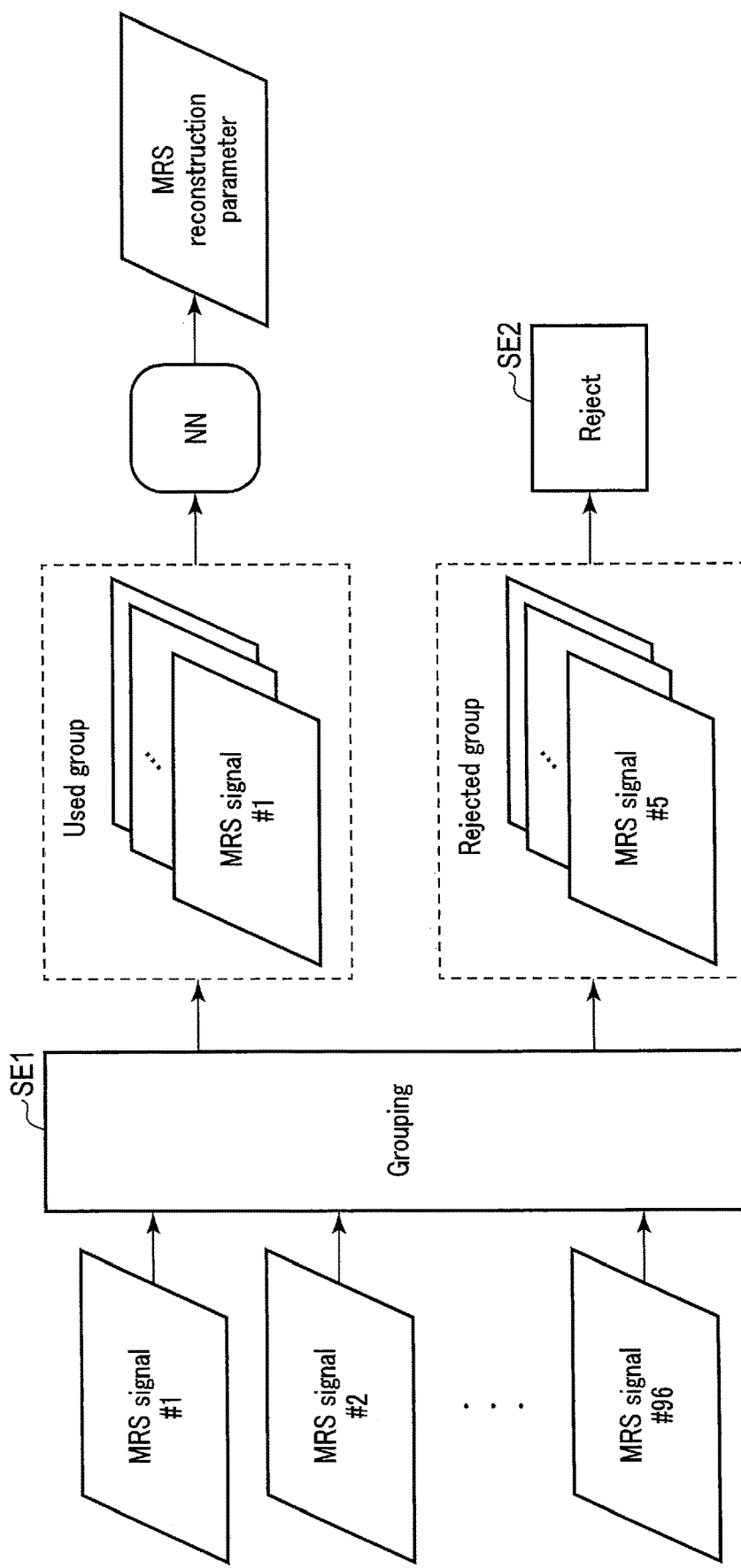
F I G. 33

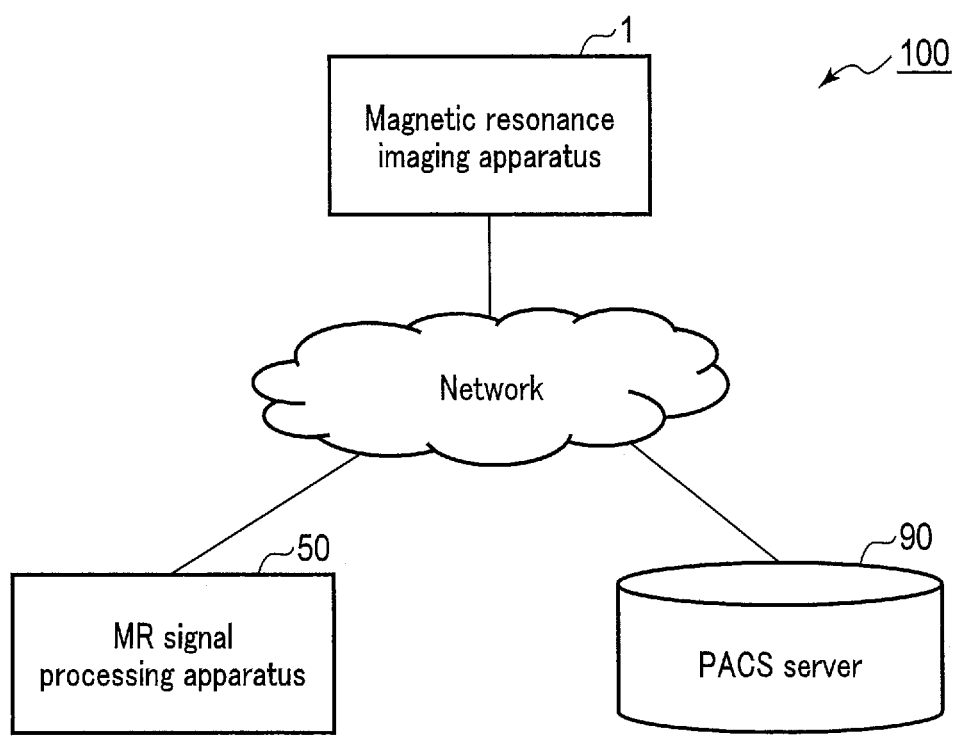
F I G. 35

MR SIGNAL PROCESSING APPARATUS

CROSS-REFERENCE TO RELATED APPLICATIONS

This application is based upon and claims the benefit of priority from the Japanese Patent Application No. 2020-168961, filed Oct. 6, 2020, and the Japanese Patent Application No. 2021-156702, filed Sep. 27, 2021, the entire contents of all of which are incorporated herein by reference.

FIELD

Embodiments described herein relate generally to an MR signal processing apparatus.

BACKGROUND

Data acquisition by magnetic resonance spectroscopy (MRS) is known to be extremely unstable. Thus, the number of excitations is set to about 50 to 100, and MRS signals acquired by the respective excitations are averaged by being added up. However, distortion is caused in an average MRS signal by a body movement of a subject, a static magnetic field disturbance, and the like between data acquisitions.

A technique of generating an MRS signal by least-square fitting is known. An MRS spectrum of a measurement target is generated by generating artificial spectra of about 20 metabolites and the like by physical models, and applying a spectrum parameter, such as a signal strength value, to each artificial spectrum to perform fitting. A technique of expressing, by a deep neural network, a regression process to obtain a spectrum parameter relating to each artificial spectrum from a single MRS spectrum is also known.

BRIEF DESCRIPTION OF THE DRAWINGS

FIG. 5 schematically shows a specific example of the input/output relationship of the substance amount estimation NN according to the first embodiment.

FIG. 14 schematically shows an input/output relationship of a trained model (base component amount estimation NN) according to the second embodiment.

FIG. 16 schematically shows the input/output relationship of the base component amount estimation NN according to the second embodiment.

FIG. 17 schematically shows normality or abnormality determination processing (determination result=normal) based on base component amount information, which is performed in step SB4 in FIG. 15.

FIG. 21 schematically shows an input/output relationship of a trained model (modulation amount estimation NN) according to the third embodiment.

FIG. 23 schematically shows a specific example of the input/output relationship of the modulation amount estimation NN according to the third embodiment.

FIG. 24 schematically shows correction processing and spectrum generation processing in steps SC3 and SC4 in FIG. 22.

FIG. 26 shows a network configuration example of a second integrated model according to the fourth embodiment.

FIG. 27 shows a network configuration example of another second integrated model according to the fourth embodiment.

FIG. 28 schematically shows an input/output relationship of a trained model (modulation amount estimation NN) according to a fifth embodiment.

FIG. 29 schematically shows a specific example of the input/output relationship of the modulation amount estimation NN according to the fifth embodiment.

FIG. 32 schematically shows a processing example according to a seventh embodiment.

FIG. 33 schematically shows a processing example according to an eighth embodiment.

FIG. 35 shows a configuration example of a magnetic resonance imaging system including an MR signal processing apparatus according to a tenth embodiment.

DETAILED DESCRIPTION

According to an embodiment, an MR signal processing apparatus includes processing circuitry. The processing circuitry inputs a plurality of MRS signals acquired by MR spectroscopy on the same target to a trained model, and outputs a parameter for MRS reconstruction.

Hereinafter, embodiments of the MR signal processing apparatus will be explained in detail with reference to the accompanying drawings.

The MR signal processing apparatus according to an embodiment is a computer configured to process an MR signal acquired by a magnetic resonance imaging apparatus. The MR signal processing apparatus may be a computer embedded in the magnetic resonance imaging apparatus or a computer separate from the magnetic resonance imaging apparatus. Hereinafter, some embodiments of the MR signal processing apparatus will be described.

First Embodiment

Figure 1:
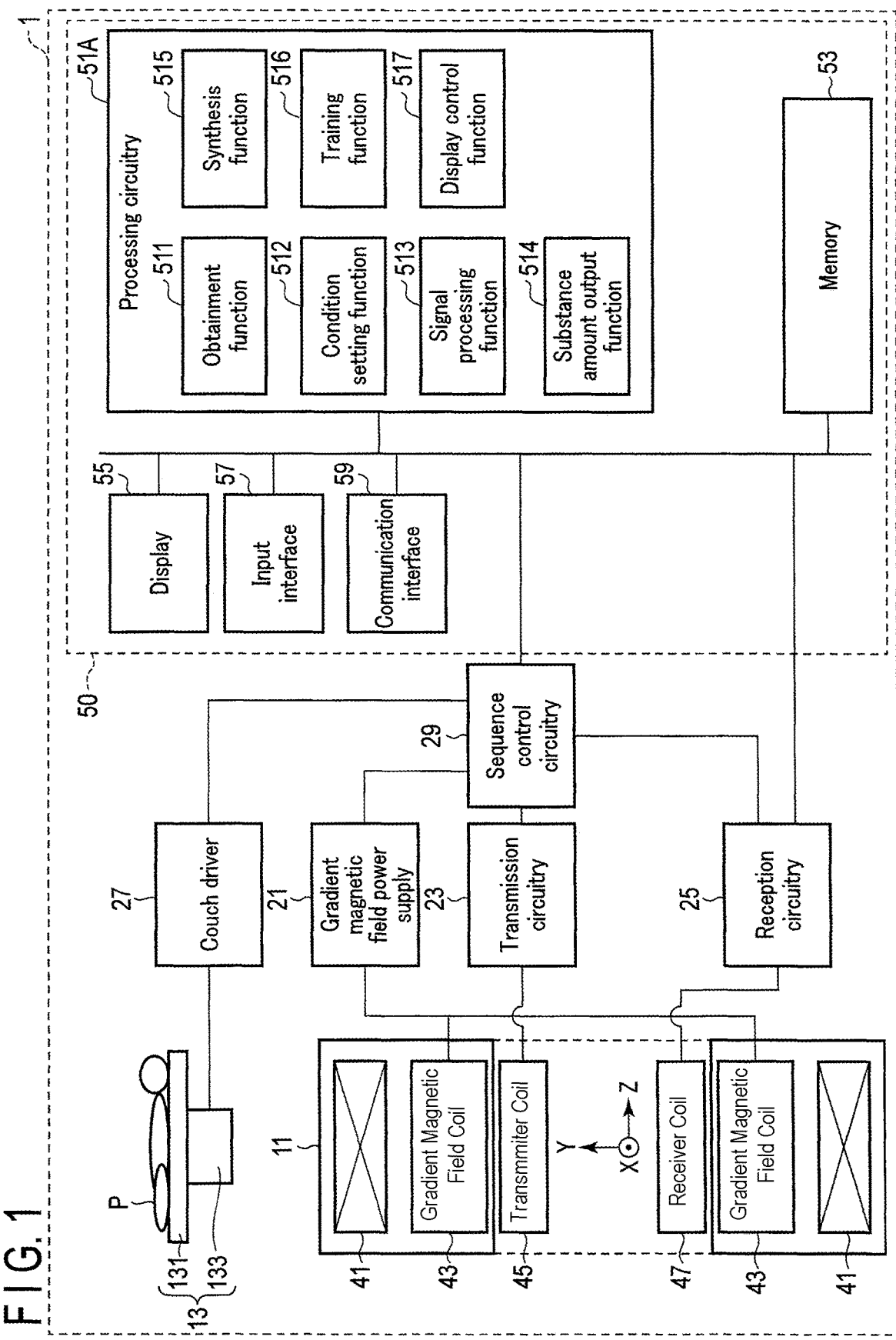
FIG. 1 shows a configuration example of a magnetic resonance imaging apparatus according to a first embodiment.

FIG. 1 shows a configuration example of a magnetic resonance imaging apparatus 1 according to a first embodiment. As shown in FIG. 1, the magnetic resonance imaging apparatus 1 includes a gantry 11, a couch 13, a gradient magnetic field power supply 21, transmission circuitry 23, reception circuitry 25, a couch driver 27, sequence control circuitry 29, and an MR signal processing apparatus (host computer) 50.

The gantry 11 includes a static magnetic field magnet 41 and a gradient magnetic field coil 43. The static magnetic field magnet 41 and the gradient magnetic field coil 43 are accommodated in the housing of the gantry 11. A bore in a hollow shape is formed in the housing of the gantry 11. A transmitter coil 45 and a receiver coil 47 are disposed in the bore of the gantry 11.

The static magnetic field magnet 41 has a hollow approximately cylindrical shape and generates a static magnetic field inside the approximate cylinder. Examples of the static magnetic field magnet 41 include a permanent magnet, a superconducting magnet, and a normal conducting magnet. Here, the central axis of the static magnetic field magnet 41 is defined as the Z-axis, the axis vertically orthogonal to the Z-axis is defined as the Y-axis, and the axis horizontally orthogonal to the Z-axis is defined as the X-axis. The X-axis, the Y-axis and the Z-axis constitute an orthogonal three-dimensional coordinate system.

The gradient magnetic field coil 43 is a coil unit attached to the inside of the static magnetic field magnet 41 and formed in a hollow approximately cylindrical shape. The gradient magnetic field coil 43 generates a gradient magnetic field upon receiving a current supplied from the gradient magnetic field power supply 21. Specifically, the gradient magnetic field coil 43 includes three coils corresponding to the X-axis, the-Y axis, and the-Z axis, which are orthogonal to each other. The three coils form gradient magnetic fields in which the magnetic field strengths change along the X-axis, the Y-axis, and the Z-axis, respectively. The gradient magnetic fields along the X-axis, the Y-axis, and the Z-axis are combined to form a slice selection gradient magnetic field Gs, a phase encoding gradient magnetic field Gp, and a frequency encoding gradient magnetic field Gr, which are orthogonal to each other, in desired directions. The slice selection gradient magnetic field Gs is used to discretionarily determine an imaging slice. The phase encoding gradient magnetic field Gp is used to change the phase of a magnetic resonance signal (hereinafter referred to as an MR signal) in accordance with a spatial position. The frequency encoding gradient magnetic field Gr is used to change the frequency of an MR signal in accordance with a spatial position. In the following explanation, it is assumed that the gradient direction of the slice selection gradient magnetic field Gs aligns with the Z-axis, the gradient direction of the phase encoding gradient magnetic field Gp aligns with the Y-axis, and the gradient direction of the frequency encoding gradient magnetic field Gr aligns with the X-axis.

The gradient magnetic field power supply 21 supplies a current to the gradient magnetic field coil 43 in accordance with a sequence control signal from the sequence control circuitry 29. Through the supply of the current to the gradient magnetic field coil 43, the gradient magnetic field power supply 21 causes the gradient magnetic field coil 43 to generate gradient magnetic fields along the X-axis, the Y-axis, and the Z-axis. The gradient magnetic fields are superimposed on the static magnetic field formed by the static magnetic field magnet 41 and are applied to a subject P.

The transmitter coil 45 is disposed, for example, inside the gradient magnetic field coil 43, and generates a high frequency pulse (hereinafter, referred to as an RF pulse) upon receiving a current supplied from the transmission circuitry 23.

The transmission circuitry 23 supplies a current to the transmitter coil 45 in order to apply an RF pulse for exciting a target proton in the subject P to the subject P via the transmitter coil 45. The RF pulse oscillates at a resonance frequency specific to the target proton to excite the target proton. An MR signal is generated from the excited target proton and is detected by the receiver coil 47. The transmitter coil 45 is, for example, a whole-body coil (WB coil). The whole-body coil may be used as a transmitter/receiver coil.

The receiver coil 47 receives the MR signal emitted from the target proton in the subject P in response to an action of the RF pulse. The receiver coil 47 includes a plurality of receiver coil elements capable of receiving an MR signal. The received MR signal is supplied to the reception circuitry 25 via wire or radio. Although not shown in FIG. 1, the receiver coil 47 has a plurality of reception channels arranged in parallel. Each reception channel includes a receiver coil element which receives an MR signal, an amplifier which amplifies an MR signal, and the like. An MR signal is output from each reception channel. The total number of the reception channels may be equal to, larger than, or smaller than the total number of the receiver coil elements.

The reception circuitry 25 receives an MR signal generated from the excited target proton via the receiver coil 47. The reception circuitry 25 processes the received MR signal to generate a digital MR signal. The digital MR signal can be expressed by a k-space defined by spatial frequency. Therefore, hereinafter, the digital MR signal will be referred to as k-space data. The k-space data is a type of MR acquisition signal. The k-space data is supplied to the host computer 50 via wire or radio.

The transmitter coil 45 and the receiver coil 47 described above are merely examples. Instead of the transmitter coil 45 and the receiver coil 47, a transmitter/receiver coil which has a transmitting function and a receiving function may be used. Alternatively, the transmitter coil 45, the receiver coil 47, and the transmitter/receiver coil may be combined.

The couch 13 is installed adjacent to the gantry 11. The couch 13 includes a top plate 131 and a base 133. The subject P is placed on the top plate 131. The base 133 supports the top plate 131 slidably along each of the X-axis, the Y-axis, and the Z-axis. The couch driver 27 is accommodated in the base 133. The couch driver 27 moves the top plate 131 under the control of the sequence control circuitry 29. The couch driver 27 may include, for example, any motor such as a servomotor or a stepping motor.

The sequence control circuitry 29 includes, as hardware resources, a processor such as a central processing unit (CPU) or a micro processing unit (MPU), and a memory such as a read only memory (ROM) or a random access memory (RAM). The sequence control circuitry 29 synchronously controls the gradient magnetic field power supply 21, the transmission circuitry 23, and the reception circuitry 25 on the basis of a data acquisition condition set by a condition setting function 512 of the processing circuitry 51A, and performs data acquisition according to the data acquisition condition on the subject P to acquire k-space data on the subject P.

The sequence control circuitry 29 according to the present embodiment executes data acquisition for MR spectroscopy, which is a type of chemical shift measurement. The chemical shift measurement is a technique of measuring a chemical shift, which is a small difference in resonance frequency of a target proton such as a hydrogen nucleus, which is caused in accordance with a difference in chemical environment. The MR spectroscopy includes a single voxel method in which data acquisition is performed on a single voxel and a multi-voxel method in which data acquisition is performed on a plurality of voxels, and the present embodiment can be applied to either method. The multi-voxel method is also referred to as chemical shift imaging (CSI) or MRS imaging (MRSI). A measurement target voxel is referred to as a voxel of interest.

The sequence control circuitry 29 executes data acquisition for MR spectroscopy on the subject P. Through execution of the data acquisition for MR spectroscopy, a free induction decay (FID) signal or spin echo signal is generated from the voxel of interest of the subject P. The reception circuitry 25 receives the FID signal or spin echo signal via the receiver coil 47, and processes the received FID signal or spin echo signal to acquire k-space data on the voxel of interest. Let us assume that the acquired k-space data is digital data expressing, by a time function, the value of the strength of the signal emitted from the voxel of interest. A pulse sequence for MR spectroscopy is repeated for the number of excitations (NEX), and k-space data for the number of excitations is acquired. Hereinafter, the k-space data acquired by MR spectroscopy will be referred to as MRS-k data. The MRS-k data is an example of the MRS signal.

As shown in FIG. 1, the MR signal processing apparatus 50 is a computer including processing circuitry 51A, a memory 53, a display 55, an input interface 57, and a communication interface 59.

The processing circuitry 51A includes, as a hardware resource, a processor such as a CPU. The processing circuitry 51A functions as the center unit of the magnetic resonance imaging apparatus 1. For example, through execution of various programs, the processing circuitry 51A implements an obtainment function 511, a condition setting function 512, a signal processing function 513, a substance amount output function 514, a synthesis function 515, a training function 516, and a display control function 517.

Through the obtainment function 511, the processing circuitry 51A obtains various MRS signals. For example, the processing circuitry 51A obtains MRS-k data acquired by the sequence control circuitry 29. The processing circuitry 51A may directly obtain MRS-k data from the sequence control circuitry 29 or the reception circuitry 25, or obtain MRS-k data stored in the memory 53 from the memory 53.

Through the condition setting function 512, the processing circuitry 51A automatically or manually sets a data acquisition condition. Specifically, a data acquisition condition relating to MR spectroscopy is set in the present embodiment. The data acquisition condition relating to MR spectroscopy includes condition items such as a pulse sequence, a repetition time (TR), an echo time (TE), the number of excitations, a spectrum width, the number of samples, a data acquisition method, and an area selection pulse. As the pulse sequence, for example, point resolved spectroscopy (PRESS) and stimulated echo acquisition mode (STEAM) are known. The TR is preferably set to, for example, 5000 ms or longer for a long TR, and set between, for example, 1000 ms and 3000 ms for a short TR. As the TR becomes longer, the obtained MR signal strength value becomes closer to the true value, but the data acquisition time becomes longer. The TE may be set between about 100 ms and 300 ms for a long TE, and set between about 20 ms and 100 ms for a short TE. As the TE becomes shorter, the number of peaks increases, and the MRS spectrum accuracy improves and, as the TE becomes longer, the number of peaks decreases, and the MRS spectrum visibility improves.

The number of excitations is not particularly limited, and may be set to 1 or a larger value. The spectrum width and the number of samples are condition items relating to spectrum resolution. The spectrum width and the number of samples may be set to any value. As described above, the data acquisition method includes a single voxel method in which an MRS spectrum of one voxel is obtained by one data acquisition, and a multi-voxel method in which MRS spectra of a plurality of voxels are obtained by one data acquisition. The area selection pulse includes a pulse for exciting hydrogen nuclei in a limited set area, and a pulse for not exciting hydrogen nuclei in a limited set area. As the data acquisition condition, whether or not to apply the area selection pulse, frequency information on the selected area, and the like are set.

Through the signal processing function 513, the processing circuitry 51A performs various types of signal processing on the MRS signals obtained through the obtainment function 511. For example, the processing circuitry 51A generates, based on the MRS-k data, a spectrum (hereinafter referred to as an MRS spectrum) indicating the signal strength of each chemical shift. The MRS spectrum is an example of the MRS signal.

Through the substance amount output function 514, the processing circuitry 51A inputs a plurality of MRS signals obtained by MR spectroscopy in relation to the same measurement target site of the subject P to a trained model, and outputs a plurality of parameters for MRS reconstruction. The parameters according to the first embodiment are spectrum parameters for fitting based on a plurality of spectrum models corresponding respectively to the parameters. The spectrum models are a plurality of artificial spectra corresponding respectively to a plurality of substances included in the measurement target site of the subject P. The spectrum parameters include substance amount information on a plurality of substances relating to the measurement target site of the subject P. The substance amount information refers to information on the substance amount of the relevant substance. Hereinafter, the parameters according to the first embodiment will be referred to as substance amount information. The trained model is a machine learning model trained to output substance amount information in response to an input of a plurality of MRS signals. As the machine learning model, a neural network or a deep neural network is used. Hereinafter, the trained model according to the first embodiment will be referred to as a substance amount estimation NN.

Through the synthesis function 515, the processing circuitry 51A generates an MRS spectrum by fitting based on a plurality of spectrum parameters output through the substance amount output function 514 and the spectrum models. The MRS spectrum generated through the synthesis function 515 will be referred to as a synthesized MRS spectrum.

Through the training function 516, the processing circuitry 51A generates, by machine learning based on training data, a substance amount estimation NN used by the substance amount output function 514.

Through the display control function 517, the processing circuitry 51A causes the display 55 to display various types of information. For example, the processing circuitry 51A causes the display 55 to display an MRS spectrum, substance amount information, a synthesized MRS spectrum, a screen for setting a data acquisition condition, and the like.

The memory 53 is a storage device, such as a hard disk drive (HDD), a solid state drive (SSD), or an integrated circuit storage device, which stores various types of information. The memory 53 may be a drive that reads and writes various types of information from and to a portable storage medium such as a CD-ROM drive, a DVD drive, or a flash memory. For example, the memory 53 stores a substance amount estimation NN, a data acquisition condition, an MRS signal, a control program, and the like.

Through the display control function 517, the display 55 displays various types of information. As the display 55, for example, a CRT display, a liquid crystal display, an organic EL display, an LED display, a plasma display, or any other display known in the relevant technical field may be used as appropriate.

The input interface 57 includes an input device that receives various commands from a user. Examples of the input device include a keyboard, a mouse, various switches, a touch screen, and a touch pad. The input device is not limited to a device with a physical operation component, such as a mouse or a keyboard. For example, examples of the input interface 57 also include electrical signal processing circuitry that receives an electrical signal corresponding to an input operation from an external input device provided separately from the magnetic resonance imaging apparatus 1, and outputs the received electrical signal to various circuits. The input interface 57 may also be a voice recognition device which receives a voice signal acquired via a microphone and converts the voice signals into an instruction signal.

The communication interface 59 is an interface connecting the magnetic resonance imaging apparatus 1 with a workstation, a picture archiving and communication system (PACS), a hospital information system (HIS), a radiology information system (RIS), and the like via a local area network (LAN) or the like. The network IF transmits and receives various types of information to and from the connected workstation, PACS, HIS, and RIS.

The above configuration is merely an example, and the present embodiment is not limited thereto. For example, the sequence control circuitry 29 may be incorporated into the MR signal processing apparatus 50. The sequence control circuit 29 and the processing circuitry 51A may be mounted on the same substrate. The condition setting function 512 does not necessarily have to be implemented in the processing circuitry 51A of the magnetic resonance imaging apparatus 1. For example, the condition setting function 512 may be implemented in a computer for setting a data acquisition condition, which is provided separately from the magnetic resonance imaging apparatus 1. In this case, a data acquisition condition generated by the computer is supplied to the magnetic resonance imaging apparatus 1 via a network, a portable storage medium, or the like. Furthermore, a storage area of the data acquisition condition in the memory 53 does not necessarily have to be implemented in the magnetic resonance imaging apparatus 1, and may be implemented in, for example, a storage device connected to the magnetic resonance imaging apparatus 1 via a network.

An operation example of the MR signal processing apparatus 50 according to the first embodiment will be described in detail below.

As described above, through the substance amount output function 514, the processing circuitry 51A inputs a plurality of MRS signals to a substance amount estimation NN, and outputs substance amount information on substances included in the measurement target site of the MRS signals.

Figure 2:
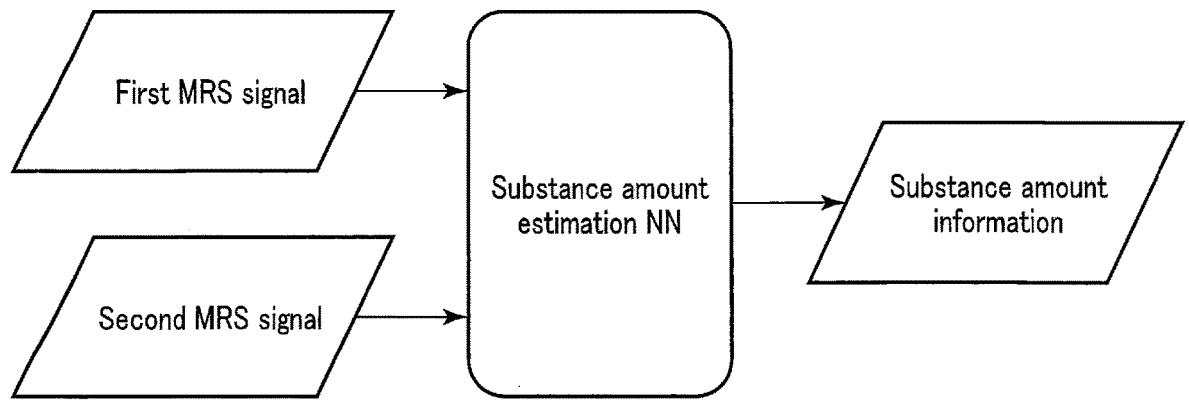
FIG. 2 schematically shows an input/output relationship of a trained model (substance amount estimation NN) according to the first embodiment.

FIG. 2 schematically shows an input/output relationship of a trained model (substance amount estimation NN) according to the first embodiment. As shown in FIG. 2, the substance amount estimation NN is a machine learning model whose parameters have been trained to output, in response to an input of a first MRS signal and a second MRS signal, substance amount information on substances included in a measurement target site of the first MRS signal and the second MRS signal. The first MRS signal and the second MRS signal are MRS signals acquired from the same subject P. The data acquisition condition of the first MRS signal may be the same as or different from that of the second MRS signal. The MRS signal input to the substance amount estimation NN may be MRS-k data or an MRS spectrum. The number of MRS signals input to the substance amount estimation NN is two in FIG. 2; however, this is an example, and the number may be any number larger than 2.

The substance amount information is information on the amount of substance distinguished by MR spectroscopy. The substance to be distinguished is not particularly limited, and may be any substance that may be included in the measurement target site. The substance to be distinguished varies depending on the measurement target site, and various molecules such as propylene glycol, ethanol, acetate, and acetone are known as the substance to be distinguished. The substance amount may be a numerical value representing a signal strength, a class corresponding to a signal strength, or any analytical value calculated based on a signal strength. The substance amount takes discrete values or continuous values including 0. The substance amount corresponds to a spectrum parameter applied to an artificial spectrum, which is a spectrum model corresponding to the substance, for fitting of the artificial spectrum.

Figure 3:
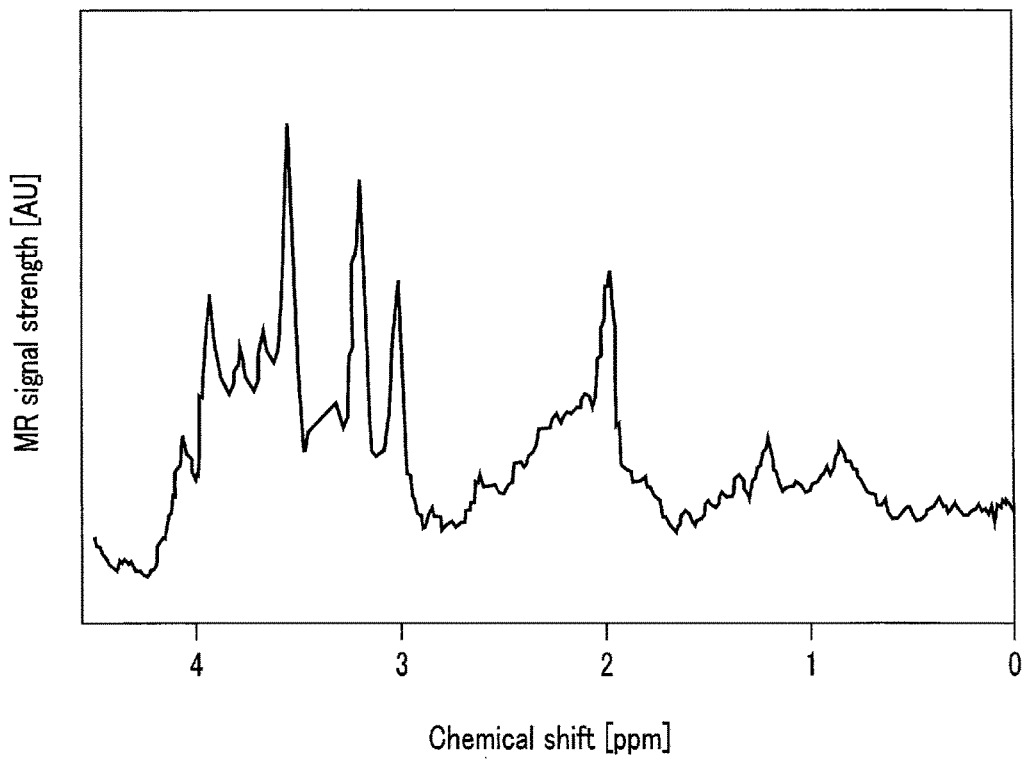
FIG. 3 schematically shows an example of an MRS spectrum.

FIG. 3 schematically shows an example of an MRS spectrum. The MRS spectrum shown in FIG. 3 is an example of an MRS spectrum of a head. As shown in FIG. 3, the vertical axis of the MRS spectrum represents the MR signal strength value [AU (arbitrary unit)], and the horizontal axis represents the difference from the reference frequency, i.e., the chemical shift [ppm (parts per million)]. The reference frequency is set to a frequency of a reference substance discretionarily selected. The reference substance is not particularly limited, but may be, for example, tetramethylsilane (TMS). The MRS spectrum can visualize the amounts of various substances, such as propylene glycol, ethanol, acetate, and acetone, which exist in the voxel of interest.

The MRS spectrum according to the present embodiment may be waveform data of an MRS spectrum, numerical data of a combination of a substance amount and an identifier of a substance (name or symbol of the substance) corresponding to a peak, or numerical data of a combination of a substance amount and a frequency difference corresponding to a peak. The substance amount information may include not only a substance amount, but also reliability information on the substance amount. The reliability information corresponds to the half width of a peak included in the MRS spectrum. As the half width, for example, a full width at half maximum or a half width at half maximum may be used.

The substance amount estimation NN is generated by the training function 516 of the processing circuitry 51A. The processing circuitry 51A trains a machine learning model based on a plurality of training samples to generate a substance amount estimation NN. The training sample is a combination of first and second MRS signals, which are input data, and substance amount information (hereinafter referred to as truth substance amount information), which is truth data. The first and second MRS signals, which are input data, are generated by the magnetic resonance imaging apparatus 1 or another magnetic resonance imaging apparatus. As the truth substance amount information, substance amount information obtained by signal analysis based on the input data is used. The processing circuitry 51A inputs the first and second MRS signals to a machine learning model to perform forward propagation, and outputs substance amount information (hereinafter referred to as estimated substance amount information). Next, the processing circuitry 51A inputs a difference (error) between the estimated substance amount information and the truth substance amount information to the machine learning model to perform backward propagation, and calculates a gradient vector, which is a differential function of an error function which is a function of a parameter. The processing circuitry 51A then updates parameters of the machine learning model based on the gradient vector. The forward propagation, backward propagation, and parameter updating are repeated while changing training samples, and parameters that minimize the error function are determined in accordance with a predetermined optimization method. The substance amount estimation NN is thereby generated.

Next, signal processing by the MR signal processing apparatus 50 according to the first embodiment will be described with reference to FIG. 4. In the following explanation, the MRS signal input to the substance amount estimation NN is assumed to be an MRS spectrum.

Figure 4:
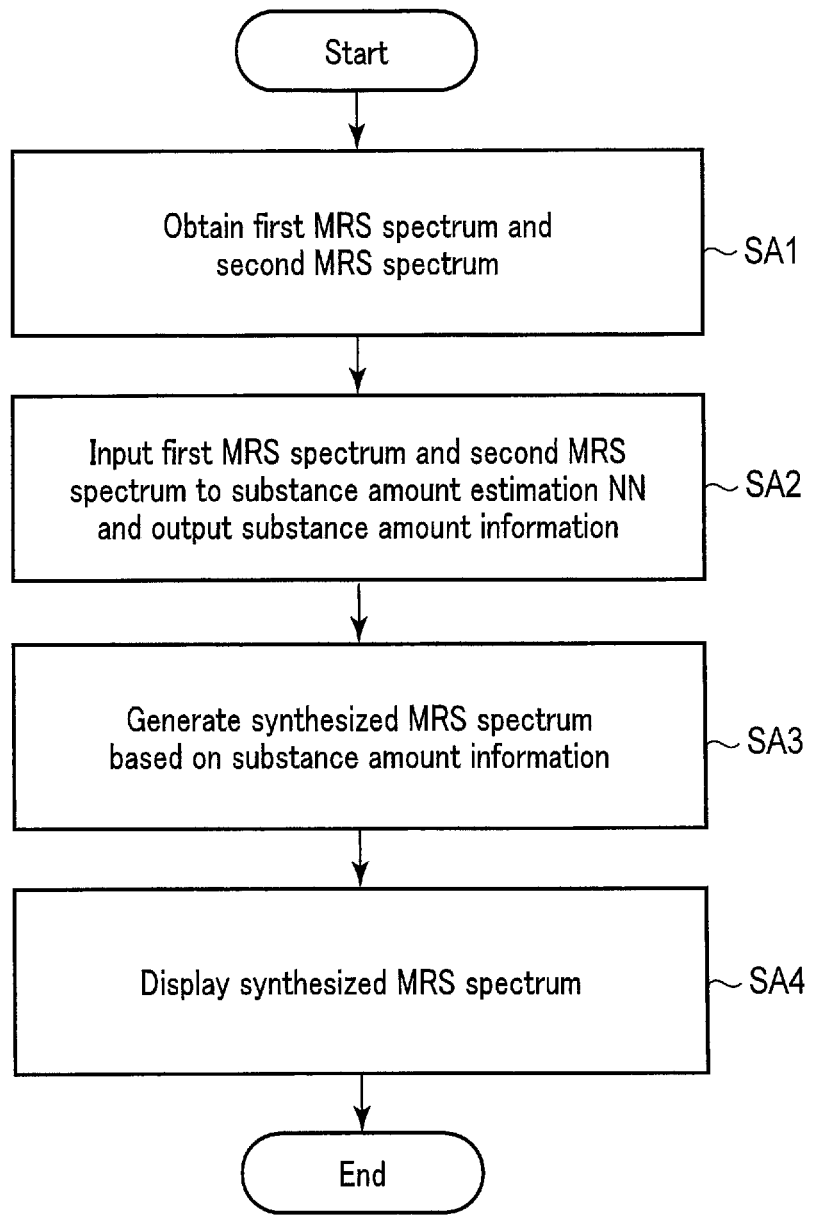
FIG. 4 shows an example of the flow of signal processing by an MR signal processing apparatus according to the first embodiment.

FIG. 4 shows an example of the flow of the signal processing by the MR signal processing apparatus 50 according to the first embodiment.

As shown in FIG. 4, the processing circuitry 51A obtains a first MRS spectrum and a second MRS spectrum through implementation of the obtainment function 511 (step SA1). The first MRS spectrum and the second MRS spectrum are, for example, MRS spectra relating to the same measurement target site, which are collected by a single voxel method under the same data acquisition condition. In MR spectroscopy, for example the number of excitations is set to about 50 to 150 as the data acquisition condition, and MRS spectra for the number of excitations are generated by the processing circuitry 51A. The processing circuitry 51A performs addition processing, such as an addition or an addition average, on the MRS spectra for the number of excitations to generate one MRS spectrum. In step SA1, the processing circuitry 51A selectively obtains, as the first MRS spectrum and the second MRS spectrum, any two MRS spectra from the MRS spectra for the number of excitations before addition processing. The two MRS spectra are not particularly limited, and may be two MRS spectra of successive data acquisition times or two MRS spectra of separate times. The two MRS spectra may be manually selected in accordance with an instruction by the user through the input interface 57 or automatically selected in accordance with a predetermined algorithm.

The addition processing may be performed on MRS-k data items for the number of excitations. In this case, the processing circuitry 51A may select two MRS-k data items from the MRS-k data items for the number of excitations before addition processing, generate two MRS spectra from the two selected MRS-k data items, and obtain the two generated MRS spectra as the first MRS spectrum and the second MRS spectrum.

After step SA1, the processing circuitry 51A inputs the first MRS spectrum and the second MRS spectrum obtained in step SA1 to the substance amount estimation NN and outputs substance amount information, through implementation of the substance amount output function 514 (step SA2).

FIG. 5 schematically shows an input/output relationship of the substance amount estimation NN. As shown in FIG. 5, the substance amount estimation NN is a machine learning model whose parameters have been trained to output, in response to an input of a first MRS signal and a second MRS signal, substance amount information on substances included in a measurement target site of the first MRS signal and the second MRS signal. As the substance amount information, a substance amount M1 and half width W1 of propylene glycol, a substance amount M2 and half width W2 of ethanol, a substance amount M3 and half width W3 of acetate, a substance amount M4 and half width W4 of acetone are shown as examples. When there are a plurality of peaks for one substance, a substance amount and half width are output for each peak. The peak may be identified based on the frequency difference.

The processing circuitry 51A inputs the first MRS spectrum and the second MRS spectrum obtained in step SA1 to the substance amount estimation NN, and outputs a substance amount M1 and half width W1 of propylene glycol, a substance amount M2 and half width W2 of ethanol, a substance amount M3 and half width W3 of acetate, and a substance amount M4 and half width W4 of acetone. According to the first embodiment, substance amount information can be estimated from a plurality of MRS spectra relating to the same measurement target site, which enables accurate estimation of substance amount information on substances included in the measurement target site.

After step SA2, the processing circuitry 51A generates a synthesized MRS spectrum based on the substance amount information output in step SA2, through implementation of the synthesis function 515 (step SA3).

Figure 6:
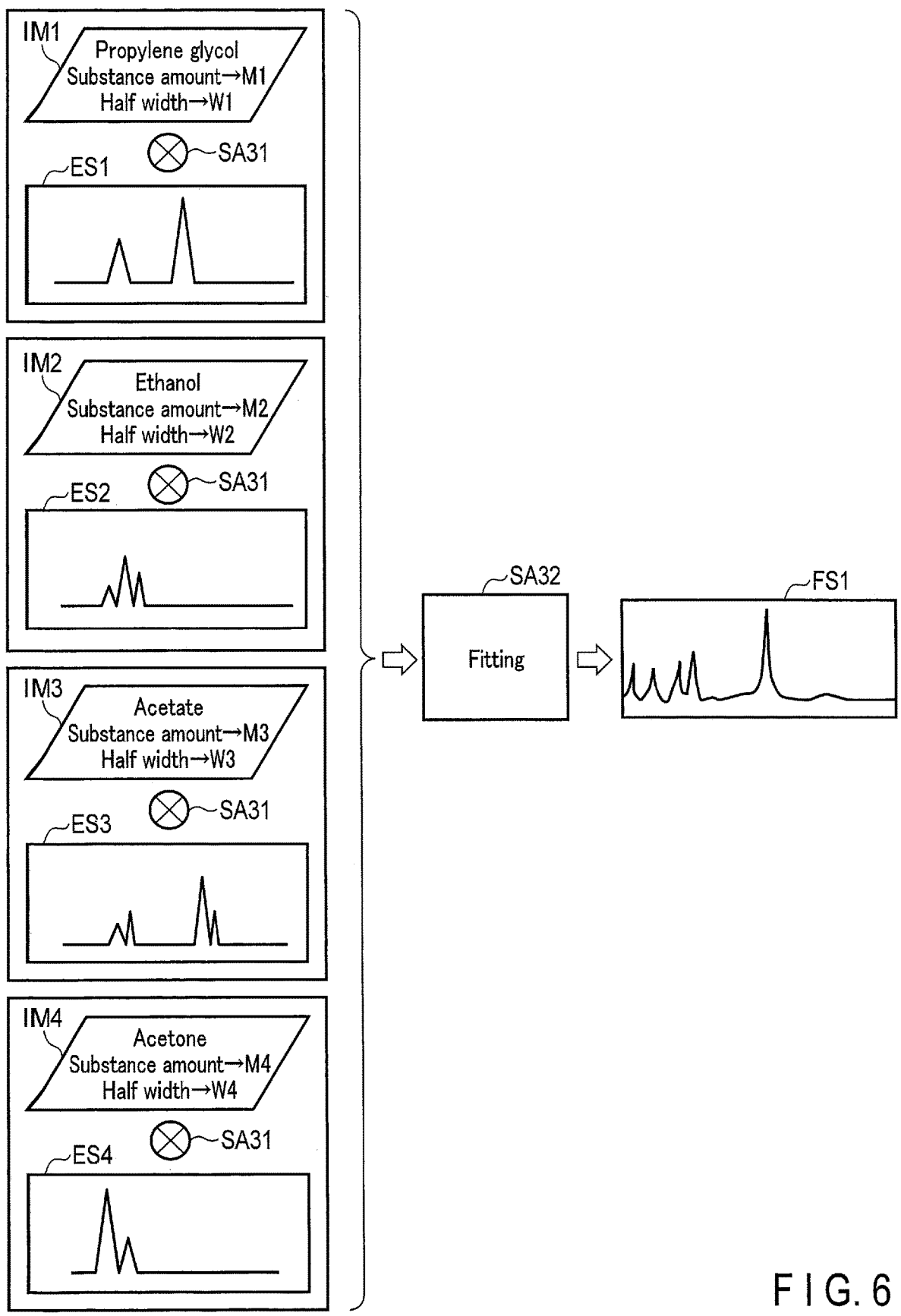
FIG. 6 schematically shows generation processing of a synthesized MRS spectrum in step SA3 of FIG. 4.

FIG. 6 schematically shows generation processing of a synthesized MRS spectrum in step SA3. As shown in FIG. 6, it is assumed that substance amount information IM1 of propylene glycol, substance amount information IM2 of ethanol, substance amount information IM3 of acetate, substance amount information IM4 of acetone are output in step SA2. Meanwhile, an artificial spectrum corresponding to each substance to be distinguished by the substance amount estimation NN is generated and stored in advance in the memory 53 or the like. The artificial spectrum is a theoretical MRS spectrum relating to the substance, and is generated by a predictive calculation or the like using a physics model or the like. It can be said that the artificial spectrum is an ideal MRS spectrum without noise caused by instability of data acquisition by MR spectroscopy, a body movement of the subject P, a static magnetic field disturbance, or the like. In the example of FIG. 6, an artificial spectrum ES1 of propylene glycol, an artificial spectrum ES2 of ethanol, an artificial spectrum ES3 of acetate, and an artificial spectrum ES4 of acetone are generated in advance.

In step SA3, the processing circuitry 51A generates a synthesized MRS spectrum based on the substance amounts and half widths of a plurality of substances and a plurality of artificial spectra corresponding to the substances. Specifically, the processing circuitry 51A generates a plurality of corrected artificial spectra by applying the substance amounts and half widths of substances to the artificial spectra of the respective substances, and generates a synthesized MRS spectrum by fitting based on the generated corrected artificial spectra.

More specifically, the processing circuitry 51A generates a corrected artificial spectrum of propylene glycol by applying the substance amount M1 and half width W1 of propylene glycol to the artificial spectrum ES1 (step SA31). Similarly, a corrected artificial spectrum is generated for ethanol, acetate, and acetone (step SA31). Next, the processing circuitry 51A performs fitting on the corrected artificial spectrum of propylene glycol, the corrected artificial spectrum of ethanol, and the corrected artificial spectrum of acetate, and generates a synthesized MRS spectrum FS1 (step SA32). As the fitting method, any fitting method such as least-square fitting may be used. Since the synthesized MRS spectrum FS1 is generated based on the ideal artificial spectra ES1 to ES4, noise caused by instability of data acquisition by MR spectroscopy, a body movement of the subject P, and a static magnetic field disturbance is reduced in comparison with the input first MRS spectrum and second MRS spectrum. In other words, the substance amount estimation by the substance amount estimation NN (step SA2) and the generation of a synthesized MRS spectrum based on substance amount information (step SA3) can be regarded as processes equivalent to denoising processing of the first MRS spectrum and second MRS spectrum.

After step SA3, the processing circuitry 51A causes the synthesized MRS spectrum generated in step SA3 to be displayed, through implementation of the display control function 517 (step SA4). The synthesized MRS spectrum is displayed on the display 55. This enables the user to observe the synthesized MRS spectrum, which is a denoised MRS spectrum.

This is the end of the signal processing by the MR signal processing apparatus 50 according to the first embodiment.

The first embodiment can be modified in various manners.

(First Modification)

Figure 7:
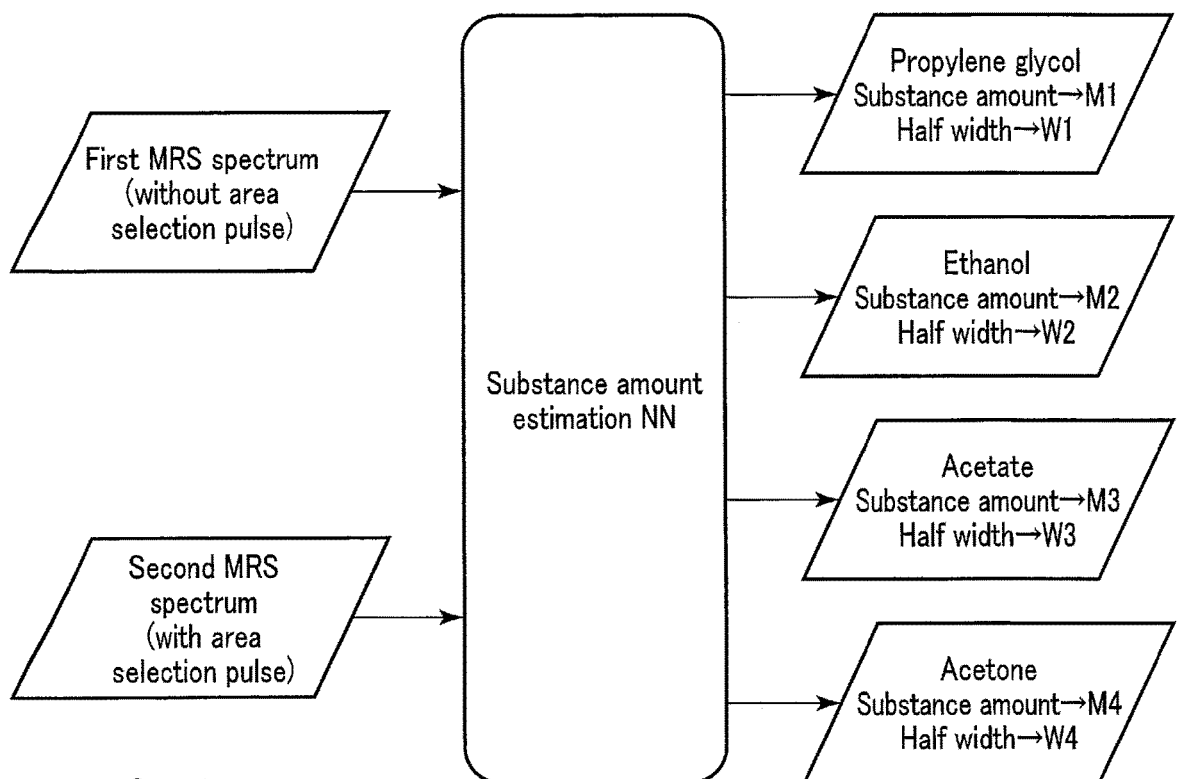
FIG. 7 schematically shows a specific example of an input/output relationship of a substance amount estimation NN according to a first modification of the first embodiment.

FIG. 7 schematically shows a specific example of an input/output relationship of a substance amount estimation NN according to a first modification of the first embodiment. The substance amount estimation NN according to the first modification is a machine learning model whose parameters have been trained to output, in response to an input of a first MRS spectrum and a second MRS spectrum, substance amount information on substances included in a measurement target site of the first MRS spectrum and the second MRS spectrum. The first MRS spectrum is an MRS spectrum acquired by MR spectroscopy with a pulse sequence not involving application of an area selection pulse. The second MRS spectrum is an MRS spectrum acquired by MR spectroscopy with a pulse sequence involving application of an area selection pulse.

By exciting hydrogen nuclei of substances belonging to a specific frequency band through application of an area selection pulse, a second MRS spectrum indicating a chemical shift distribution of the strengths of signals from the excited hydrogen nuclei is generated. Alternatively, by not exciting hydrogen nuclei of substances belonging to a specific frequency band through application of an area selection pulse, a second MRS spectrum indicating a chemical shift distribution of the strengths of signals from hydrogen nuclei of substances belonging to the other frequency bands is generated. When an area selection pulse is not applied, hydrogen nuclei of the substances belonging to all frequency bands are excited, and a first MRS spectrum indicating a chemical shift distribution of the strengths of signals from the hydrogen nuclei of the substances belonging to all frequency bands is generated. The area selection pulse separates, on the MRS spectrum, a plurality of peaks of overlapping chemical shifts (frequency differences) which are caused by different substances, and thus is used to selectively excite or selectively unexcite substances belonging to the specific frequency band among the substances.

Input of the first MRS spectrum and the second MRS spectrum to the substance amount estimation NN enables the substance amount estimation NN to recognize specific substances belonging to the specific frequency band separately from the other substances, and thus can improve the estimation accuracy of substance amount information of specific substances.

(Second Modification)

Figure 8:
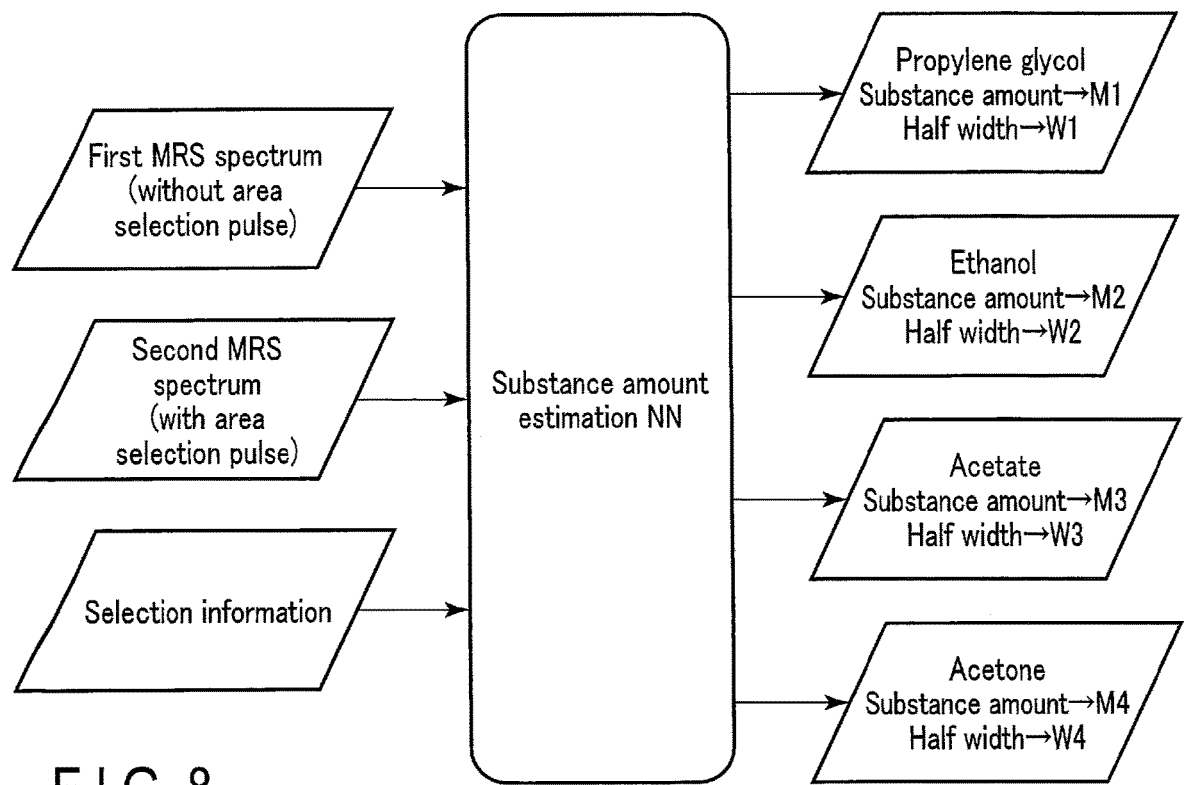
FIG. 8 schematically shows a specific example of an input/output relationship of a substance amount estimation NN according to a second modification of the first embodiment.

FIG. 8 schematically shows a specific example of an input/output relationship of a substance amount estimation NN according to a second modification of the first embodiment. The substance amount estimation NN according to the second modification is a machine learning model whose parameters have been trained to output, in response to an input of a first MRS spectrum, a second MRS spectrum, and selection information, substance amount information on substances included in a measurement target site of the first MRS spectrum and the second MRS spectrum. The first MRS spectrum is an MRS spectrum acquired by MR spectroscopy with a pulse sequence not involving application of an area selection pulse. The second MRS spectrum is an MRS spectrum acquired by MR spectroscopy with a pulse sequence involving application of an area selection pulse. The selection information is information for identifying an area selected by the area selection pulse, and includes, for example, frequency information on a frequency band for selective excitation or unexcitation.

Input of the first MRS spectrum, the second MRS spectrum, and the selection information to the substance amount estimation NN facilitates separation of specific substances belong to a specific frequency band by the substance amount estimation NN, and is expected to further improve the estimation accuracy of substance amount information of specific substances.

(Third Modification)

Figure 9:
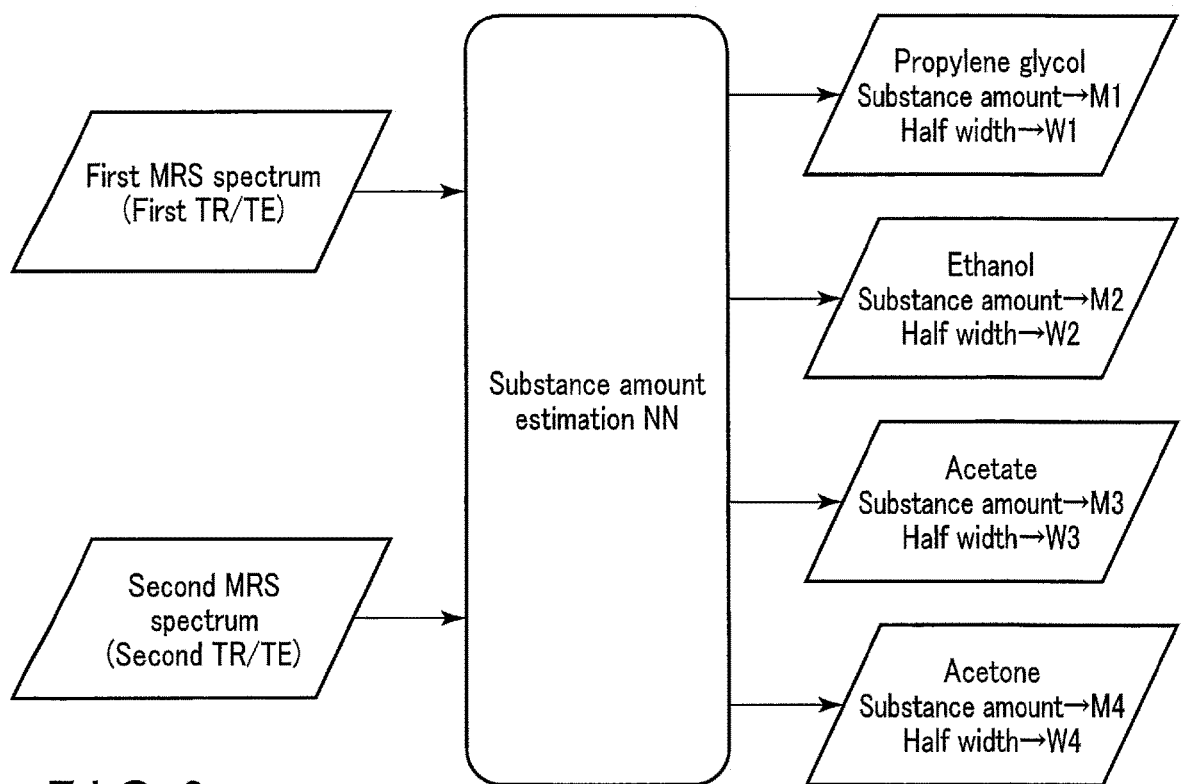
FIG. 9 schematically shows a specific example of an input/output relationship of a substance amount estimation NN according to a third modification of the first embodiment.

FIG. 9 schematically shows a specific example of an input/output relationship of a substance amount estimation NN according to a third modification of the first embodiment. The substance amount estimation NN according to the third modification is a machine learning model whose parameters have been trained to output, in response to an input of a first MRS spectrum and a second MRS spectrum, substance amount information on substances included in a measurement target site of the first MRS spectrum and the second MRS spectrum. The first MRS spectrum and the second MRS spectrum are MRS spectra with different combinations of a TR and a TE, which are items of the data acquisition condition. The TR and TE greatly contribute to the signal-to-noise ratio (SNR) of MR spectroscopy. As the TR becomes longer, the obtained signal strength value becomes closer to the true value, but the data acquisition time becomes longer. As the TE becomes shorter, the number of observed peaks increases and the MRS spectrum accuracy improves, while as the TE becomes longer, the number of observed peaks decreases and the MRS spectrum visibility improves.

The first MRS spectrum is acquired under a first TR/TE combination, and the second MRS spectrum is acquired under a second TR/TE combination. Between the first MRS spectrum and the second MRS spectrum, one of the TR and TE may be different, or both of the TR and TE may be different. Described is an example in which two types of MRS spectra are input; however, it is possible to acquire about 3 to 1000 MRS spectra while changing the TE or TR every time, and input some or all of the acquired MRS spectra to the substance amount estimation NN.

Input of the first MRS spectrum and second MRS spectrum of different TR/TE combinations to the substance amount estimation NN enhances peak recognition performance of the substance amount estimation NN, and thus is expected to improve the estimation accuracy of substance amount information.

(Fourth Modification)

Figure 10:
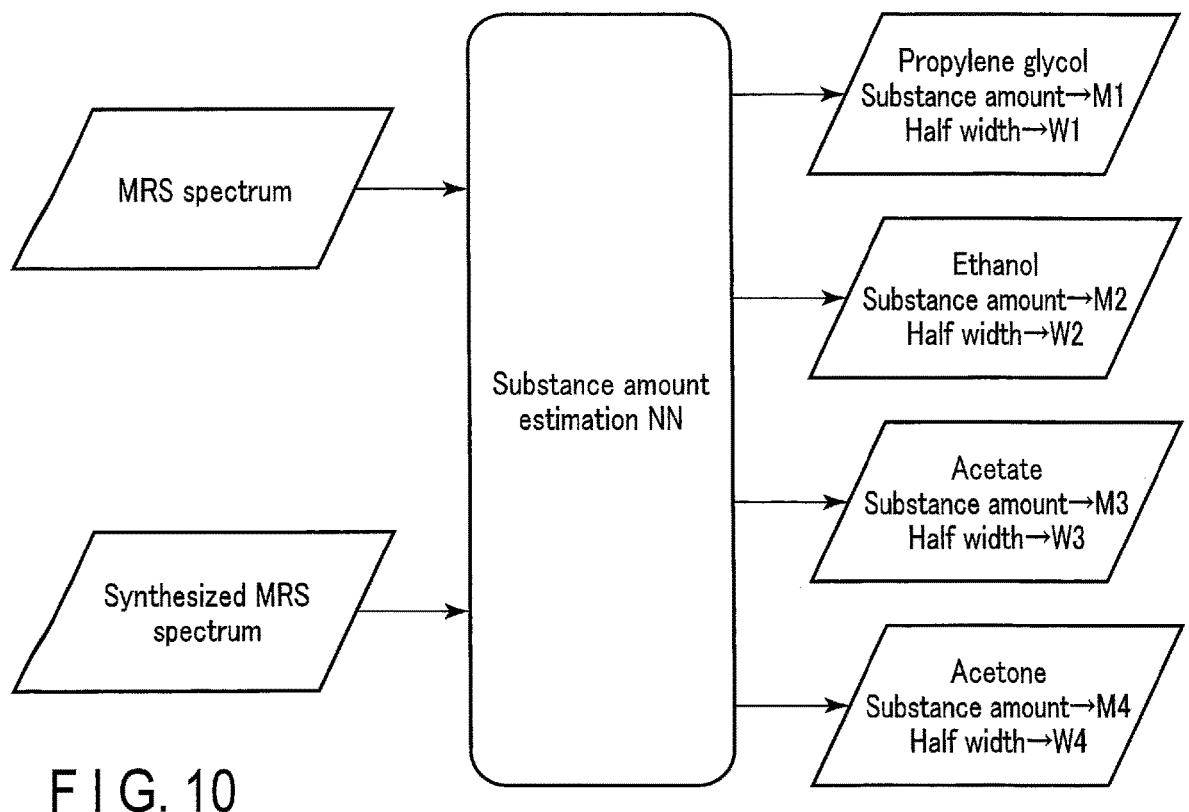
FIG. 10 schematically shows a specific example of an input/output relationship of a substance amount estimation NN according to a fourth modification of the first embodiment.

FIG. 10 schematically shows a specific example of an input/output relationship of a substance amount estimation NN according to a fourth modification of the first embodiment. The substance amount estimation NN according to the fourth modification is a machine learning model whose parameters have been trained to output, in response to an input of an MRS spectrum and a synthesized MRS spectrum, substance amount information on substances included in a measurement target site of the MRS spectrum and the synthesized MRS spectrum. The MRS spectrum is an MRS spectrum generated by the signal processing function 513 based on MRS-k data. The synthesized MRS spectrum is an MRS spectrum generated by the synthesis function 515. The synthesized MRS spectrum may be generated based on the input MRS spectrum, or not based thereon.

Input of the MRS spectrum and synthesized MRS spectrum to the substance amount estimation NN enhances discrimination performance of the peak and noise of the MRS spectrum by the substance amount estimation NN, and thus is expected to improve the estimation accuracy of substance amount information.

(Fifth Modification)

In the above-described embodiment, only the substance amount estimation NN by the substance amount output function 514 is built by a machine learning model. However, the substance amount output function 514 and the synthesis function 515 may be built by a single machine learning model (hereinafter referred to as a first integrated model).

Figure 11:
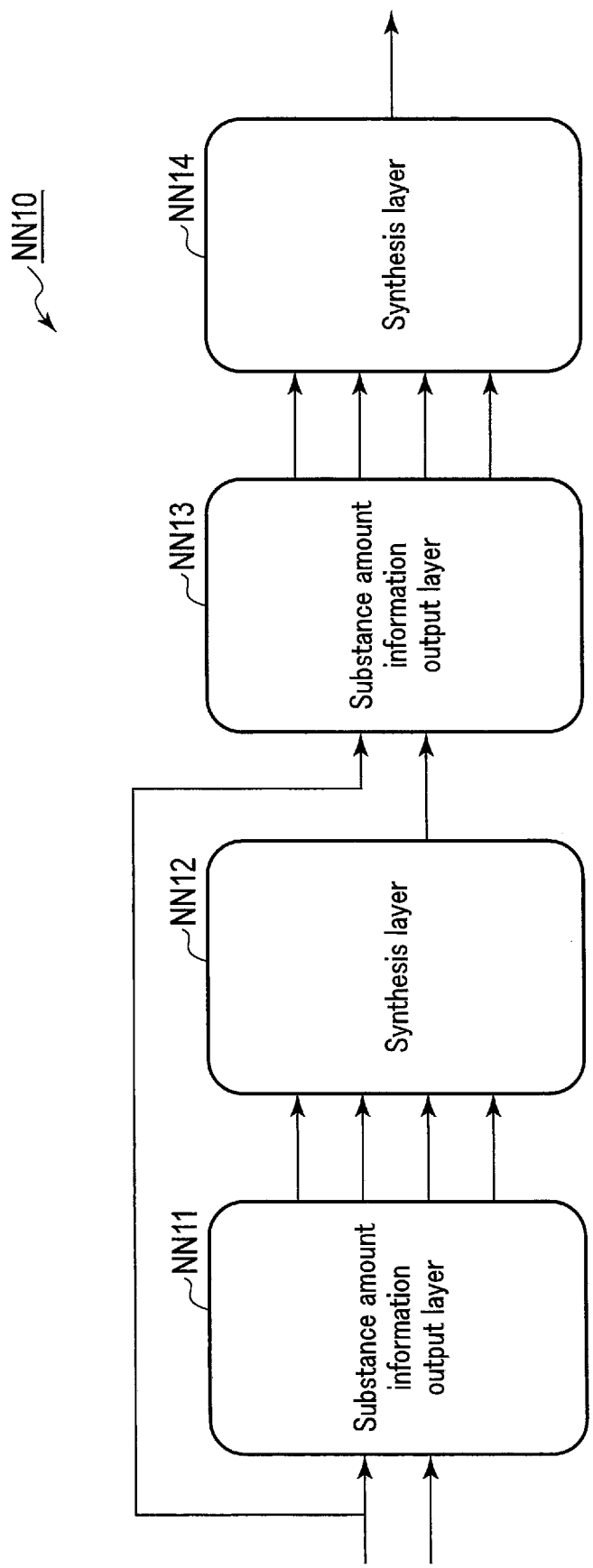
FIG. 11 shows a network configuration example of a first integrated model according to a fifth modification of the first embodiment.

FIG. 11 shows a network configuration example of a first integrated model NN10 according to a fifth modification of the first embodiment. As shown in FIG. 11, the first integrated model NN10 is a deep neural network including a substance amount information output layer NN11, a synthesis layer NN12, a substance amount information output layer NN13, and a synthesis layer NN14. The substance amount information output layer NN11 and substance amount information output layer NN13 are neural network layers corresponding to substance amount estimations NN described in some embodiments described above. The substance amount information output layer NN11 and substance amount information output layer NN13 are examples of parameter output units. The synthesis layer NN12 and synthesis layer NN14 are neural network layers that perform processing to generate a synthesized MRS spectrum based on substance amount information through the synthesis function 515. The synthesis layer NN12 and synthesis layer NN14 are examples of synthesis units.

Specifically, as shown in FIG. 11, the substance amount information output layer NN11 receives a first MRS spectrum and a second MRS spectrum as an input, and outputs substance amount information of propylene glycol, ethanol, acetate, and acetone. The synthesis layer NN12 receives the substance amount information of propylene glycol, ethanol, acetate, and acetone output from the substance amount information output layer NN11 as an input, and outputs a synthesized MRS spectrum. The substance amount information output layer NN13 receives the first MRS spectrum and the synthesized MRS spectrum output from the synthesis layer NN12 as an input, and outputs substance amount information of propylene glycol, ethanol, acetate, and acetone. The synthesis layer NN14 receives the substance amount information of propylene glycol, ethanol, acetate, and acetone output from the substance amount information output layer NN13 as an input, and outputs a synthesized MRS spectrum.

The first integrated model NN10 shown in FIG. 11 includes two unit layers each including a substance amount information output layer and a synthesis layer connected in series. However, the configuration of the first integrated model NN10 is not limited to this, and the first integrated model NN10 may include only one unit layer, or include three or more unit layers. Herein, the number of input channels of the substance amount information output layer is two; however, the number is not limited to this, and the substance amount information output layer may have one input channel or three input channels.

Figure 12:
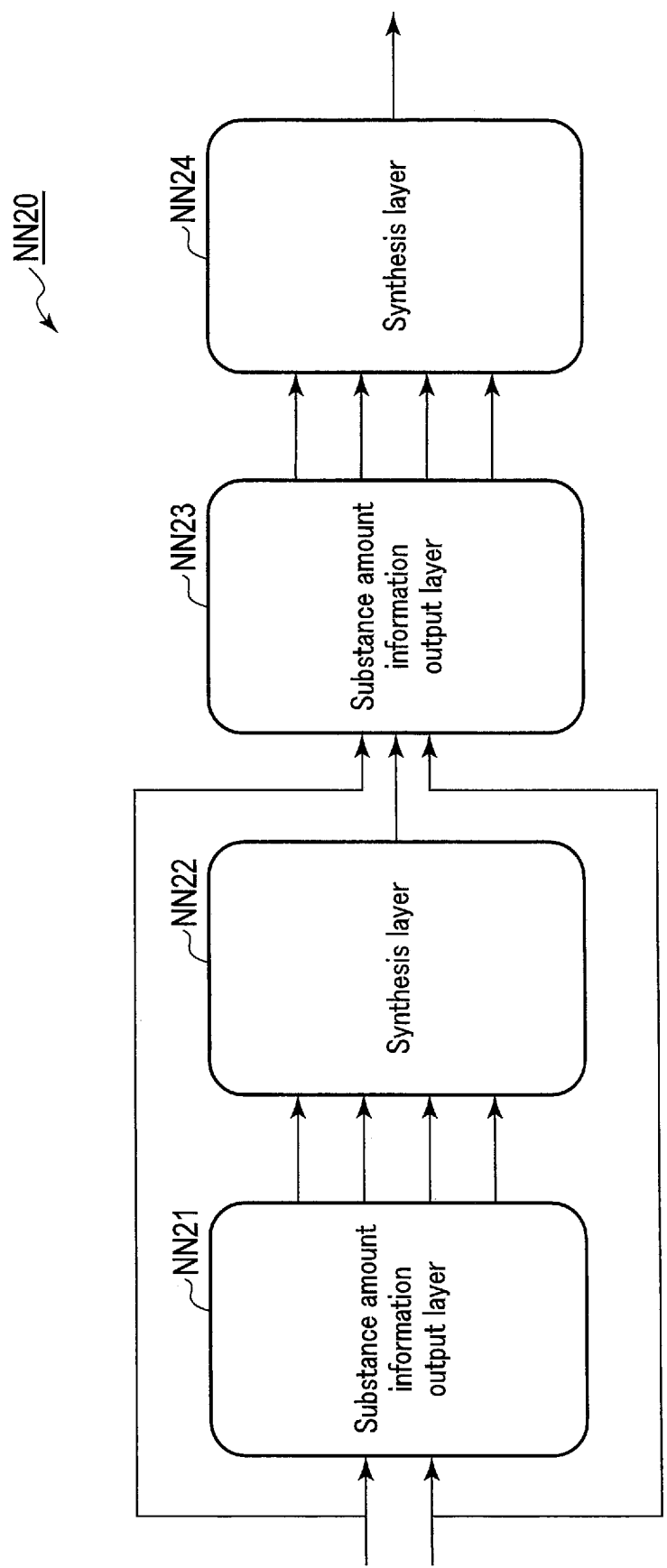
FIG. 12 shows a network configuration example of another first integrated model according to the fifth modification of the first embodiment.

FIG. 12 shows a network configuration example of another first integrated model NN20 according to the fifth modification of the first embodiment. As shown in FIG. 12, the first integrated model NN20 is a deep neural network including a substance amount information output layer NN21, a synthesis layer NN22, a substance amount information output layer NN23, and a synthesis layer NN24. The substance amount information output layer NN21 and substance amount information output layer NN23 are examples of parameter output units. The synthesis layer NN22 and synthesis layer NN24 are examples of synthesis units.

The substance amount information output layer NN21 receives a first MRS spectrum and a second MRS spectrum as an input, and outputs substance amount information of propylene glycol, ethanol, acetate, and acetone. The synthesis layer NN22 receives the substance amount information of propylene glycol, ethanol, acetate, and acetone output from the substance amount information output layer NN11 as an input, and outputs a synthesized MRS spectrum. The substance amount information output layer NN23 receives the first MRS spectrum, the second MRS spectrum, and the synthesized MRS spectrum output from the synthesis layer NN22 as an input, and outputs substance amount information of propylene glycol, ethanol, acetate, and acetone. The synthesis layer NN24 receives the substance amount information of propylene glycol, ethanol, acetate, and acetone output from the substance amount information output layer NN23 as an input, and outputs a synthesized MRS spectrum.

As described above, according to the fifth modification, the substance amount output function 514 and the synthesis function 515 can be built by a deep neural network, such as the first integrated model 10 or 20, including a plurality of unit layers (each of which is a combination of a substance amount information output layer and a synthesis layer) connected in series. Since the process of generating a synthesized MRS spectrum from a plurality of MRS spectra can be built by a deep neural network, the synthesized MRS spectrum can be generated at high speed with high accuracy.

As in the above-described embodiment, the MR signal processing apparatus 50 according to the first embodiment includes the processing circuitry 51A. The processing circuitry 51A inputs a plurality of MRS signals acquired by MR spectroscopy on the same target to a trained model, and outputs substance amount information on a plurality of substances for MRS reconstruction. The processing circuitry 51A generates an MRS spectrum relating to the measurement target site by fitting based on the substance amount information and artificial spectra of the substances.

With the above configuration, substance amount information is obtained based on a plurality of MRS signals; therefore, the accuracy of substance amount information can be improved. In addition, an MRS spectrum is generated based on such substance amount information; therefore, the accuracy of the MRS spectrum can be improved.

Second Embodiment

Next, an MR signal processing apparatus according to a second embodiment will be described. In the following explanation, structural elements having substantially the same functions as in the first embodiment will be denoted by the same reference symbols, and a repeat description will be given only where necessary.

Figure 13:
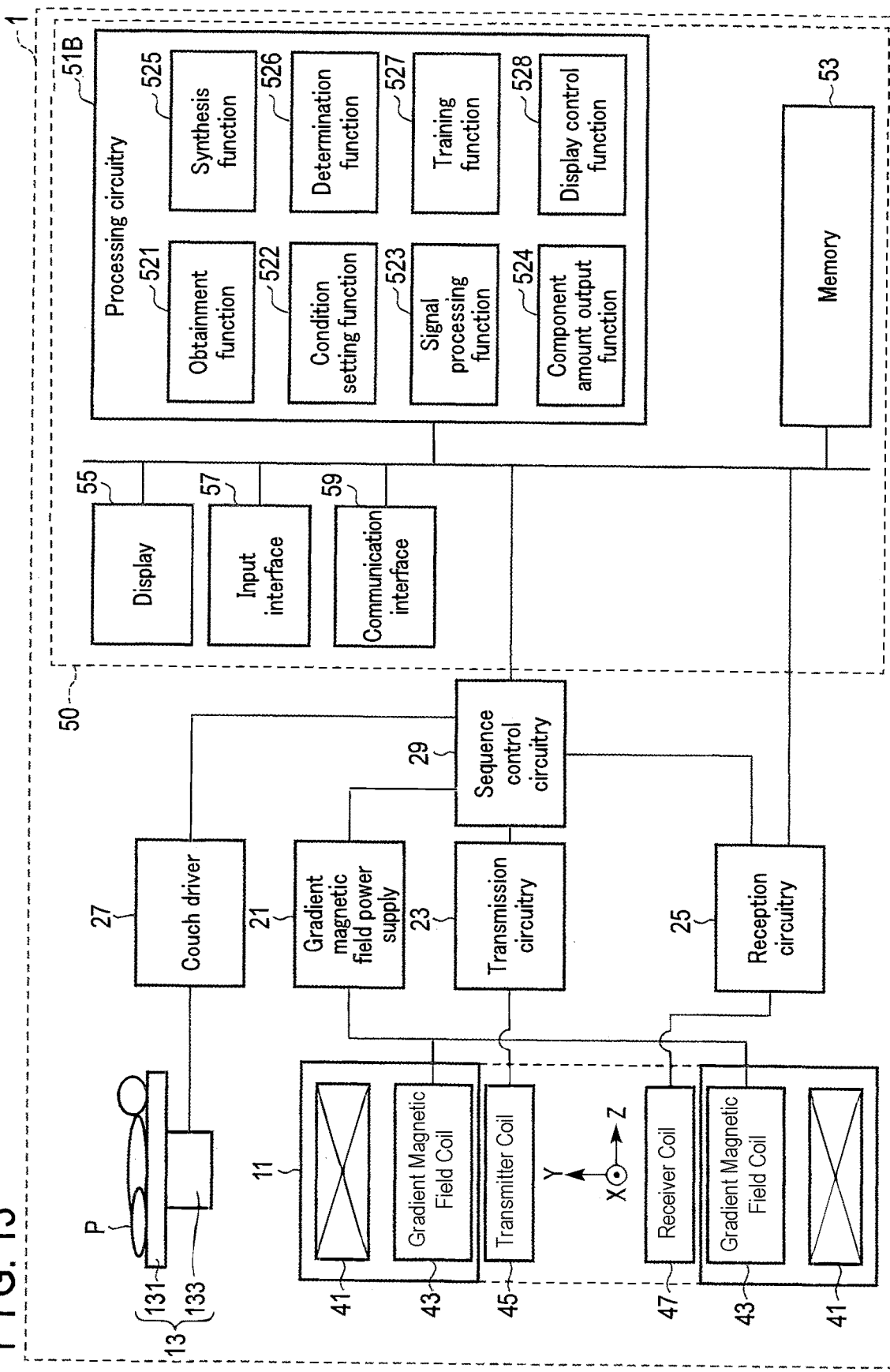
FIG. 13 shows a configuration example of a magnetic resonance imaging apparatus according to a second embodiment.

FIG. 13 shows a configuration example of a magnetic resonance imaging apparatus 1 according to the second embodiment. As shown in FIG. 13, the magnetic resonance imaging apparatus 1 includes a gantry 11, a couch 13, a gradient magnetic field power supply 21, transmission circuitry 23, reception circuitry 25, a couch driver 27, sequence control circuitry 29, and an MR signal processing apparatus (host computer) 50. The MR signal processing apparatus 50 is a computer including processing circuitry 51B, a memory 53, a display 55, an input interface 57, and a communication interface 59.

The processing circuitry 51B includes, as a hardware resource, a processor such as a CPU. The processing circuitry 51B functions as the nerve center of the magnetic resonance imaging apparatus 1. For example, through execution of various programs, the processing circuitry 51B implements an obtainment function 521, a condition setting function 522, a signal processing function 523, a component amount output function 524, a synthesis function 525, a determination function 526, a training function 527, and a display control function 528.

The obtainment function 521, the condition setting function 522, and the signal processing function 523 are substantially the same as the obtainment function 511, the condition setting function 512, and the signal processing function 513 according to the first embodiment.

Through the component amount output function 524, the processing circuitry 51B inputs a plurality of MRS signals acquired by MR spectroscopy in relation to the same subject P to a trained model, and outputs a plurality of parameters for MRS reconstruction. The parameters according to the second embodiment are spectrum parameters for fitting based on a plurality of spectrum models corresponding respectively to the parameters. The spectrum models are a plurality of base spectra corresponding respectively to a plurality of bases relating to a measurement target site. The bases are obtained by performing data conversion on an MRS spectrum relating to the measurement target site. The spectrum parameters include component amount information of a plurality of bases. The component amount information means information on the component amount of a base. Hereinafter, the parameters relating to the second embodiment will be referred to as base component amount information. The bases include, for example, a first base based on an MRS spectrum relating to a healthy person (hereinafter referred to as a healthy person base) and a second base based on an MRS spectrum relating to an unhealthy person (hereinafter referred to as an unhealthy person base). The trained model is a machine learning model trained to output component amount information in response to an input of a plurality of MRS signals. As the machine learning model, a neural network or a deep neural network is used. Hereinafter, the trained model according to the second embodiment will be referred to as a base component amount estimation NN.

Through the synthesis function 525, the processing circuitry 51B generates a synthesized MRS signal relating to the subject P with reduced noise in comparison with a plurality of MRS signals, based on the base component amount information output by the component amount output function 524.

Through the determination function 526, the processing circuitry 51B determines whether the subject P is normal or abnormal based on base component amount information on a healthy person base and base component amount information on an unhealthy person base.

Through the training function 527, the processing circuitry 51B generates, by machine learning based on training data, abase component amount estimation NN used by the component amount output function 524.

Through the display control function 528, the processing circuitry 51B causes the display 55 to display various types of information. For example, the processing circuitry 51B causes the display 55 to display an MRS signal, base component amount information, a synthesized MRS signal, a determination result on whether or not the subject P is normal or abnormal, a screen for setting a data acquisition condition, and the like.

An operation example of the MR signal processing apparatus 50 according to the second embodiment will be described below.

As described above, through the component amount output function 524, the processing circuitry 51B inputs a plurality of MRS signals to a base component amount estimation NN, and outputs base component amount information on bases.

FIG. 14 schematically shows an input/output relationship of a trained model (base component amount estimation NN) according to the second embodiment. As shown in FIG. 14, the base component amount estimation NN is a machine learning model whose parameters have been trained to output, in response to an input of a first MRS signal and a second MRS signal, base component amount information on bases. The first MRS signal and the second MRS signal are MRS signals relating to the same measurement target site of the subject P. The data acquisition condition of the first MRS signal may be the same as or different from that of the second MRS signal. The MRS signal input to the base component amount estimation NN may be MRS-k data or an MRS spectrum. The number of MRS signals input to the base component amount estimation NN is two in FIG. 14; however, this is an example, and the number may be any number larger than 2.

The base component amount information is information on the component amount of each base when an MRS spectrum representing a measurement target site of a first MRS signal and a second MRS signal is mathematically converted into a plurality of bases. The bases can be obtained by performing data compression on the MRS spectrum representing the measurement target site. As the data compression method, for example low-rank approximation, principal component analysis, singular value decomposition, autoencoder, or the like may be used. The MRS spectrum representing the measurement target site may be an MRS spectrum relating to a measurement target site of the subject P, which is measured in advance, or an MRS spectrum relating to the same measurement target site of a person different from the subject P. The obtained bases are used for the base component amount estimation NN. Alternatively, it is possible to perform data compression on a plurality of MRS spectra relating to the same measurement target site to convert the MRS spectra into a plurality of bases, and select bases used for the base component amount estimation NN from the bases. For example, it is possible to divide a plurality of bases into a plurality of clusters by clustering or the like, and select a base used for the base component amount estimation NN from each cluster.

The base component amount estimation NN is generated by the training function 527 of the processing circuitry 51B. The processing circuitry 51B trains a machine learning model based on a plurality of training samples to generate a base component amount estimation NN. The training sample is a combination of first and second MRS signals, which are input data, and base component amount information (hereinafter referred to as truth base component amount information), which is truth data. The first and second MRS signals, which are input data, are generated by the magnetic resonance imaging apparatus 1 or another magnetic resonance imaging apparatus. The truth base component amount information can be obtained as component amounts of a plurality of bases when MRS spectra corresponding to the input data are converted into a plurality of bases obtained in advance. The processing circuitry 51B inputs the first and second MRS signals to a machine learning model to perform forward propagation, and outputs base component amount information (hereinafter referred to as estimated base component amount information). Next, the processing circuitry 51B inputs a difference (error) between the estimated base component amount information and the truth base component amount information to the machine learning model to perform backward propagation, and calculates a gradient vector, which is a differential function of an error function which is a function of a parameter. The processing circuitry 51B then updates parameters of the machine learning model based on the gradient vector. The forward propagation, backward propagation, and parameter updating are repeated while changing training samples, and parameters that minimize the error function are determined in accordance with a predetermined optimization method. The base component amount estimation NN is thereby generated.

Next, signal processing by the MR signal processing apparatus 50 according to the second embodiment will be described with reference to FIG. 15. In the following explanation, the MRS signal input to the base component amount estimation NN is assumed to be an MRS spectrum.

Figure 15:
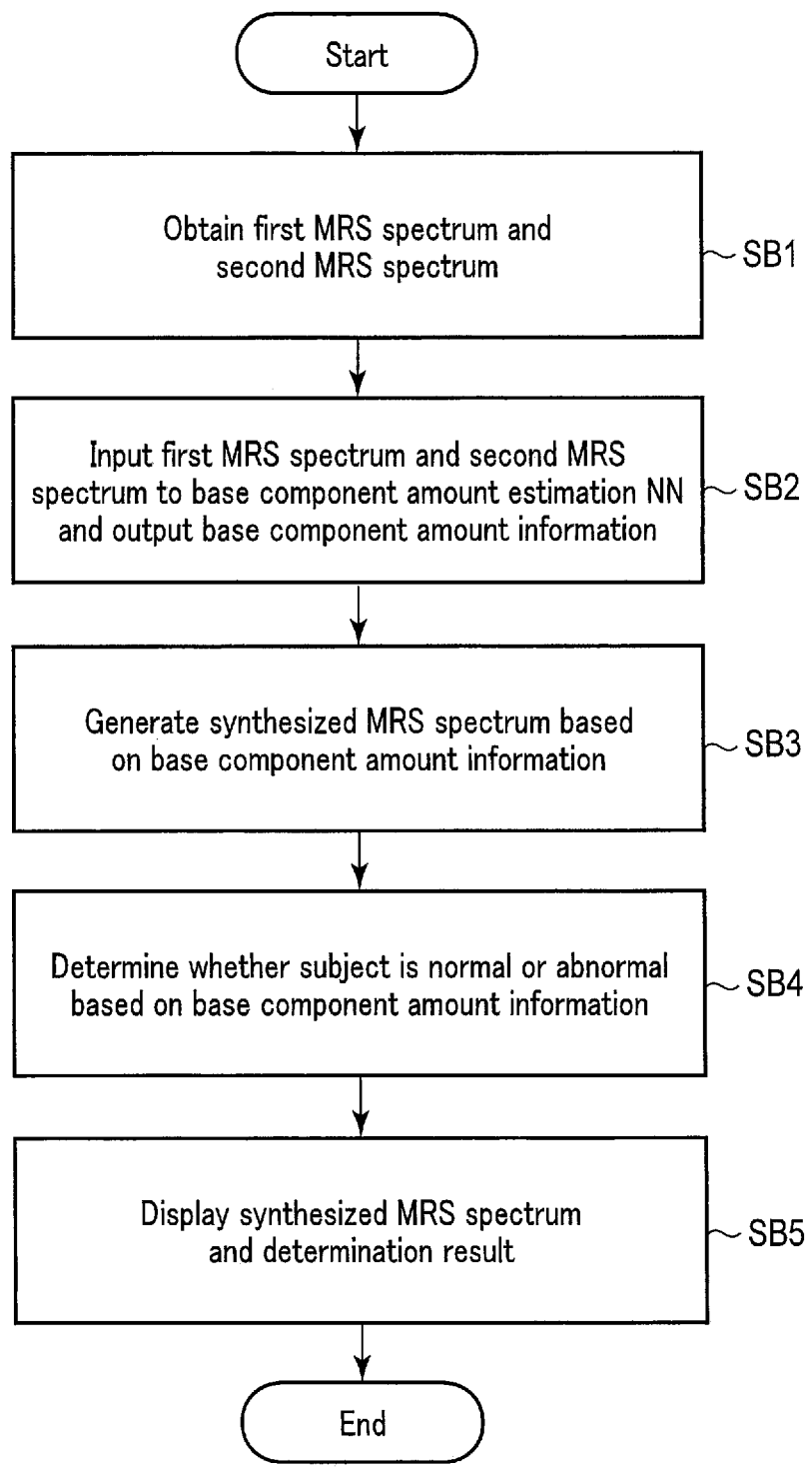
FIG. 15 shows an example of the flow of signal processing by an MR signal processing apparatus according to the second embodiment.

FIG. 15 shows an example of the flow of the signal processing by the MR signal processing apparatus 50 according to the second embodiment.

As shown in FIG. 15, the processing circuitry 51B obtains a first MRS spectrum and a second MRS spectrum through implementation of the obtainment function 521 (step SB1). Step SB1 is performed in a manner similar to step SA1.

After step SB1, the processing circuitry 51B inputs the first MRS spectrum and the second MRS spectrum obtained in step SB1 to the base component amount estimation NN and outputs base component amount information, through implementation of the component amount output function 524 (step SB2).

FIG. 16 schematically shows an input/output relationship of the base component amount estimation NN. As shown in FIG. 16, the base component amount estimation NN is a machine learning model whose parameters have been trained to output base component amount information in response to an input of a first MRS signal and a second MRS signal. The deterioration process of the first MRS spectrum and the second MRS spectrum can be incorporated in the bases by converting the first MRS spectrum and the second MRS spectrum into base component amount information.

The base component amount information includes component amount information and reliability information on each base. FIG. 16 shows, as specific examples, a component amount C1 and a half width W1 of a healthy person base #1, a component amount C2 and a half width W2 of a healthy person base #2, a component amount C3 and a half width W3 of an unhealthy person base #3, and a component amount C4 and a half width W4 of an unhealthy person base #4. The healthy person bases #1 and #2 are bases obtained by performing data compression on an MRS spectrum of a healthy person. A healthy person is a person evaluated as "normal" regarding a measurement target site of the first MRS spectrum and the second MRS spectrum. The unhealthy person bases #3 and #4 are bases obtained by performing data compression on an MRS spectrum of an unhealthy person. An unhealthy person is a person evaluated as "abnormal" regarding a measurement target site of the first MRS spectrum and the second MRS spectrum. When there are a plurality of peaks for one base, a component amount and half width are output for each peak. The peak may be identified based on the frequency difference.

The processing circuitry 51B inputs the first MRS spectrum and second MRS spectrum obtained in step SB1 to the base component amount estimation NN, and outputs a component amount C1 and half width W1 of the healthy person base #1, a component amount C2 and half width W2 of the healthy person base #2, a component amount C3 and half width W3 of the unhealthy person base #3, and a component amount C4 and half width W4 of the unhealthy person base #4. According to the second embodiment, base component amount information can be estimated from a plurality of MRS spectra relating to the same measurement target site, which enables accurate estimation of base component amount information of bases relating to the measurement target site.

After step SB2, the processing circuitry 51B generates a synthesized MRS spectrum based on the base component amount information output in step SB2, through implementation of the synthesis function 515 (step SB3). Step SB3 is performed in a manner similar to step SA3. Namely, a plurality of base spectra corresponding to a plurality of bases are stored in advance. In step SB3, the processing circuitry 51B generates a plurality of corrected base spectra by applying the component amounts and half widths of the bases to the base spectra, and generates a synthesized MRS spectrum by fitting based on the generated corrected base spectra. Since the synthesized MRS spectrum is generated by fitting based on base spectra, noise caused by instability of data acquisition by MR spectroscopy, a body movement of the subject P, and a static magnetic field disturbance is reduced in comparison with the input first MRS spectrum and second MRS spectrum. In other words, the base component amount estimation by the base component amount estimation NN (step SB2) and the generation of a synthesized MRS spectrum based on base component amount information (step SB3) can be regarded as equivalent to denoising processing of the first MRS spectrum and second MRS spectrum.

After step SB3, the processing circuitry 51B determines whether the subject P is normal or abnormal based on the base component amount information output in step SB2, through implementation of the determination function 526 (step SB4).

Figure 18:
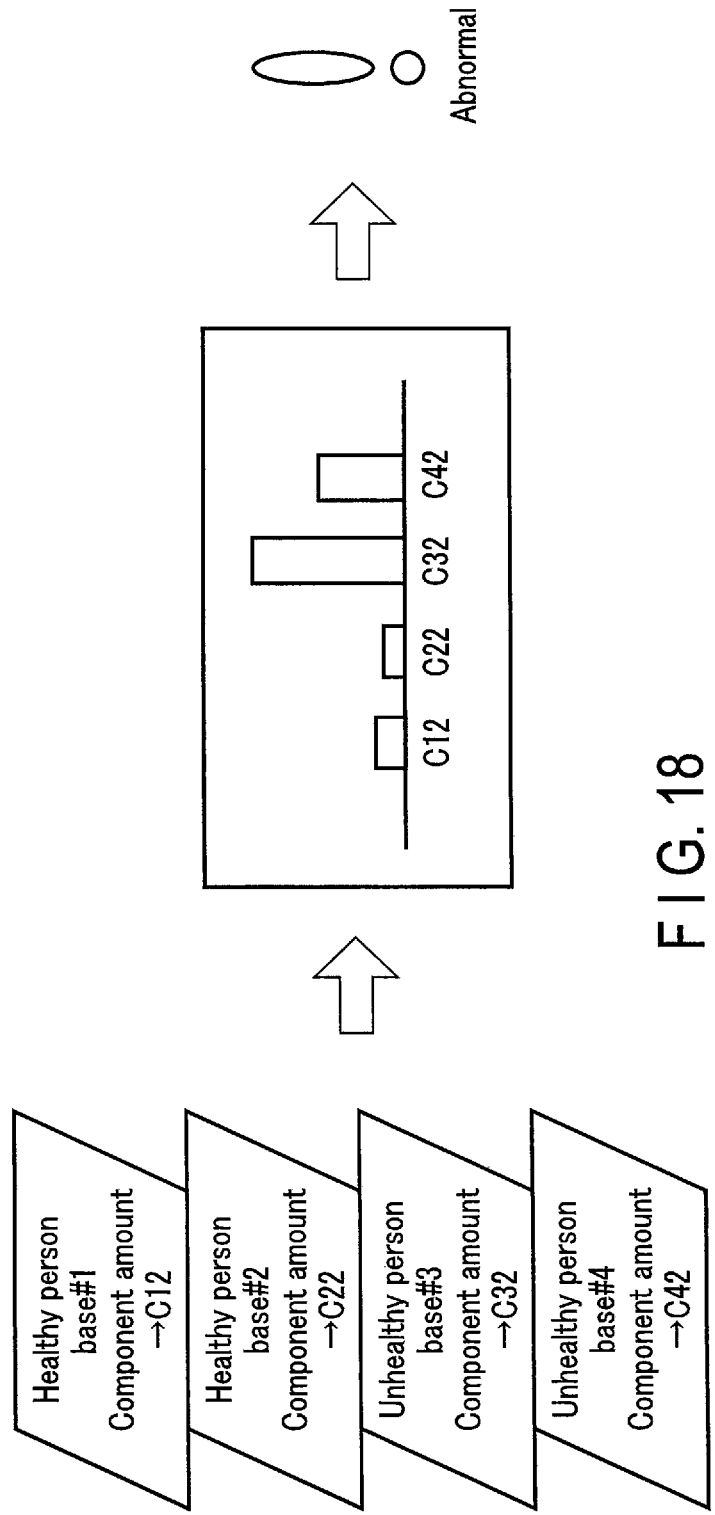
FIG. 18 schematically shows normality or abnormality determination processing (determination result=abnormal) based on base component amount information, which is performed in step SB4 in FIG. 15.

FIGS. 17 and 18 schematically show normality or abnormality determination processing based on base component amount information. FIG. 17 relates to normality determination, whereas FIG. 18 relates to abnormality determination. As shown in FIGS. 17 and 18, it is assumed that a component amount C11, C12 of the healthy person base #1, a component amount C21, C22 of the healthy person base #2, a component amount C31, C32 of the unhealthy person base #3, and a component amount C41, C42 of the unhealthy person base #4 are output as base component amount information in step SB2. The processing circuitry 51B determines whether or not the subject P is normal or abnormal in accordance with the ratio between the component amounts C11, C12 and C21, C22 of the healthy person bases #1 and #2 and the component amounts C31, C32 and C41, C42 of the unhealthy person bases #3 and #4. The processing circuitry 51B determines that the subject P is normal when the component amounts C11 and C21 of the healthy person bases #1 and #2 are larger than the component amounts C31 and C41 of the unhealthy person bases #3 and #4, as shown in FIG. 17. In contrast, the processing circuitry 51B determines that the subject P is abnormal when the component amounts C32 and C42 of the unhealthy person bases #3 and #4 are larger than the component amounts C12 and C22 of the healthy person bases #1 and #2, as shown in FIG. 18.

After step SB4, the processing circuitry 51B causes the synthesized MRS spectrum generated in step SB3 and the determination result obtained in step SB4 to be displayed, through implementation of the display control function 528 (step SB5). The synthesized MRS spectrum and determination result are displayed on the display 55 in a predetermined layout.

Figure 19:
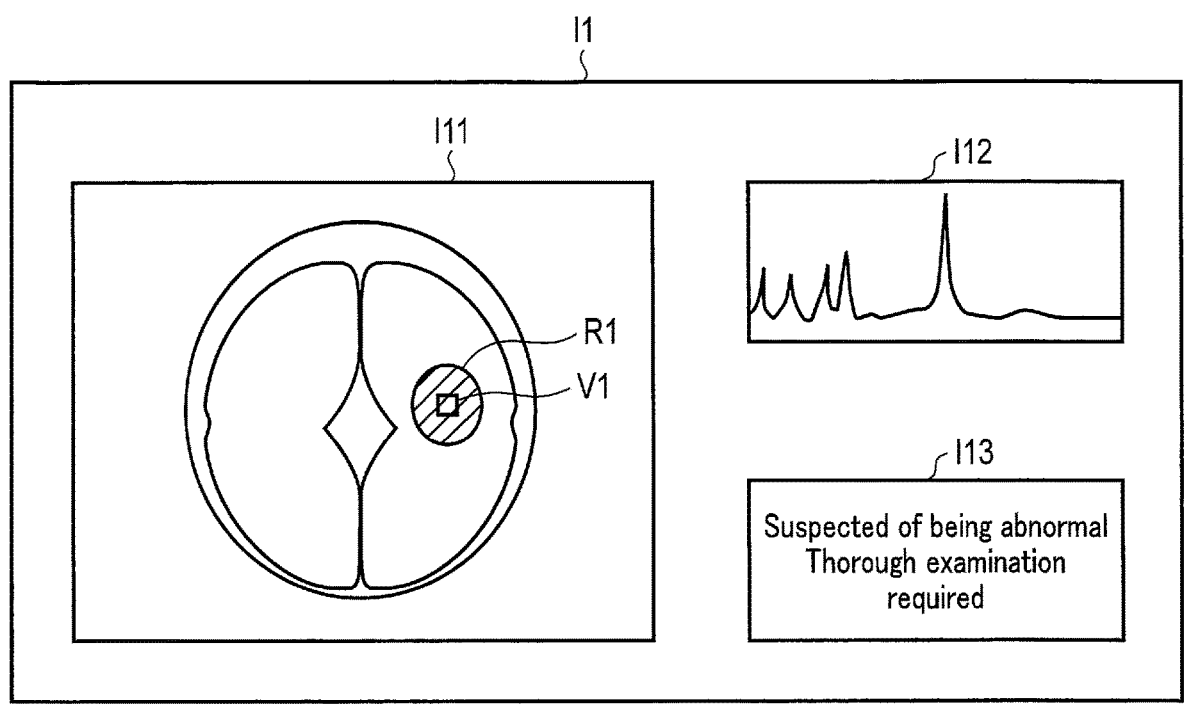
FIG. 19 shows an example of a display screen of a synthesized MRS spectrum and a determination result, which is displayed in step SB5 in FIG. 15.

FIG. 19 shows an example of a display screen I1 of a synthesized MRS spectrum 112 and a determination result I13. As shown in FIG. 19, a voxel-of-interest setting image I11 is displayed on the display screen I1. The voxel-of-interest setting image I11 is an MR image in which a voxel of interest V1 of the first MRS spectrum and the second MRS spectrum has been set. For example, a brain tumor region R1 is rendered in the voxel-of-interest setting image I11, and a voxel of interest V1 is rendered in the brain tumor region R1. When the voxels of interest of the first MRS spectrum and the second MRS spectrum are set to different positions, they are rendered at different positions. The voxel-of-interest setting image I11 may be an MR image acquired by any imaging method.

As shown in FIG. 19, the display screen I1 shows a synthesized MRS spectrum I12 generated in step SB3. This enables the user to observe the synthesized MRS spectrum, which is a denoised MRS spectrum.

As shown in FIG. 19, a determination result I13 of normality or abnormality, which is obtained in step SB4, is displayed on the display screen I1. For example, when it is determined that the subject P is abnormal in step SB4, a determination result such as "suspected of being abnormal" is displayed. Information accompanying the determination result, such as "thorough examination required", may also be displayed.

This is the end of the signal processing by the MR signal processing apparatus 50 according to the second embodiment.

The second embodiment can be modified in various manners. For example, according to FIG. 15, the normality or abnormality determination processing is performed after the generation processing of a synthesized MRS spectrum. However, the generation processing of a synthesized MRS spectrum may be performed after the normality or abnormality determination processing.

In the above-described embodiment, a normality or abnormality determination is performed. However, the presence or absence in the subject P of a specific disease, such as a brain tumor, leukoencephalopathy, a stroke, dementia, or an injury, may be determined. In this case, for each disease, a base vector (hereinafter referred to as a disease base vector) unique to the lesion is prepared as an unhealthy person base. The disease base vector can be obtained by performing data compression on an MRS spectrum of an unhealthy person diagnosed with the disease. The processing circuitry 51B may compare the base component amount of the disease base vector with a threshold, determine the presence in the subject P of the disease when the base component amount exceeds the threshold, and determine the absence in the subject P of the disease when the base component amount does not exceed the threshold.

As in the above-described embodiment, the MR signal processing apparatus 50 according to the second embodiment includes the processing circuitry 51B. The processing circuitry 51B inputs a plurality of MRS signals acquired by MR spectroscopy on the same target to a trained model, and outputs base component quantity information on a plurality of bases for MRS reconstruction. The processing circuitry 51B generates an MRS spectrum relating to the measurement target site by fitting based on the base component amount information and base spectra of the bases.

With the above configuration, base component amount information is obtained based on a plurality of MRS signals; therefore, the accuracy of base component amount information can be improved. In addition, an MRS spectrum is generated based on such base component amount information; therefore, the accuracy of the MRS spectrum can be improved.

Third Embodiment

Next, an MR signal processing apparatus according to a third embodiment will be described. In the following explanation, structural elements having substantially the same functions as in the first and second embodiments will be denoted by the same reference symbols, and a repeat description will be given only where necessary.

Figure 20:
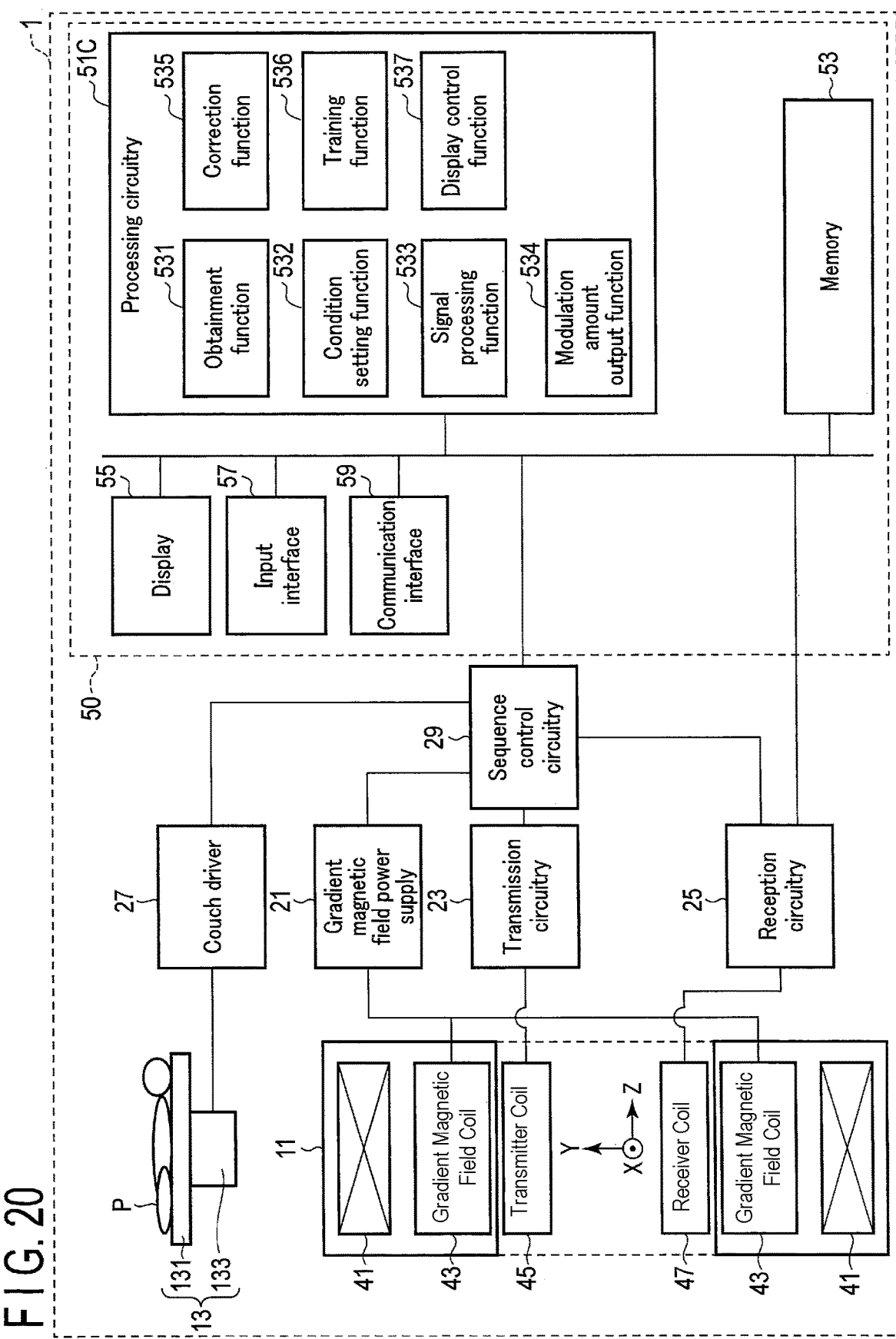
FIG. 20 shows a configuration example of a magnetic resonance imaging apparatus according to a third embodiment.

FIG. 20 shows a configuration example of a magnetic resonance imaging apparatus 1 according to the third embodiment. As shown in FIG. 20, the magnetic resonance imaging apparatus 1 according to the third embodiment includes a gantry 11, a couch 13, a gradient magnetic field power supply 21, transmission circuitry 23, reception circuitry 25, a couch driver 27, sequence control circuitry 29, and an MR signal processing apparatus (host computer) 50. The MR signal processing apparatus 50 is a computer including processing circuitry 51C, a memory 53, a display 55, an input interface 57, and a communication interface 59.

The processing circuitry 51C includes, as a hardware resource, a processor such as a CPU. The processing circuitry 51C functions as the nerve center of the magnetic resonance imaging apparatus 1. For example, through execution of various programs, the processing circuitry 51C implements an obtainment function 531, a condition setting function 532, a signal processing function 533, a modulation amount output function 534, a correction function 535, a training function 536, and a display control function 537.

The obtainment function 531, the condition setting function 532, and the signal processing function 533 are substantially the same as the obtainment function 511, the condition setting function 512, and the signal processing function 513 according to the first embodiment.

Through the modulation amount output function 534, the processing circuitry 51C inputs a plurality of MRS signals obtained by MR spectroscopy on the subject P to a trained model, and outputs a plurality of parameters for MRS reconstruction. The parameters according to the third embodiment include information on k-space modulation caused by magnetic field modulation between a plurality of MRS signals. Hereinafter, the parameters according to the third embodiment will be referred to as k-space modulation amount information. The trained model is a machine learning model trained to output k-space modulation amount information in response to an input of a plurality of MRS signals. As the machine learning model, a neural network or a deep neural network is used. Hereinafter, the trained model according to the third embodiment will be referred to as a modulation amount estimation NN.

Through the correction function 535, the processing circuitry 51C corrects an MRS signal based on the k-space modulation amount information output by the modulation amount output function 534. Hereinafter, the MRS signal after the correction will be referred to as a corrected MRS signal.

Through the training function 536, the processing circuitry SiC generates, by machine learning based on training data, a modulation amount estimation NN used by the modulation amount output function 534.

Through the display control function 537, the processing circuitry 51C causes the display 55 to display various types of information. For example, the processing circuitry 51C causes the display 55 to display an MRS signal, modulation amount information, a corrected MRS signal, a screen for setting a data acquisition condition, and the like.

An operation example of the MR signal processing apparatus 50 according to the third embodiment will be described in detail below.

As described above, through the modulation amount output function 534, the processing circuitry 51C inputs a plurality of MRS signals to a modulation amount estimation NN, and outputs k-space modulation amount information on k-space modulation caused by magnetic field modulation between data acquisitions of the MRS signals.

FIG. 21 schematically shows an input/output relationship of a trained model (modulation amount estimation NN) according to the third embodiment. As shown in FIG. 21, the modulation amount estimation NN is a machine learning model whose parameters have been trained to output, in response to an input of a first MRS signal and a second MRS signal, k-space modulation amount information on k-space modulation caused by magnetic field modulation between data acquisitions of the first MRS signal and the second MRS signal. The first MRS signal and the second MRS signal are MRS signals acquired from the same subject P. The data acquisition condition of the first MRS signal may be the same as or different from that of the second MRS signal. The MRS signal input to the modulation amount estimation NN may be MRS-k data or an MRS spectrum. The number of MRS signals input to the modulation amount estimation NN is two in FIG. 21; however, this is an example, and the number may be any number larger than 2.

The k-space modulation amount information is information on the modulation amount of k-space modulation caused by magnetic field modulation between data acquisitions of the first MRS signal and the second MRS signal. There are various causes for magnetic field modulation, such as static magnetic field modulation, gradient magnetic field modulation, and noise. The causes for static magnetic field modulation include uniformity of the static magnetic field and an offset (f0 shift) of the static magnetic field. The causes for gradient magnetic field modulation include a transient response (phase shift) of the gradient magnetic field. The magnetic field modulation appears, in the k-space, as a shift of actual MRS-k data from ideal MRS-k data without magnetic field modulation. When magnetic field modulation is caused between data acquisitions of the first MRS signal and the second MRS signal, a shift is caused between first MRS-k data and second MRS-k data in the k-space.

The modulation amount estimation NN is generated by the training function 536 of the processing circuitry 51C. The processing circuitry 51C trains a machine learning model based on a plurality of training samples to generate a modulation amount estimation NN. The training sample is a combination of first and second MRS signals, which are input data, and k-space modulation amount information (hereinafter referred to as truth k-space modulation amount information), which is truth data. The first and second MRS signals, which are input data, are generated by the magnetic resonance imaging apparatus 1 or another magnetic resonance imaging apparatus. The truth k-space modulation amount information is obtained by measuring the shift in the k-space of the second MRS-k data from the first MRS-k data. The processing circuitry 51C inputs the first and second MRS signals to a machine learning model to perform forward propagation, and outputs k-space modulation amount information (hereinafter referred to as estimated k-space modulation amount information). Next, the processing circuitry 51C inputs a difference (error) between the estimated k-space modulation amount information and the truth k-space modulation amount information to the machine learning model to perform backward propagation, and calculates a gradient vector, which is a differential coefficient of an error function which is a function of a parameter. The processing circuitry 51C then updates parameters of the machine learning model based on the gradient vector. The forward propagation, backward propagation, and parameter updating are repeated while changing training samples, and parameters that minimize the error function are determined in accordance with a predetermined optimization method. The modulation amount estimation NN is thereby generated.

Next, signal processing by the MR signal processing apparatus 50 according to the third embodiment will be described with reference to FIG. 22. In the following explanation, the MRS signal input to the modulation amount estimation NN is assumed to be MRS-k data.

Figure 22:
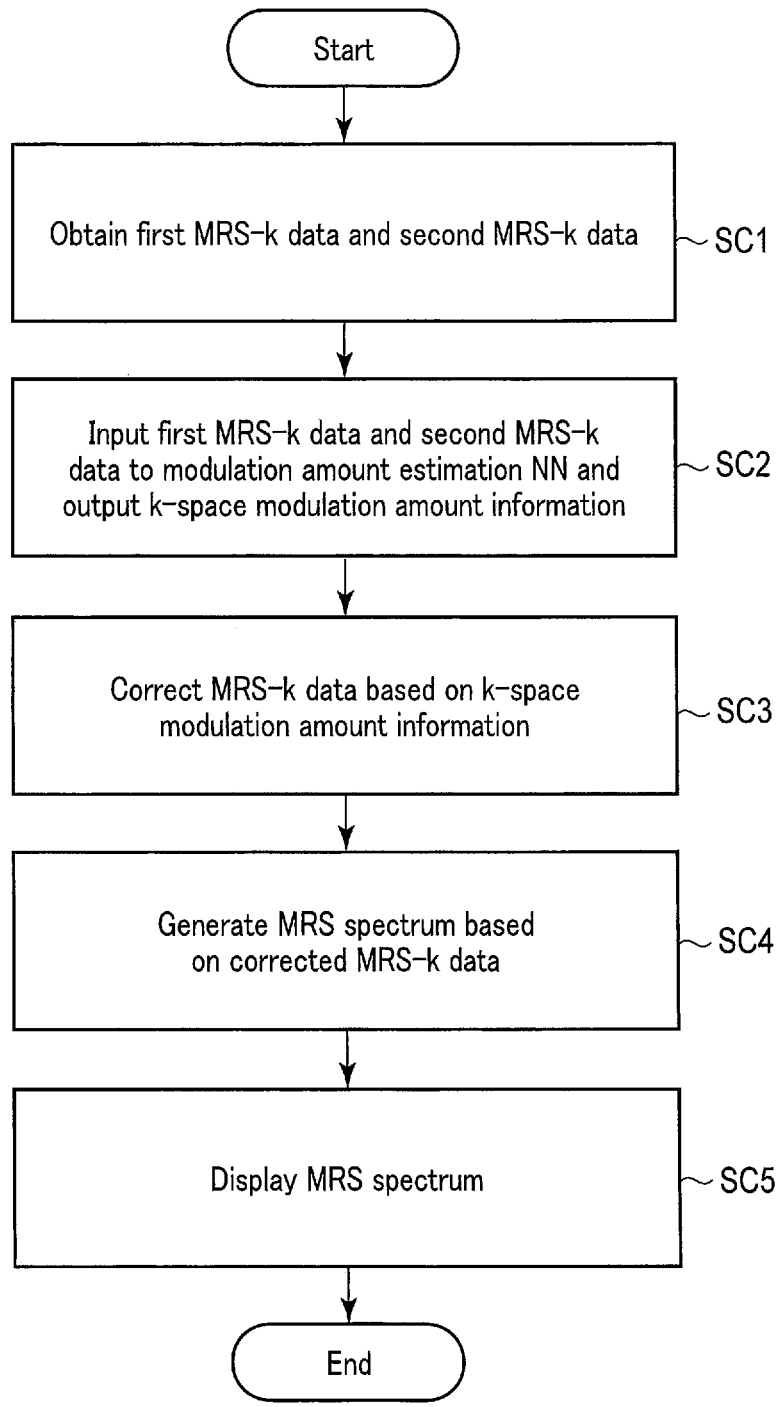
FIG. 22 shows an example of the flow of signal processing by an MR signal processing apparatus according to the third embodiment.

FIG. 22 shows an example of the flow of the signal processing by the MR signal processing apparatus 50 according to the third embodiment.

As shown in FIG. 22, the processing circuitry 51C obtains first MRS-k data and second MRS-k data through implementation of the obtainment function 531 (step SC1). The first MRS-k data and the second MRS-k data are assumed to be, for example, MRS-k data relating to the same measurement target site, which are collected by a single voxel method under the same data acquisition condition. The processing circuitry 51C selectively obtains, as the first MRS-k data and the second MRS-k data, any two items of MRS-k data from the MRS-k data for the number of excitations before addition processing. The two items of MRS-k data may be manually selected in accordance with an instruction by the user through the input interface 57 or automatically selected in accordance with a predetermined algorithm.

After step SC1, the processing circuitry 51C inputs the first MRS-k data and the second MRS-k data obtained in step SC1 to the modulation amount estimation NN and outputs k-space modulation amount information, through implementation of the modulation amount output function 534 (step SC2).

FIG. 23 schematically shows a specific example of the input/output relationship of the modulation amount estimation NN. As shown in FIG. 23, the modulation amount estimation NN is a machine learning model whose parameters have been trained to output, in response to an input of first MRS-k data and second MRS-k data, k-space modulation amount information between data acquisitions of the first MRS-k data and the second MRS-k data. As the k-space modulation amount information, an F0 shift and a phase shift are shown as examples. k-space modulation amount information on the F0 shift is a shift amount of MRS-k data in the k-space caused by static magnetic field modulation, and k-space modulation amount information on the phase shift is a shift amount of MRS-k data in the k-space caused by gradient magnetic field modulation. The k-space modulation amount information may be a numerical value indicating a shift amount of k-space modulation, or a parameter, such as a time constant, a gain, or a time origin, of an impulse response representing k-space modulation.

The processing circuitry 51C inputs the first MRS-k data and the second MRS-k data obtained in step SC1 to the modulation amount estimation NN and outputs k-space modulation amount information between data acquisitions of the first MRS-k data and the second MRS-k data. According to the third embodiment, k-space modulation information at the time of data acquisition of MRS-k data can be estimated. Since k-space modulation amount information can be estimated from a plurality of items of MRS-k data, the k-space modulation amount information can be estimated with high accuracy.

After step SC2, the processing circuitry 51C corrects MRS-k data based on the k-space modulation amount information output in step SC2, through implementation of the correction function 535 (step SC3). The MRS-k data after the correction will be called corrected MRS-k data.

After step SC3, the processing circuitry 51C generates an MRS spectrum based on the corrected MRS-k data generated in step SC3, through implementation of the signal processing function 533 (step SC4).

FIG. 24 schematically shows correction processing and spectrum generation processing in steps SC3 and SC4. As shown in FIG. 24, MRS-k data OK1 to be corrected has been acquired. As the MRS-k data OK1, the first MRS-k data and/or second MRS-k data acquired in step SC1 may be selected, or other MRS-k data may be selected. As the other MRS-k data, for example MRS-k data other than the first MRS-k data and second MRS-k data acquired in step SC1 among the MRS-k data for the number of excitations may be selected. As the MRS-k data OK1, average MRS-k data generated by performing addition processing on the MRS-k data for the number of excitations may be selected. Hereinafter, the MRS-k data OK1 is assumed to be average MRS-k data.

As shown in FIG. 24, k-space modulation amount information on the F0 shift and phase shift are output in step SC2. The processing circuitry 51C corrects average MRS-k data OK1 based on the k-space modulation amount information on the F0 shift and phase shift to generate corrected MRS-k data CK1 (step SC3). In the corrected MRS-k data CK1, the F0 shift and phase shift are reduced.

Next, as shown in FIG. 24, the processing circuitry 51C performs a Fourier transform on the corrected MRS-k data CK1 to convert the corrected MRS-k data CK1 into digital data that expresses the signal strength value by a frequency function, and performs post processing, such as a phase correction or a baseline correction, on the digital data to generate an MRS spectrum CS1 (step SC4). The MRS spectrum CS1 has reduced noise caused by k-space modulation in comparison with an MRS spectrum generated from the average MRS-k data OK1 without the correction processing (step SC3). According to the third embodiment, even when using average MRS-k data obtained by a smaller number of excitations than before, the accuracy of the MRS spectrum can be increased by a correction based on k-space modulation amount information. Therefore, the third embodiment can reduce the number of excitations in comparison with the case where the correction processing (step SC3) is not performed.

After step SC4, the processing circuitry 51C causes the MRS spectrum generated in step SC4 to be displayed, through implementation of the display control function 549 (step SC5). This enables the user to observe the denoised MRS spectrum.

This is the end of the signal processing by the MR signal processing apparatus 50 according to the third embodiment.

As described above, the MR signal processing apparatus 50 according to the third embodiment includes the processing circuitry 51C. The processing circuitry 51C inputs a plurality of items of MRS-k data acquired by MR spectroscopy on the same target to a trained model, and outputs k-space modulation amount information for MRS reconstruction. The processing circuitry 51C corrects the MRS-k data based on the k-space modulation amount information. Furthermore, the processing circuitry 51C generates an MRS spectrum based on the corrected MRS-k data.

With the above configuration, k-space modulation amount information is obtained based on a plurality of items of MRS-k data; therefore, the accuracy of k-space modulation amount information can be improved. In addition, MRS-k data and an MRS spectrum can be generated based on such k-space modulation amount information; therefore, the accuracy of the MRS-k data and MRS spectrum can be improved.

Fourth Embodiment

Next, an MR signal processing apparatus according to a fourth embodiment will be described. In the explanation below, structural elements having substantially the same functions as in the first embodiment will be denoted by the same reference symbols, and a repeat description will be given only where necessary.

Figure 25:
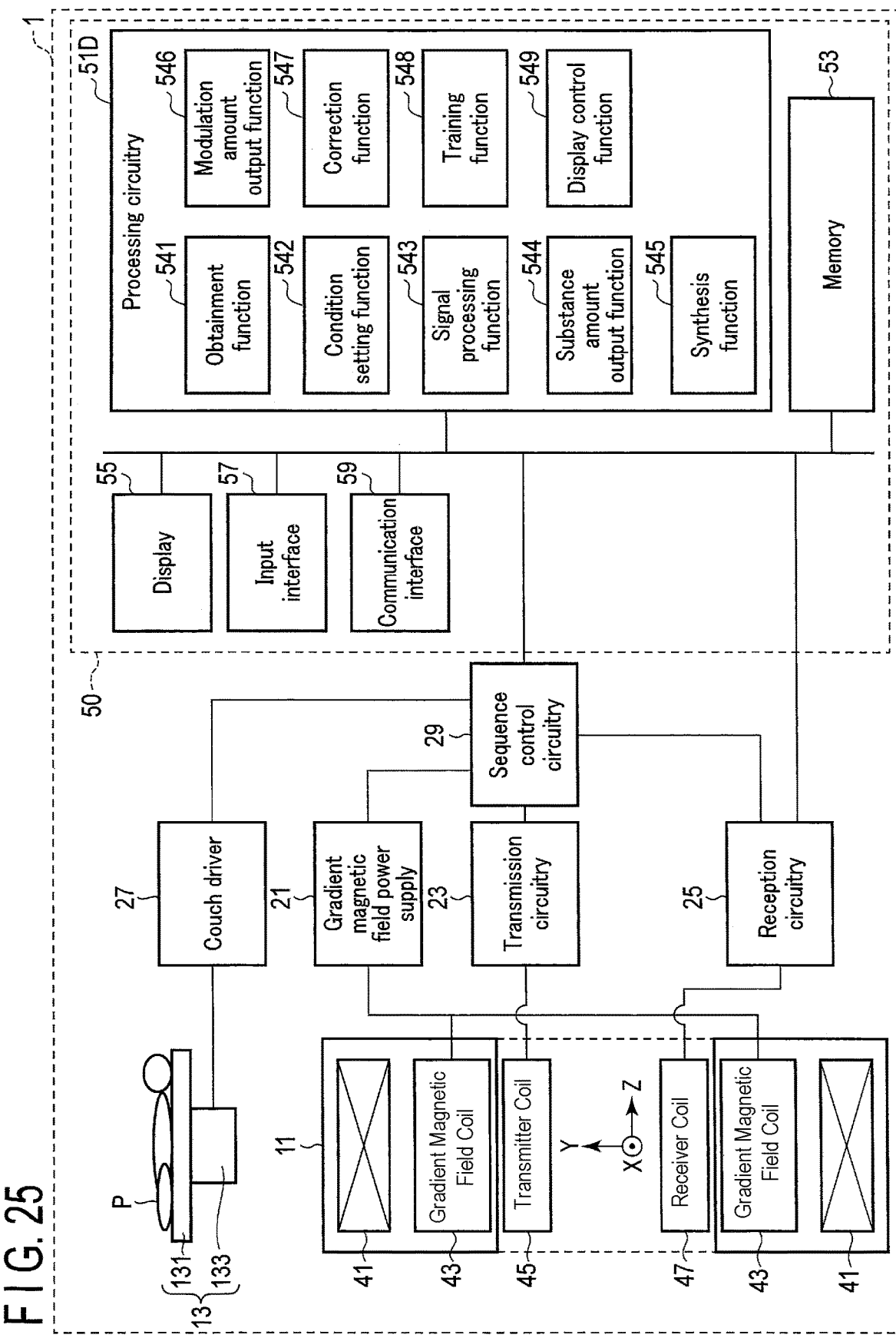
FIG. 25 shows a configuration example of a magnetic resonance imaging apparatus according to a fourth embodiment.

FIG. 25 shows a configuration example of a magnetic resonance imaging apparatus 1 according to the fourth embodiment. As shown in FIG. 25, the magnetic resonance imaging apparatus 1 includes a gantry 11, a couch 13, a gradient magnetic field power supply 21, transmission circuitry 23, reception circuitry 25, a couch driver 27, sequence control circuitry 29, and an MR signal processing apparatus (host computer) 50. The MR signal processing apparatus 50 is a computer including processing circuitry 51D, a memory 53, a display 55, an input interface 57, and a communication interface 59.

The processing circuitry 51D includes, as a hardware resource, a processor such as a CPU. The processing circuitry 51D functions as the nerve center of the magnetic resonance imaging apparatus 1. For example, through execution of various programs, the processing circuitry BID implements an obtainment function 541, a condition setting function 542, a signal processing function 543, a substance amount output function 544, a synthesis function 545, a modulation amount output function 546, a correction function 547, a training function 548, and a display control function 549.

The obtainment function 541, the condition setting function 542, the signal processing function 543, the substance amount output function 544, and the synthesis function 545 are substantially the same as the obtainment function 511, the condition setting function 512, the signal processing function 513, the substance amount output function 514, and the synthesis function 515 according to the first embodiment. The modulation amount output function 546 and the correction function 547 are substantially the same as the modulation amount output function 534 and the correction function 535 according to the third embodiment. The training function 548 is substantially the same as the training function 516 according to the first embodiment and the training function 536 according to the third embodiment. The display control function 549 is substantially the same as the display control function 517 according to the first embodiment and the display control function 537 according to the third embodiment.

An operation example of the MR signal processing apparatus 50 according to the fourth embodiment will be described in detail below.

The fourth embodiment is a combination of the first embodiment and the third embodiment. Namely, k-space modulation amount information is output by the modulation amount output function 546 based on a synthesized MRS spectrum generated by the synthesis function 545 based on substance amount information output by the substance amount output function 544. The substance amount output function 544, the synthesis function 545, and the modulation amount output function 546 may be built by a single machine learning model (hereinafter referred to as a second integrated model).

FIG. 26 shows a network configuration example of a second integrated model NN30 according to the fourth embodiment. As shown in FIG. 26, the second integrated model NN30 is a deep neural network including a substance amount information output layer NN31, a synthesis layer NN32, an inverse conversion layer NN33, a substance amount information output layer NN34, a synthesis layer NN35, an inverse conversion layer NN36, and a k-space modulation amount information output layer NN37. The substance amount information output layer NN31 and substance amount information output layer NN34 are a type of neural network layer that outputs substance amount information in response to an input of an MRS signal through the substance amount output function 544. The synthesis layer NN32 and synthesis layer NN35 are neural network layers that perform processing to generate a synthesized MRS spectrum based on substance amount information through the synthesis function 545. The inverse conversion layer NN33 and inverse conversion layer NN36 are neural network layers that perform processing to convert a synthesized MRS spectrum into MRS-k data through the signal processing function 543. The k-space modulation amount information output layer NN37 is a neural network layer that performs processing to output k-space modulation amount information from two items of MRS-k data through the modulation amount output function 546.

Specifically, as shown in FIG. 26, the substance amount information output layer NN31 receives a first MRS spectrum as an input, and outputs first substance amount information on propylene glycol, ethanol, acetate, and acetone, which corresponds to the first MRS spectrum. The synthesis layer NN32 receives the first substance amount information on propylene glycol, ethanol, acetate, and acetone output from the substance amount information output layer NN31 as an input, and outputs a first synthesized MRS spectrum. The inverse conversion layer NN33 receives the first synthesized MRS spectrum output from the synthesis layer NN32 as an input, and generates first MRS-k data, which is k-space data corresponding to the first synthesized MRS spectrum.

Similarly, the substance amount information output layer NN34 receives a second MRS spectrum as an input, and outputs second substance amount information on propylene glycol, ethanol, acetate, and acetone, which corresponds to the second MRS spectrum. The synthesis layer NN35 receives the second substance amount information on propylene glycol, ethanol, acetate, and acetone output from the substance amount information output layer NN34 as an input, and outputs a second synthesized MRS spectrum. The inverse conversion layer NN36 receives the second synthesized MRS spectrum output from the synthesis layer NN35 as an input, and generates second MRS-k data, which is k-space data corresponding to the second synthesized MRS spectrum.

The k-space modulation amount information output layer NN37 receives the first MRS-k data output from the inverse conversion layer NN33 and the second MRS-k data output from the inverse conversion layer NN36 as an input, and outputs k-space modulation amount information on the F0 shift and phase shift between data acquisitions of the first MRS spectrum and the second MRS spectrum. As described above, the combination of the substance amount information output layer NN31 and the synthesis layer NN32 and the combination of the substance amount information output layer NN34 and the synthesis layer NN35 can be regarded as equivalent to denoising processing of an MRS spectrum. Since the k-space modulation amount information output layer NN37 outputs k-space modulation amount information in response to an input of MRS-k data based on a synthesized MRS spectrum, which is a denoised MRS spectrum, the accuracy of the k-space modulation amount information is expected to be improved.

The second integrated model NN30 is trained by the processing circuitry 51D through implementation of the training function 548. The second integrated model NN30 can be generated by training of a pre-training type or an end-to-end type, for example. Training of the pre-training type can be performed in accordance with, for example, the following procedure. First, the processing circuitry 51D separately trains the substance amount information output layer NN31, the synthesis layer NN32, the inverse conversion layer NN33, the substance amount information output layer NN34, the synthesis layer NN35, the inverse conversion layer NN36, and the k-space modulation amount information output layer NN37. Next, the processing circuitry 51D connects the substance amount information output layer NN31, the synthesis layer NN32, the inverse conversion layer NN33, the substance amount information output layer NN34, the synthesis layer NN35, the inverse conversion layer NN36, and the k-space modulation amount information output layer NN37 as shown in FIG. 26, and trains them as one deep neural network. The second integrated model NN30 can be thereby generated. In the case of the end-to-end type, the processing circuitry 51D trains one deep neural network to output, in response to an input of two MRS spectra, k-space modulation amount information on the F0 shift and phase shift.

The second integrated model NN30 shown in FIG. 26 can be modified in various manners. For example, two or more unit layers of the substance amount information output layer NN31 and the synthesis layer NN32 may be connected in series. Similarly, two or more unit layers of the substance amount information output layer NN34 and the synthesis layer NN35 may be connected in series.

FIG. 27 shows a network configuration example of another second integrated model NN40 according to the fourth embodiment. As shown in FIG. 27, the second integrated model NN40 is a deep neural network including a substance amount information output layer NN41, a synthesis layer NN42, an inverse conversion layer NN43, a substance amount information output layer NN44, a synthesis layer NN45, an inverse conversion layer NN46, and a k-space modulation amount information output layer NN47. The substance amount information output layer NN41 is a type of neural network layer that outputs substance amount information in response to an input of an MRS signal through the substance amount output function 544. The substance amount information output layer NN44 is a type of neural network layer that outputs substance amount information in response to an input of two MRS signals through the substance amount output function 544. The synthesis layer NN42 and synthesis layer NN45 are neural network layers that perform processing to generate a synthesized MRS spectrum based on substance amount information through the synthesis function 545. The inverse conversion layer NN43 and inverse conversion layer NN46 are neural network layers that perform processing to convert a synthesized MRS spectrum into MRS-k data through the signal processing function 543. The k-space modulation amount information output layer NN47 is a neural network layer that performs processing to output k-space modulation amount information in response to an input of two items of MRS-k data through the modulation amount output function 546.

Specifically, as shown in FIG. 26, the substance amount information output layer NN41 receives a first MRS spectrum as an input, and outputs first substance amount information on propylene glycol, ethanol, acetate, and acetone, which corresponds to the first MRS spectrum. The synthesis layer NN42 receives the first substance amount information on propylene glycol, ethanol, acetate, and acetone output from the substance amount information output layer NN41 as an input, and outputs a first synthesized MRS spectrum. The inverse conversion layer NN43 receives the first synthesized MRS spectrum output from the synthesis layer NN42 as an input, and generates first MRS-k data, which is k-space data corresponding to the first synthesized MRS spectrum.

Similarly, the substance amount information output layer NN44 receives the first MRS spectrum and a second MRS spectrum as an input and outputs second substance amount information on propylene glycol, ethanol, acetate, and acetone, which corresponds to the first MRS spectrum and the second MRS spectrum. The synthesis layer NN45 receives the second substance amount information on propylene glycol, ethanol, acetate, and acetone output from the substance amount information output layer NN44 as an input, and outputs a second synthesized MRS spectrum. The inverse conversion layer NN46 receives the second synthesized MRS spectrum output from the synthesis layer NN45 as an input, and generates second MRS-k data, which is k-space data corresponding to the second synthesized MRS spectrum.

The k-space modulation amount information output layer NN47 receives the first MRS-k data output from the inverse conversion layer NN43 and the second MRS-k data output from the inverse conversion layer NN46 as an input, and outputs k-space modulation amount information on the F0 shift and phase shift between data acquisitions of the first MRS spectrum and the second MRS spectrum. As described above, the combination of the substance amount information output layer NN41 and the synthesis layer NN42 and the combination of the substance amount information output layer NN44 and the synthesis layer NN45 can be regarded as equivalent to denoising processing of an MRS spectrum. Since the k-space modulation amount information output layer NN47 outputs k-space modulation amount information in response to an input of MRS-k data based on a synthesized MRS spectrum, which is a denoised MRS spectrum, the accuracy of the k-space modulation amount information is expected to be improved. The synthesized MRS spectrum, which is an output from the combination of the substance amount information output layer NN44 and the synthesis layer NN45, serves as an ideal MRS spectrum relating to the measurement target site. It can be said that the k-space modulation amount information output layer NN47 outputs k-space modulation amount information in response to an input of MRS-k data based on the denoised first MRS spectrum and MRS-k data based on an ideal MRS spectrum. The k-space modulation amount information represents the modulation amount of k-space modulation caused by the actual magnetic field modulation at the time of data acquisition of the first MRS spectrum with respect to the ideal magnetic field. Correction of MRS-k data based on such k-space modulation amount information enables generation of MRS-k data and an MRS spectrum based on the MRS-k data with higher accuracy.

The second integrated model NN40 is trained by the processing circuitry 51D through implementation of the training function 548. The second integrated model NN40 can be generated by training of a pre-training type or an end-to-end type, for example. In the case of the pre-training type, the processing circuitry 51D first separately trains the substance amount information output layer NN41, the synthesis layer NN42, the inverse conversion layer NN43, the substance amount information output layer NN44, the synthesis layer NN45, the inverse conversion layer NN46, and the k-space modulation amount information output layer NN47. Next, the processing circuitry 51D connects the substance amount information output layer NN41, the synthesis layer NN42, the inverse conversion layer NN43, the substance amount information output layer NN44, the synthesis layer NN45, the inverse conversion layer NN46, and the k-space modulation amount information output layer NN47 as shown in FIG. 27, and trains them as one deep neural network. The second integrated model NN40 can thereby be generated. In the case of the end-to-end type, the processing circuitry 51D trains one deep neural network to output, in response to an input of three MRS spectra, k-space modulation amount information on the F0 shift and phase shift.

The second integrated model NN40 shown in FIG. 27 can be modified in various manners. For example, the substance amount information output layer NN44 receives, as an input, not only the second MRS spectrum, but also the first MRS spectrum, which is the same as the input to the substance amount information output layer NN41. However, the substance amount information output layer NN44 may receive, as an input, not only the second MRS spectrum, but also a third MRS spectrum, which differs from the input to the substance amount information output layer NN41. Instead of the substance amount information output layer NN44 with one input channel, a substance amount information output layer with two input channels may be provided. Two or more unit layers of the substance amount information output layer NN41 and the synthesis layer NN42 may be connected in series. Similarly, two or more unit layers of the substance amount information output layer NN44 and the synthesis layer NN45 may be connected in series.

Fifth Embodiment

A fifth embodiment is an application example of the third embodiment. A magnetic resonance imaging apparatus 1 and MR signal processing apparatus 50 according to the fifth embodiment have the same configurations as those according to the third embodiment.

FIG. 28 schematically shows an input/output relationship of a trained model (modulation amount estimation NN) according to the fifth embodiment. As shown in FIG. 28, the modulation amount estimation NN is a machine learning model whose parameters have been trained to output, in response to an input of a first MR acquisition signal and a second MR acquisition signal, k-space modulation amount information on k-space modulation caused by magnetic field modulation that occurred between data acquisitions of the first MR acquisition signal and the second MR acquisition signal. The processing circuitry 51C inputs a first MR acquisition signal and a second MR acquisition signal to be processed, which relate to the same imaging target, to a modulation amount estimation NN, and outputs k-space modulation amount information on k-space modulation caused by magnetic field modulation that occurred between data acquisitions of the first MR acquisition signal and second MR acquisition signal to be processed.

The MR acquisition signal is a generic name for signals obtained by MR imaging or chemical shift measurement by the sequence control circuitry 29. As the MR imaging according to the fifth embodiment, T1 weighted imaging, T2 weighted imaging, T2* weighted imaging, diffusion weighted imaging, MR angiography, and any other MR imaging are applicable. The pulse sequence of the MR imaging is not particularly limited either, and a spin echo sequence, a gradient echo sequence, inversion recovery, echo planar imaging, parallel imaging, compressed sensing, and any other pulse sequences are applicable. The k-space filing method is not particularly limited either, and a Cartesian scan method, a radial scan method, a spiral method, a stack-of-stars method, a koosh-ball method, and any other methods of any dimensions can be applied. As the chemical shift measurement, not only the MR spectroscopy and chemical shift imaging applied in the above embodiments, but also chemical exchange spectroscopy (CEST) and Z-spectrum analysis provides proton environment data (ZAPPED) can be applied.

The MR acquisition signal has a concept encompassing, for example, k-space data and an MR image based on the k-space data. The first MR acquisition signal and the second MR acquisition signal are MR acquisition signals acquired from the same subject P. The data acquisition condition of the first MR acquisition signal may be the same as or different from that of the second MR acquisition signal. The MR acquisition signal input to the modulation amount estimation NN may be k-space data or an MR image. The number of MR acquisition signals input to the modulation amount estimation NN is two in FIG. 28; however, this is an example, and the number may be any number larger than 2. The MR acquisition signal encompasses the MRS signals according to the first to fourth embodiments.

FIG. 29 schematically shows a specific example of the input/output relationship of the modulation amount estimation NN according to the fifth embodiment. As shown in FIG. 29, the modulation amount estimation NN is a machine learning model whose parameters have been trained to output, in response to an input of first non-MRS k-space data and second non-MRS k-space data, k-space modulation amount information between data acquisitions of the first non-MRS k-space data and the second non-MRS k-space data. As the k-space modulation amount information, an F0 shift and a phase shift are shown as examples. The non-MRS k-space data is k-space data acquired by MR imaging or chemical shift measurement other than MR spectroscopy.

As mentioned above, non-MRS k-space data may be acquired by any MR imaging method, pulse sequence, or k-space filling method. As the first non-MRS k-space data and second non-MRS k-space data, k-space data of each k-space track may be used. The k-space track corresponds to a k-space line of a Cartesian scan, a spoke of a radial scan, and a spiral of a spiral scan. Hereinafter, the case where a spoke of a radial scan is used as the non-MRS k-space data will be described.

Figure 30:
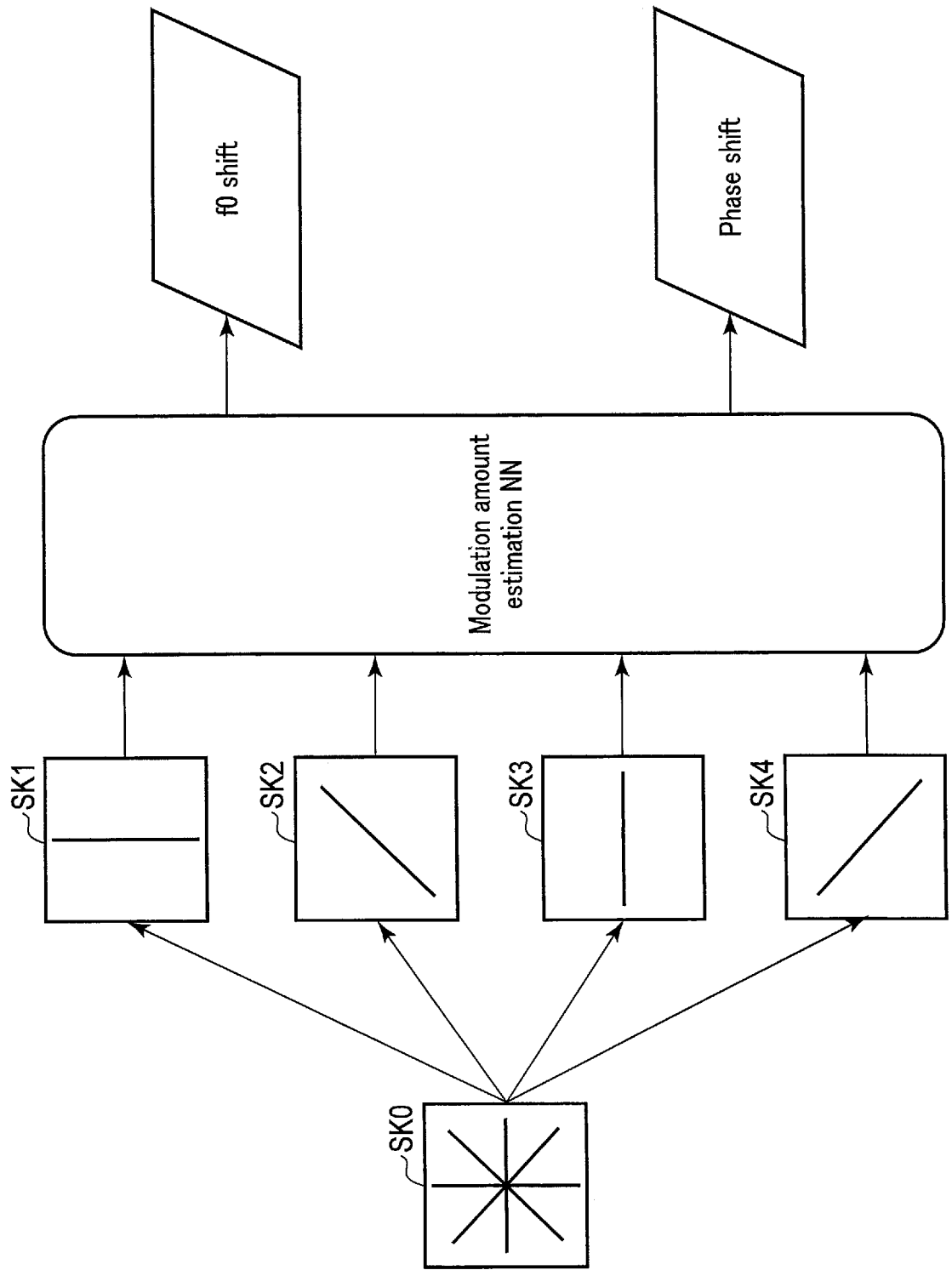
FIG. 30 schematically shows a further specific example of the input/output relationship of the modulation amount estimation NN shown in FIG. 29.

FIG. 30 schematically shows a further specific example of the input/output relationship of the modulation amount estimation NN shown in FIG. 29. As shown in FIG. 30, the modulation amount estimation NN is a machine learning model whose parameters have been trained to output, in response to an input of a plurality of spokes SK1 to SK4 of a radial scan, k-space modulation amount information on the F0 shift and phase shift. The spokes SK1 to SK4 are any spokes selected from a set SK0 of spokes acquired by a radial scan. FIG. 30 shows the case where all spokes included in the set SK0 are input to the modulation amount estimation NN as spokes SK1 to SK4. However, all spokes included in the set SK0 need not be input to the modulation amount estimation NN, and this example holds as long as any two spokes of the set SK0 are input to the modulation amount estimation NN.

The processing circuitry 51C selects spokes SK1 to SK4 from the set SK0, inputs the selected spokes SK1 to SK4 to the modulation amount estimation NN, and outputs k-space modulation amount information on the F0 shift and phase shift. The processing circuitry 51C corrects the set SK0 based on the output k-space modulation amount information, generates a corrected set, and reconstructs an MR image based on the generated corrected set. The MR image has a reduced F0 shift and phase shift.

According to the fifth embodiment, k-space modulation information can be obtained using an MR acquisition signal other than the MRS signal. Accordingly, a correction on k-space modulation can be performed with high accuracy for various MR acquisition signals.

Sixth Embodiment

A sixth embodiment is a modification applicable to any of the above-described embodiments. An MR signal processing apparatus according to the sixth embodiment will be described below. In the following explanation, structural elements having substantially the same functions as in the above-described embodiments will be denoted by the same reference symbols, and a repeat description will be given only where necessary.

Figure 31:
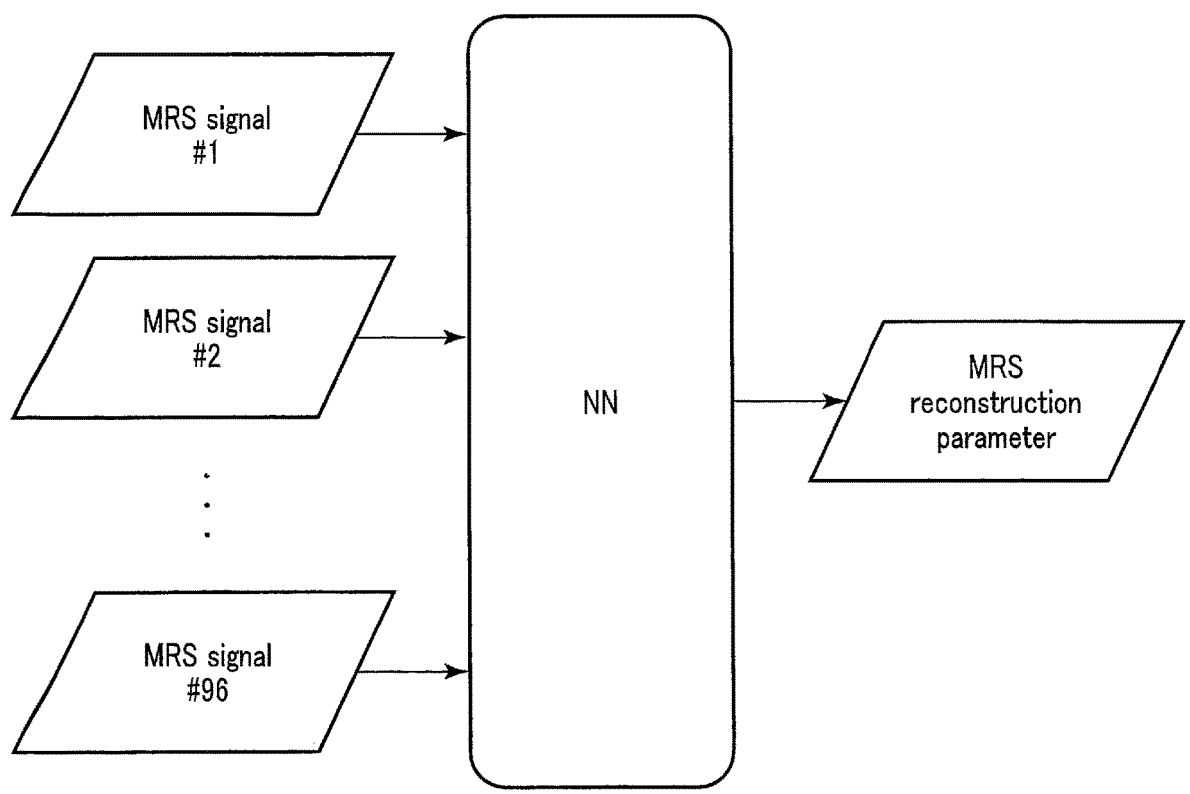
FIG. 31 schematically shows an input/output relationship of a trained model NN of a sixth embodiment.

FIG. 31 schematically shows an input/output relationship of a trained model NN of the sixth embodiment. The trained model NN according to the sixth embodiment is a machine learning model trained to output an MRS reconstruction parameter in response to an input of a plurality of MRS signals. The trained model NN according to the sixth embodiment may be any of the machine learning models of the above-described first to fifth embodiments. Specifically, the trained model NN may be the substance amount estimation NN which outputs substance amount information, as shown in FIG. 2, etc. of the first embodiment, the base component amount estimation NN which outputs base component amount information, as shown in FIG. 14, etc. of the second embodiment, and the modulation amount estimation NN which outputs k-space modulation amount information, as shown in FIG. 21, etc. of the third embodiment. Each of the substance amount information, base component amount information, and k-space modulation amount information is a type of MRS reconstruction parameter. The MRS reconstruction parameter is a parameter obtained by MRS reconstruction. The MRS reconstruction refers to processing to generate an MRS spectrum in general. For example, the MRS reconstruction includes processing to generate, from a spectrum model, an MRS spectrum by fitting as in the first and second embodiments, and processing to generate, from MRS-k data, an MRS spectrum by a Fourier transform as in the third embodiment.

As shown in FIG. 31, the trained model NN receives a plurality of MRS signals of different numbers of additions. The number of MRS signals may be any number larger than or equal to 2; however, 96 MRS signals are shown in FIG. 31 as an example. The number of additions means the number of MRS signals added up. The number of additions can also be expressed as resolution.

In the sixth embodiment, the processing circuitry 51 acquires a number of (for example, 128) MRS signals corresponding to the NEX. Next, the processing circuitry 51 generates 96 MRS signals from the number of MRS corresponding to the NEX. Specifically, the processing circuitry 51 sets 96 patterns of different combinations of the number of MRS signals to be added up (number of additions) and the number of the MRS signal to be added up. The 96 patterns may be set by a given algorithm, or may be artificially set. The processing circuitry 51 generates 96 MRS signals by extracting and adding up MRS signals for each of the 96 patterns.

As described above, the estimation accuracy of the MRS reconstruction parameter is expected to be improved by inferring of an MRS reconstruction parameter by the trained model NN based on a plurality of MRS signals of different numbers of additions.

In the present embodiment, the trained model NN is described as receiving a plurality of MRS signals of a different number of additions as an input; however, the trained model NN may receive a plurality of MRS signals of different qualities as an input. The quality depends on the degree of body movement of the subject P at the time of acquisition of the MRS signal. When the degree of body movement is small, the quality is high, and when the degree of body movement is large, the quality is low. The degree of body movement can be determined based on, for example, measurement data measured by external measuring equipment in parallel with acquisition of the MRS signal. As the external measuring equipment, for example, an electrocardiograph which measures the electrocardiographic waveform of the subject P or a respirometer which measures the respiratory waveform of the subject P can be used. During the period in which the wave height value of the electrocardiographic waveform or respiratory waveform is large or the temporal variation of the wave height value is large, the body movement of the subject P is intense, and the quality of an MRS signal acquired during the period is relatively low. Thus, the processing circuitry 51 monitors the wave height value of the electrocardiographic waveform or respiratory waveform or the temporal variation of the wave height value, sets the quality of an MRS signal acquired in the period to a larger value as the wave height value or temporal variation becomes larger, and sets the quality of an MRS signal acquired in the period to a smaller value as the wave height value or temporal variation becomes smaller. The degree of body movement may be determined based on an image picked up by an optical camera in parallel with acquisition of an MRS signal, or may be determined based on an output from any other measuring equipment that can measure the body movement of the subject P.

Instead of being determined based on an output from the external measuring equipment, the quality of an MRS signal may be calculated based on the MRS signal. In this case, the quality of the MRS signal means an error between the MRS signal and a given reference. As the reference, any MRS signal, such as a pre-acquired MRS signal, or an artificially-generated MRS signal, may be used. When the MRS signal is an MRS spectrum, the error is defined by the amount of shift of an MRS spectrum with respect to a reference MRS spectrum in a frequency direction. The processing circuitry 51 calculates, as an error, the difference in the frequency value of the signal peak that originates in the same substance between the object MRS spectrum and the reference MRS spectrum. Since the chemical shift value of water changes when the subject P moves, the error can be used as an index for measuring quality. The processing circuitry 51 sets the quality of an MRS signal acquired in the period to a higher value as the error becomes larger, and sets the quality of an MRS signal acquired in the period to a smaller value as the error becomes larger.

Seventh Embodiment

A seventh embodiment is a modification applicable to any of the above-described embodiments. An MR signal processing apparatus according to the seventh embodiment will be described below. In the following explanation, structural elements having substantially the same functions as in the above-described embodiments will be denoted by the same reference symbols, and a repeat description will be given only where necessary.

FIG. 32 schematically shows a processing example according to the seventh embodiment. As shown in FIG. 32, the processing circuitry 51 acquires a plurality of MRS signals of different qualities, sorts the acquired MRS signals in accordance with the qualities (step SD1), and inputs the sorted MRS signals to a trained model NN to estimate an MRS reconstruction parameter. The trained model NN and MRS reconstruction parameter according to the seventh embodiment are similar to those according to the sixth embodiment. The number of MRS signals to be input to the trained model NN may be any number larger than or equal to 2; however, 96 MRS signals are shown in FIG. 32 as an example. The quality according to the seventh embodiment is similar to that according to the sixth embodiment. #n ($1<n\leq N=96$) in FIG. 32 represents the acquisition ordinal number of the MRS signal. There is no correlation between the acquisition ordinal number and the quality ordinal No. n ($1<n\leq N=96$).

In the sorting processing (step SD1), the processing circuitry 51 sorts MRS signals in accordance with a predetermined order. The predetermined order is, for example, descending order of quality, as shown in FIG. 32. The processing circuitry 51 inputs the MRS signals to the trained model NN in the sorted order. Specifically, the channels of the input layer of the trained model NN are associated with respective quality ordinal numbers, and the processing circuitry 51 inputs an MRS signal to a channel corresponding to the quality ordinal number of the MRS signal. Since MRS signals are input to the trained model NN after being sorted in accordance with the quality order, inputs are always made in a constant quality order. Since the MRS signals input to the same channel have a relatively constant quality, the estimation accuracy of the MRS reconstruction parameter is expected to be improved. The predetermined order is not limited to the above-described one, and may be any order, such as ascending order of quality, as long as it is a constant order. Herein, the MRS signals are sorted in accordance with the qualities; however, they may be sorted in accordance with the numbers of additions.

The trained model NN according to the seventh embodiment is obtained by the following training. By the above-described method, the number of additions or quality is set for input data of each training sample. In the meantime, the numbers of additions or quality ordinal numbers are associated with respective channels of an input layer of a machine learning model. The processing circuitry 51 trains the machine learning model based on a plurality of training samples as described in the first to fifth embodiments. At this time, input data of each training sample is input to the channel corresponding to the number of additions or quality thereof. The trained model NN according to the seventh embodiment is thereby obtained.

Eighth Embodiment

An eighth embodiment is a modification applicable to any of the above-described embodiments. An MR signal processing apparatus according to the eighth embodiment will be described below. In the following explanation, structural elements having substantially the same functions as in the above-described embodiments will be denoted by the same reference symbols, and a repeat description will be given only where necessary.

FIG. 33 schematically shows a processing example according to the eighth embodiment. As shown in FIG. 33, the processing circuitry 51 acquires a plurality of MRS signals of different qualities, groups the acquired MRS signals into a used group and a rejected group based on the qualities (step SE1), inputs the MRS signals in the used group to the trained model NN to estimate an MRS reconstruction parameter, and rejects the MRS signals in the rejected group (step SE2). In other words, the processing circuitry 51 rejects MRS signals based on the qualities, and inputs the MRS signals other than the rejected MRS signals to the trained model NN. The trained model NN and MRS reconstruction parameter according to the eighth embodiment are similar to those according to the sixth embodiment. The quality according to the eighth embodiment is similar to that according to the sixth embodiment. #n ($1<n\leq N$) represents the acquisition ordinal number of the MRS signal. The number of MRS signals to be grouped may be any number larger than or equal to 2; however, N=96 in FIG. 33.

In the grouping processing (step SE1), the processing circuitry 51 groups the MRS signals into a used group and a rejected group in accordance with the qualities. The used group is a group of MRS signals with qualities above a threshold. The rejected group is a group of MRS signals with qualities below the threshold. The processing circuitry 51 compares the quality of each MRS signal with the threshold, and determines whether the quality is above or below the threshold. The processing circuitry 51 groups an MRS signal into the used group when the quality exceeds the threshold, and groups an MRS signal into the rejected group when the quality falls below the threshold. The processing circuitry 51 then inputs the MRS signals grouped into the used group to the trained model NN to estimate an MRS reconstruction parameter. By limiting the MRS signals used to estimate an MRS reconstruction parameter to the MRS signals of qualities above the threshold, the estimation accuracy of the MRS reconstruction parameter is expected to be improved. Herein, each MRS signal is used or rejected in accordance with the quality; however, it may be used or rejected in accordance with the number of additions.

The trained model NN according to the eighth embodiment is obtained by the following training. By the above-described method, the number of additions or quality is set for input data of each training sample. The processing circuitry 51 trains a machine learning model based on a plurality of training samples as described in the first to fifth embodiments. At this time, the training samples are limited to those of the number of additions or quality above the threshold. The trained model NN according to the eighth embodiment is thereby obtained.

Ninth Embodiment

A ninth embodiment is a modification applicable to any of the above-described embodiments. An MR signal processing apparatus according to the ninth embodiment will be described below. In the following explanation, structural elements having substantially the same functions as in the above-described embodiments will be denoted by the same reference symbols, and a repeat description will be given only where necessary.

Figure 34:
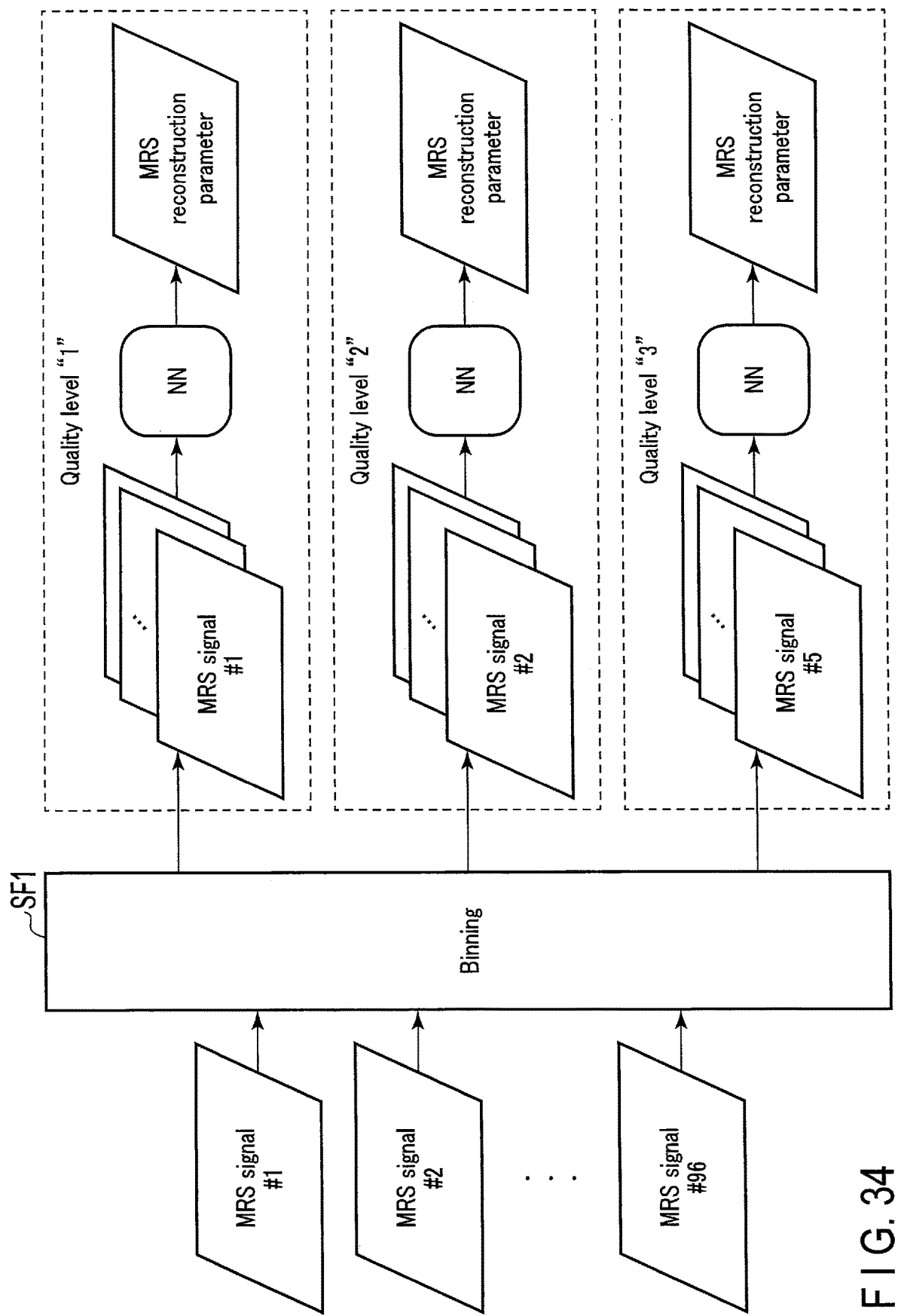
FIG. 34 schematically shows a processing example according to a ninth embodiment.

FIG. 34 schematically shows a processing example according to the ninth embodiment. As shown in FIG. 34, the processing circuitry 51 acquires a plurality of MRS signals of different qualities, binning the acquired MRS signals in accordance with the qualities (step SF1), and inputs the MRS signals to a trained model NN in units of quality levels (bins) to estimate an MRS reconstruction parameter. The trained model NN and MRS reconstruction parameter according to the ninth embodiment are similar to those according to the sixth embodiment. The quality according to the ninth embodiment is similar to that according to the sixth embodiment. #n (1<n≤N) represents the acquisition ordinal number of the MRS signal. The number of MRS signals to be subjected to binning may be any number larger than or equal to 2; however, N=96 in FIG. 34. The number of quality levels may be any number larger than or equal to 2; however, three quality levels are shown as an example in FIG. 34. The quality decreases in the order of quality levels 1, 2, and 3.

As shown in FIG. 34, a trained model NN is prepared for each quality level. The trained model NN for each quality level is a machine learning model trained to output an MRS reconstruction parameter in response to an input of MRS signals at the quality level. The processing circuitry 51 then inputs the MRS signals at each quality level to a trained model NN corresponding to the quality level to estimate an MRS reconstruction parameter. The processing circuitry 51 calculates a final MRS reconstruction parameter based on a plurality of MRS reconstruction parameters corresponding to the respective quality levels. For example, the processing circuitry 51 may calculate, as the final MRS reconstruction parameter, an average value of the MRS reconstruction parameters or an average value of MRS reconstruction parameters weighted according to the quality levels. Alternatively, the processing circuitry 51 may use, as the final MRS reconstruction parameter, an MRS reconstruction parameter corresponding to a quality level designated by the user, and reject the MRS reconstruction parameters corresponding to the other quality levels. Herein, the MRS signals are subjected to binning in accordance with the qualities; however, they may be subjected to binning in accordance with the numbers of additions.

The trained model NN according to the ninth embodiment is obtained by the following training. By the above-described method, the number of additions or the quality is set for input data of each training sample. A plurality of machine learning models corresponding to a plurality of addition number levels or a plurality of quality levels are prepared. The processing circuitry 51 trains each machine learning model based on a plurality of training samples as described in the first to fifth embodiments. The machine learning models corresponding to the respective addition number levels or quality levels are trained based on the training samples belonging to the respective levels. The trained model NN according to the ninth embodiment is thereby obtained.

Tenth Embodiment

In the above embodiments, the MR signal processing apparatus 50 is incorporated in the magnetic resonance imaging apparatus 1. However, the MR signal processing apparatus 50 does not have to be incorporated in the magnetic resonance imaging apparatus 1. An MR signal processing apparatus 50 according to a tenth embodiment will be described below. In the following explanation, structural elements having substantially the same functions as in the first to ninth embodiments will be denoted by the same reference symbols, and a repeat description will be given only where necessary.

FIG. 35 shows a configuration example of a magnetic resonance imaging system 100 including an MR signal processing apparatus according to the tenth embodiment. As shown in FIG. 35, the magnetic resonance imaging system 100 includes a magnetic resonance imaging apparatus 1, an MR signal processing apparatus 50, and a PACS server 90, which are connected to each other via a network. As the MR signal processing apparatus 50, the MR signal processing apparatus of any of the first to ninth embodiments is applicable.

The magnetic resonance imaging apparatus 1 acquires an MR acquisition signal, such as an MRS signal, and transmits the MR acquisition signal to the PACS server 90. The PACS server 90 stores the MR acquisition signal. The PACS server 90 stores, in a searchable manner, an MR acquisition signal and a medical signal acquired by another medical image diagnosis apparatus such as an X-ray computed tomography apparatus. The MR signal processing apparatus 50 acquires an MR acquisition signal to be processed from the MR acquisition signals stored in the PACS server 90, and executes various types of processing described in the first to ninth embodiments.

According to the tenth embodiment, even when there is no imaging mechanism for, for example, MR spectroscopy or MR imaging, the accuracy of an MR acquisition signal such as an MRS signal can be improved by executing various types of processing described in the first to ninth embodiments.

(Additional Remarks)

According to at least one embodiment described above, the MR signal processing apparatus 50 includes the processing circuitry 51. The processing circuitry 51 inputs a plurality of MRS signals acquired by MR spectroscopy on the same target to a trained model, and outputs a parameter for MRS reconstruction. The MRS reconstruction refers to processing to generate an MRS spectrum in general. For example, the MRS reconstruction includes processing to generate, from a spectrum model, an MRS spectrum by fitting as in the first and second embodiments, and processing to generate, from MRS-k data, an MRS spectrum by a Fourier transform as in the third embodiment. The parameter for MRS reconstruction is a spectrum parameter in the first and second embodiments, and a k-space modulation amount such as an F0 shift or a phase shift in the third embodiment.

The above configuration enables obtainment of an accurate parameter, and consequently enables obtainment of an accurate MRS signal.

According to at least one embodiment described above, the accuracy of an MRS signal can be improved.

The term "processor" used in the above explanation means, for example, a CPU, a GPU, or circuitry such as an application specific integrated circuit (ASIC) or a programmable logic device (e.g., a simple programmable logic device (SPLD), a complex programmable logic device (CPLD), or a field programmable gate array (FPGA)). The processor reads and executes a program stored in memory circuitry to implement a function. Instead of storing a program in memory circuitry, a program may be directly integrated in circuitry of the processor. In this case, the processor implements the function by reading and executing the program integrated in the circuitry. The function corresponding to the program may be implemented by a combination of logic circuits instead of executing the program. The processors described in connection with the above embodiments are not limited to single-circuit processors; a plurality of independent processors may be integrated into a single processor that implements the functions of the processors. Furthermore, multiple structural elements in FIGS. 1, 13, 20, 25, and 35 may be integrated into a single processor in order to implement the functions of the structural elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An MR signal processing apparatus, comprising:
processing circuitry configured to input a plurality of MRS signals acquired by MR spectroscopy on a same subject to a trained model and output a parameter for MRS reconstruction,
wherein the plurality of MRS signals are k-space data collected by one data acquisition of the MR spectroscopy, or a spectrum based on the k-space data.

2. An MR signal processing apparatus, comprising:
processing circuitry configured to input a plurality of MR acquisition signals relating to a same target to a trained model, and output a modulation amount on k-space modulation caused by magnetic field modulation that occurred between data acquisitions of the plurality of MR acquisition signals.

3. An MR signal processing apparatus, comprising:
processing circuitry configured to input a plurality of MRS signals acquired by MR spectroscopy on a same subject to a trained model and output a parameter for MRS reconstruction, wherein
the parameter comprises a plurality of parameters,
the parameters are spectrum parameters for fitting based on a plurality of spectrum models corresponding respectively to the parameters,
the processing circuitry is further configured to generate an MRS spectrum relating to the subject by fitting based on the spectrum parameters and the spectrum models,
a first MRS signal of the plurality of MRS signals is acquired by execution of data acquisition including application of an area selection pulse, and
a second MRS signal of the plurality of MRS signals is acquired by execution of data acquisition not including application of an area selection pulse.

4. An MR signal processing apparatus, comprising:
processing circuitry configured to input a plurality of MRS signals acquired by MR spectroscopy on a same subject to a trained model and output a parameter for MRS reconstruction, wherein
the parameter comprises a plurality of parameters,
the parameters are spectrum parameters for fitting based on a plurality of spectrum models corresponding respectively to the parameters,
the processing circuitry is further configured to generate an MRS spectrum relating to the subject by fitting based on the spectrum parameters and the spectrum models,
a first MRS signal of the plurality of MRS signals is acquired by execution of data acquisition under a first TR and TE combination, and
a second MRS signal of the plurality of MRS signals is acquired by execution of data acquisition under a second TR and TE combination which differs from the first TR and TE combination.

5. An MR signal processing apparatus, comprising:
processing circuitry configured to input a plurality of MRS signals acquired by MR spectroscopy on a same subject to a trained model and output a parameter for MRS reconstruction, wherein
the parameter comprises a plurality of parameters,
the parameters are spectrum parameters for fitting based on a plurality of spectrum models corresponding respectively to the parameters,
the processing circuitry is further configured to generate an MRS spectrum relating to the subject by fitting based on the spectrum parameters and the spectrum models,
the spectrum models are a plurality of base spectra corresponding respectively to a plurality of bases obtained by performing data compression on a specific MRS spectrum, and
the parameters include component amount information on the bases relating to the subject.

6. An MR signal processing apparatus, comprising:
processing circuitry configured to input a plurality of MRS signals acquired by MR spectroscopy on a same subject to a trained model and output a parameter for MRS reconstruction, wherein
the parameter is modulation amount information on k-space modulation caused by magnetic field modulation that occurred between data acquisitions of the plurality of MRS signals,
the plurality of MRS signals are a plurality of items of k-space data acquired by MR spectroscopy,
the processing circuitry is further configured to correct, based on the modulation amount information, average k-space data based on at least one of the items of k-space data, and
the processing circuitry is further configured to generate an MRS spectrum based on the corrected average k-space data.

7. An MR signal processing apparatus, comprising:
processing circuitry configured to input a plurality of MRS signals acquired by MR spectroscopy on a same subject to a trained model and output a parameter for MRS reconstruction, wherein
the trained model includes a plurality of first parameter output units, a plurality of synthesis units, and a second parameter output unit,
the first parameter output units receive the plurality of MRS signals as inputs, and output a plurality of pieces of amount information on substances or bases,
the synthesis units generate a plurality of synthesized MRS signals relating to a target based on the respective pieces of amount information, and
the second parameter output unit receives the synthesized MRS signals as an input, and outputs modulation amount information on k-space modulation caused by magnetic field modulation that occurred between data acquisitions of the plurality of MRS signals.

8. An MR signal processing apparatus, comprising:
processing circuitry configured to input a plurality of MRS signals acquired by MR spectroscopy on a same subject to a trained model and output a parameter for MRS reconstruction, wherein the trained model includes a first parameter output unit, a second parameter output unit, a first synthesis unit, a second synthesis unit, and a third parameter output unit, the first parameter output unit receives one MRS signal of the plurality of MRS signals as an input, and outputs first amount information on substances or bases, the second parameter output unit receives the plurality of MRS signals as an input, and outputs second amount information on substances or bases, the first synthesis unit generates a first synthesized MRS signal relating to the target based on the first amount information, the second synthesis unit generates a second synthesized MRS signal relating to the target based on the second amount information, and the third parameter output unit receives the first synthesized MRS signal and the second synthesized MRS signal as an input, and outputs modulation amount information on k-space modulation caused by magnetic field modulation that occurred between data acquisitions of the plurality of MRS signals.

9. An MR signal processing apparatus, comprising:
processing circuitry configured to input a plurality of MRS signals acquired by MR spectroscopy on a same subject to a trained model and output a parameter for MRS reconstruction,
wherein the processing circuitry is further configured to input the plurality of MRS signals sorted in accordance with numbers of additions or qualities to the trained model, or input MRS signals other than MRS signals rejected in accordance with the numbers of additions or qualities among the plurality of MRS signals input to the trained model.

10. An MR signal processing apparatus, comprising:
processing circuitry configured to input a plurality of MRS signals acquired by MR spectroscopy on a same subject to a trained model and output a parameter for MRS reconstruction, wherein
the trained model includes a plurality of models corresponding respectively to a plurality of quality levels, and
the processing circuitry is further configured to perform binning on the plurality of MRS signals in accordance with qualities, and input the plurality of MRS signals to the models in units of quality levels.

11. The MR signal processing apparatus according to claim 1, wherein
the parameter comprises a plurality of parameters,
the parameters are spectrum parameters for fitting based on a plurality of spectrum models corresponding respectively to the parameters, and
the processing circuitry is further configured to generate an MRS spectrum relating to the subject by fitting based on the spectrum parameters and the spectrum models.

12. The MR signal processing apparatus according to claim 11, wherein
the spectrum models are a plurality of spectra corresponding respectively to a plurality of substances included in the subject, and
the spectrum parameters include substance amount information on the substances relating to the subject.

13. The MR signal processing apparatus according to claim 11, wherein a first MRS signal of the plurality of MRS signals is acquired by execution of data acquisition including application of an area selection pulse, and a second MRS signal of the plurality of MRS signals is acquired by execution of data acquisition not including application of an area selection pulse.

14. The MR signal processing apparatus according to claim 13, wherein the processing circuitry is further configured to input, to the trained model, the plurality of MRS signals and frequency information on a frequency band selected by the application of the area selection pulse.

15. The MR signal processing apparatus according to claim 11, wherein
a first MRS signal of the plurality of MRS signals is acquired by execution of data acquisition under a first TR and TE combination, and
a second MRS signal of the plurality of MRS signals is acquired by execution of data acquisition under a second TR and TE combination which differs from the first TR and TE combination.

16. The MR signal processing apparatus according to claim 11, wherein
the spectrum models are a plurality of base spectra corresponding respectively to a plurality of bases obtained by performing data compression on a specific MRS spectrum, and
the parameters include component amount information on the bases relating to the subject.

17. The MR signal processing apparatus according to claim 16, wherein the plurality of bases include a first base based on an MRS spectrum relating to a healthy person and a second base based on an MRS spectrum relating to an unhealthy person.

18. The MR signal processing apparatus according to claim 17, wherein the processing circuitry is further configured to:
input the plurality of MRS signals to the trained model and output first substance amount or component amount information on the first base and second substance amount or component amount information on the second base; and
determine whether the subject is normal or abnormal based on the first substance amount or component amount information and the second substance amount or component amount information.

19. The MR signal processing apparatus according to claim 18, wherein the processing circuitry is further configured to cause a display to display a determination result on whether the subject is normal or abnormal.

20. The MR signal processing apparatus according to claim 11, wherein one or more MRS signals of the plurality of MRS signals are MRS signals generated by the fitting.

21. The MR signal processing apparatus according to claim 1, wherein the parameter further includes reliability information.

22. The MR signal processing apparatus according to claim 1, wherein the parameter is modulation amount information on k-space modulation caused by magnetic field modulation that occurred between data acquisitions of the plurality of MRS signals.

23. The MR signal processing apparatus according to claim 22, wherein
the plurality of MRS signals are a plurality of items of k-space data acquired by MR spectroscopy, and the processing circuitry is further configured to correct, based on the modulation amount information, average k-space data based on at least one of the items of k-space data.

24. The MR signal processing apparatus according to claim 23, wherein the processing circuitry is further configured to generate an MRS spectrum based on the corrected average k-space data.

25. The MR signal processing apparatus according to claim 1, wherein
the trained model includes a plurality of first parameter output units, a plurality of synthesis units, and a second parameter output unit,
the first parameter output units receive the plurality of MRS signals as inputs, and output a plurality of pieces of amount information on substances or bases,
the synthesis units generate a plurality of synthesized MRS signals relating to a target based on the respective pieces of amount information, and
the second parameter output unit receives the synthesized MRS signals as an input, and outputs modulation amount information on k-space modulation caused by magnetic field modulation that occurred between data acquisitions of the plurality of MRS signals.

26. The MR signal processing apparatus according to claim 1, wherein
the trained model includes a first parameter output unit, a second parameter output unit, a first synthesis unit, a second synthesis unit, and a third parameter output unit,
the first parameter output unit receives one MRS signal of the plurality of MRS signals as an input, and outputs first amount information on substances or bases,
the second parameter output unit receives the plurality of MRS signals as an input, and outputs second amount information on substances or bases,
the first synthesis unit generates a first synthesized MRS signal relating to the target based on the first amount information,
the second synthesis unit generates a second synthesized MRS signal relating to the target based on the second amount information, and
the third parameter output unit receives the first synthesized MRS signal and the second synthesized MRS signal as an input, and outputs modulation amount information on k-space modulation caused by magnetic field modulation that occurred between data acquisitions of the plurality of MRS signals.

27. The MR signal processing apparatus according to claim 1, wherein the processing circuitry is further configured to:
input the plurality of MRS signals sorted in accordance with numbers of additions or qualities to the trained model, or
input MRS signals other than MRS signals rejected in accordance with the numbers of additions or qualities among the plurality of MRS signals input to the trained model.

28. The MR signal processing apparatus according to claim 1, wherein
the trained model includes a plurality of models corresponding respectively to a plurality of quality levels, and
the processing circuitry is further configured to perform binning on the plurality of MRS signals in accordance with qualities, and input the plurality of MRS signals to the models in units of quality levels.

* * * * *